United States Patent [19]

Ogawa

[11] Patent Number: 5,481,127
[45] Date of Patent: Jan. 2, 1996

[54] SEMICONDUCTOR MEMORY DEVICE HAVING A CAPACITOR

[75] Inventor: Toshiaki Ogawa, Hyogo, Japan

[73] Assignee: Mitsubishi Denki Kabushiki Kaisha, Tokyo, Japan

[21] Appl. No.: 63,820

[22] Filed: May 20, 1993

[30] Foreign Application Priority Data

Nov. 4, 1992  [JP]  Japan .................................. 4-294988

[51] Int. Cl.⁶ .......................... H01L 29/68; H01L 29/78; H01L 29/92
[52] U.S. Cl. ........................ 257/308; 257/532; 257/401
[58] Field of Search .................................. 257/309, 308, 257/306, 401, 532, 534

[56] References Cited

U.S. PATENT DOCUMENTS

| | | | |
|---|---|---|---|
| 5,023,683 | 6/1991 | Yamada | 357/23.6 |
| 5,208,479 | 5/1993 | Mathews et al. | 257/534 |
| 5,218,219 | 6/1993 | Ajika et al. | 257/309 |
| 5,318,920 | 6/1994 | Hayashide | 437/47 |

FOREIGN PATENT DOCUMENTS

| | | |
|---|---|---|
| 4102184A1 | 8/1991 | Germany . |
| 4131078A1 | 5/1992 | Germany . |
| 63-45848 | 2/1988 | Japan . |
| 3-19269 | 1/1991 | Japan . |
| 3-160755 | 7/1991 | Japan . |
| 3-257859 | 11/1991 | Japan ..................................... 257/306 |
| 4-1717759 | 6/1992 | Japan . |
| 4-176167 | 7/1992 | Japan . |

OTHER PUBLICATIONS

"Glow Discharge Processes", by Brian Chapman, A Wiley–Interscience Publication, 1980, pp. 247–248.

"A Novel Stacked Capacitor Cell With Dual Cell Plate for 64Mb DRAMs", by H. Arima et al., IEEE 1990, pp. 651–654.

"Crown-Shaped Stacked-Capacitor Cell for 1.5-V Operation 64-Mb DRAM's" by Toru Kaga et al., IEEE Transactions on Electron Device, vol. 38, No. 2, Feb. 1991, pp. 255–261.

" New Stacked Capcitor Cell with Thin Box Structured Storage Node", by S. Inoue et al., Extended Abstracts of the 21st Conference on Solid State Devices and Materials, Tokyo, 1989 pp. 141–144.

Primary Examiner—Donald L. Monin, Jr.
Attorney, Agent, or Firm—Lowe, Price, LeBlanc & Becker

[57] ABSTRACT

In a semiconductor device with improved lifetime of a capacitor insulating film, a standing wall portion forming a capacitor lower electrode has a substantially round tip end and a side surface, of which roughness is not more than 200 Å. This suppresses concentration of electric field at the tip end of the standing wall portion, and also suppresses irregularity in electric field at its side surface. Thereby, the lifetime of the capacitor insulating film is improved.

15 Claims, 44 Drawing Sheets

SEMICONDUCTOR MEMORY DEVICE HAVING A CAPACITOR

BACKGROUND OF THE INVENTION

1. Field of the Invention

The present invention relates to a semiconductor device and a manufacturing method of the same, and in particular, to a dynamic random access memory (DRAM) and a manufacturing method of the same.

2. Description of the Background Art

Owing to remarkable spread of information equipments such as computers, demand for semiconductor memory devices has been rapidly increased. In particular, semiconductor devices having such functional features that they have large-scale memory capacities and are capable of high-speed operations have been demanded. Correspondingly, technical development has been progressed for high integration, high-speed responsibility and high reliability of the semiconductor memory devices.

Among the semiconductor memory devices, a DRAM (dynamic random access memory) has been known as a device capable of random input and output of memory information. In general, the DRAM is formed of a memory cell array, which is a memory region storing a large amount of memory information, and a peripheral circuit required for external input and output.

FIG. 58 is a block diagram showing a structure of a conventional DRAM. Referring to FIG. 58, a DRAM 150 includes a memory cell array 151 for storing data signals of memory information, a row and column address buffer 152 for externally receiving an address signal which is used for selecting the memory cell forming a unit memory circuit, row and column decoders 153 and 154 which decode the address signal to designate the memory cell, a sense refresh amplifier 155 which amplifies the signal stored in the designated memory cell to read the same, data-in and data-out buffers 156 and 157 for data input and data output, and a clock generator 158 for generating a clock signal.

The memory cell array 151 occupying a large area in the semiconductor chip is formed of a plurality of memory cells for storing unit memory information disposed in a matrix form. FIG. 59 is an equivalent circuit diagram showing memory cells for 4 bits forming the memory cell array 151. Each memory cell is formed of one MOS transistor and one capacitor connected thereto. Such memory cell is referred to as a memory cell of one-transistor and one-capacitor type. The memory cells of this type have simple structures and the degree of integration of the memory cell array can be easily increased, so that they have been widely used in DRAMs of large capacities.

The memory cells of the DRAMs can be classified into several types based on their structures of the capacitors. Among several types of the capacitors, a stacked type capacitor has such a feature that a major part of the capacitor may be extended over a gate electrode and a field isolating film, so that areas of opposed surfaces of electrodes of the capacitor can be increased and thus the capacitor capacity can be increased. Since the stacked type capacitor has the foregoing feature, a sufficient capacitor capacity can be ensured even if elements are miniaturized to a higher extent in accordance with the high integration of the semiconductor device. As a result, stacked type capacitors have been widely used in accordance with the high integration of the semiconductor devices. The semiconductor devices are now being integrated to a further extent, and the stacked type capacitors complying with it are now being developed. More specifically, there has been proposed a stacked type capacitor of a cylindrical form, which is intended to ensure an appropriate capacitor capacity even if the semiconductor device is further integrated and thus has further miniaturized elements.

FIG. 60 is a plan showing a DRAM provided with cylindrical stacked type capacitors which have been proposed. FIG. 61 is a cross section of the DRAM taken along line X—X in FIG. 60.

Referring to FIGS. 60 and 61, the proposed DRAM in the prior art includes a silicon substrate 201, an element isolating oxide film 202 formed on a predetermined region of a major surface of the silicon substrate 201 for isolating elements, source/drain regions 206a, 206b, 206c and 206d, which are formed in regions surrounded by the element isolating oxide film 202 with predetermined spaces therebetween and are located at opposite sides of channel regions 220, gate electrodes 204b and 204c formed on the channel regions 220 with gate oxide films 205 therebetween, word lines (gate electrodes) 204d and 204e formed on the element isolating oxide film 202 with a predetermined space therebetween, and insulating films 207 covering the gate electrodes 204b, 204c, 204d and 204e. The source/drain regions 206a and 206b and the gate electrode 204c form a transfer gate transistor 203 of one of the memory cells. The source/drain regions 206a and 206c and the gate electrode 204b form the transfer gate transistor 203 of the other memory cell.

The proposed DRAM in the prior art further includes a buried bit line 208 electrically connected to the source/drain region 206a, an insulating film 209 covering the buried bit line 208, base portions 211a forming storage nodes (capacitor lower electrodes) 211 which are electrically connected to the source/drain region 206b and extend over the insulating films 207 and 209, standing wall portions 211b which are located along outer peripheries of the base portions 211a and extend nearly perpendicularly (at an angle between 87 and 90 degrees) to the silicon substrate 201 for forming the storage nodes 211, a capacitor insulating film 212 covering the base portions 211a and the standing wall portions 211b, a cell plate 213 (capacitor upper electrode) covering the capacitor insulating film 212, an interlayer insulating film 214 covering the cell plate 213 and having a flat surface, interconnection layers 215 formed on the interlayer insulating film 214 and corresponding to the gate electrodes 204b, 204c, 204d and 204e, respectively, and a protection film 216 covering the interconnection layers 215. The base portion 211a and standing wall portion 211b, which form the storage node 211, as well as the capacitor insulating film 212 and the cell plate 213 form a cylindrical stacked type capacitor 210 for accumulating the charges corresponding to the data signal. The base portion 211a and the standing wall portion 211b, which form the storage node 211, are formed of polysilicon layers. The capacitor insulating film 212 is formed, e.g., of a nitride film. The cell plate 213 is formed of a polysilicon layer.

FIGS. 62–75 are cross sections showing a manufacturing process of the DRAM shown in FIG. 61. Referring to FIGS. 61 and 62–75, the manufacturing process of the conventional DRAM will be described below.

First, as shown in FIG. 62, the element isolating oxide film 202 is formed on the predetermined region of the major surface of the silicon substrate 1 by an LOCOS method.

Then, as shown in FIG. 63, a thermal oxidation method is used to form the gate oxide films 205, and then the gate electrodes (word lines) 204b, 204c, 204d and 204e are selectively formed. The insulating films 207 covering the gate electrodes 204b–204e are formed by two oxide film forming steps and two etching steps. The gate electrodes 204b, 204c, 204d and 204e covered with the insulating films 207 are used as a mask for an ion implantation, by which impurity is ion-implanted into the surface of the silicon substrate 201. Thereby, the source/drain regions 206a, 206b, 206c and 206d are formed.

Then, as shown in FIG. 64, a layer of a metal having high-melting point, e.g., of tungsten, molybdenum or titanium is formed and then is patterned into a predetermined shape. Thereby, the buried bit line 208 directly connected to the source/drain region 206a is formed. The insulating film 209 covering the buried bit line 208 is formed.

As shown in FIG. 65, a CVD method is used to form a polysilicon layer 211c doped with impurity on the whole surface of the silicon substrate 201. Then, as shown in FIG. 66, an insulating layer 235 of, e.g., silicon oxide film ($SiO_2$) is formed. The thickness of this insulating layer 235 determines a height of the standing wall portion 211b which forms the storage node (the lower electrode of the capacitor).

As shown in FIG. 67, resist (not shown) is applied to the surface of the insulating layer 235, and lithography is used to pattern the same into a predetermined shape. Thereby, a resist pattern (capacitor insulating layer) 236 is formed. A width of the resist pattern 236 determines a space separating the adjacent capacitors.

As shown in FIG. 68, the resist pattern 236 is used as a mask for applying anisotropic etching, by which the insulating layer 235 is selectively removed. Thereafter, the resist pattern 236 is removed. Then, as shown in FIG. 69, an anisotropic etching is applied to the base portions 211a of the capacitor lower electrodes (storage node), using the insulating layer 235 as a mask.

A shown in FIG. 70, the CVD method is used to form a polysilicon layer 211d containing a large amount of doped arsenic or phosphorus at a thickness between 500 Å and 1000 Å.

Then, as shown in FIG. 71, a reactive ion etching (RIE) method is used to apply anisotropic etching to the polysilicon layer 211d, whereby the standing wall portion 211b of the capacitor lower electrode (storage node) is formed. The conditions for carrying out the RIE are as follows. An RIE apparatus of a parallel flat plate type is used. A frequency is 13.56 MHz, an RF power is 0.3 KW/cm$^2$, a gas pressure is 150 mTorr, a flow rate of $Cl_2$ gas is 50 sccm, and an etching time is in a range from 30 seconds to 1 minute. Thereafter, an anisotropic etching is used to remove the insulating layer 235 to obtain a shape such as shown in FIG. 72.

As shown in FIG. 73, the thin capacitor insulating film 212 formed of, e.g., a silicon nitride film is formed on the surface of the capacitor lower electrode 211. As shown in FIG. 74, the cell plate 213 made of electrically conductive polysilicon is formed on the whole surface. Thereby, the cylindrical stacked type capacitor 210, which includes the base portions 211a and standing wall portions 211b forming the capacitor lower electrode 211 as well as the capacitor insulating film 212 and cell plate 213 is completed.

As shown in FIG. 75, the cell plate 213 is covered with the thick interlayer insulating film 214. The interconnection layers 215 of, e.g., aluminium having predetermined configurations are formed on the surface of the interlayer insulating film 214.

Finally, as shown in FIG. 61, the surfaces of the interconnection layers 215 are covered with the protection film 216. By the foregoing steps, the memory cells of the conventional DRAM are formed FIG. 76 is an enlarged view showing a portion of the conventional DRAM indicated by "J" in FIG. 75. Referring to FIG. 76, the conventional DRAM described above includes the capacitor lower electrode (storage node), of which standing wall portion 211b has a sharp tip end and a rough side surface. Thus, a side surface of the standing wall portion 211b has a significantly large roughness in the range of about 250 Å to about 500 Å. These configurations are formed by the RIE step which has been described with reference to FIGS. 70 and 71. FIGS. 77–79 schematically show etching states in the RIE step already described with reference to FIGS. 70 and 71. Referring to FIGS. 77–79, steps for forming the standing wall portion 211b having the configuration shown in FIG. 76 will be described below.

First, as shown in FIG. 77, electrically neutral Cl radical particles 250 are chemically absorbed onto the polysilicon layer 211d in the RIE step. When accelerated CL$^+$ ions impinge against the chemically absorbed Cl radial particles 250, the Cl radical particles 250, which obtain an energy, combines with Si to form $SiCL_4$ and evaporates. Since this etching is anisotropic, the etching progresses mainly in the polysilicon layer 211d formed on the upper surface of the insulating layer 235. However, the etching progresses in the surface portion of the polysilicide layer 211d formed on the side surface of the insulating layer 235 to a slight extent, as shown in FIG. 78. Since the RIE (reaction ion etching) is liable to progress along a grain boundary, the surface of the polysilicon layer 211d formed on the side surface of the insulating layer 235 becomes irregular and uneven. Therefore, after the polysilicon layer 211d on the insulating layer 235 is fully etched, the standing wall portion 211b formed of the polysilicon layer 211d, which is formed on the side surface of the insulating layer 235, has the sharp tip end and the rough side surface of a roughness between 250 Å and 500 Å.

As described above, since the standing wall portion 211b in the prior art is formed utilizing the RIE in which the etching progresses owing to the reaction of the Si and Cl, the standing wall portion 211b disadvantageously has the sharp tip end and the rough side surface. This reduces lifetime of the capacitor insulating film 212. More specifically, the electric field concentrates at the tip end of the standing wall portion 211b, so that the lifetime of the capacitor insulating film 212 reduces. The uneven shape of the side surface of the standing wall portion 211b causes an irregular electric field, which also reduces the lifetime of the insulating film.

SUMMARY OF THE INVENTION

An object of the invention is to provide a semiconductor device, overcoming the above-noted disadvantages, in which lifetime of a capacitor insulating film is improved.

Another object of the invention is to provide a semiconductor device in which a surface roughness of a side surface of a standing wall portion (second portion) forming a capacitor lower electrode is suppressed.

Still another object of the invention is to provide a semiconductor device in which concentration of an electric field at a tip end of a standing wall portion (second portion) forming a capacitor lower electrode is suppressed.

Yet another object of the invention is to provide a manufacturing method of a semiconductor device which reduces a degree of sharpness of a tip end of a standing wall portion forming a capacitor lower electrode.

A still further object of the invention is to provide a manufacturing method of a semiconductor device which reduces a roughness of a side surface of a standing wall portion (second portion) forming a capacitor lower electrode.

According to an aspect of the invention, a semiconductor device includes a semiconductor substrate of a second conductivity type having a major surface and an impurity region of a first conductivity type located in the major surface; an insulating layer formed on the major surface of the semiconductor substrate and having an opening reaching the impurity region; a capacitor lower electrode having a first portion, which is in contact with a surface of the impurity region and a surface of the insulating layer, and a second portion, which is located along an outer periphery of the first portion and extends substantially perpendicularly to the major surface of the semiconductor substrate; a capacitor insulating layer covering the surface of the capacitor lower electrode; and a capacitor upper electrode covering the surface of the capacitor insulating layer. The second portion of the capacitor lower electrode has a substantially round tip end and has a side surface of which roughness is not more than 200 Å.

According to the foregoing structure, since the tip end of the second portion of the capacitor lower electrode has the substantially round shape and the roughness of the side surface of the second portion is not more than 200 Å, electric field concentration at the tip end of the second portion can be effectively prevented, and the irregular electric field at the side surface of the second portion can be suppressed.

According to another aspect of the invention, a manufacturing method of a semiconductor device includes the steps of: forming a first insulating layer located on a major surface of a semiconductor substrate and having an opening which is located at a predetermined position and reaches the major surface of the semiconductor substrate; forming a first conductive layer located in the opening and being in contact with a surface of the first insulating layer; forming a second insulating layer on a predetermined region of the first conductive layer; forming a second conductive layer covering at least the second insulating layer; removing the second conductive layer at least from an upper surface of the second insulating layer and thereby exposing the upper surface of the second insulating layer; etching the exposed second insulating layer for partially removing the second insulating layer by a predetermined thickness; sputter-etching the second conductive layer for substantially rounding a tip end of the second conductive layer and flattening a side surface of the second conductive layer; forming a capacitor insulating layer covering the second conductive layer after removing the residual second insulating layer; and forming a third conductive layer covering the capacitor insulating layer.

According to the method described above, the sputter etching is effected on the second conductive layer forming the capacitor lower electrode to round the tip end of the second conductive layer and flatten the side surface of the second conductive layer, and thereafter the capacitor insulating layer is formed to cover the second insulating layer. Therefore, the electric field concentration at the tip end of the second portion is suppressed, and the irregularity in the field at the side surface of the second portion can be suppressed, so that the lifetime of the capacitor insulating layer can be improved.

According to still another aspect of the invention, a manufacturing method of a semiconductor device includes the steps of: forming a first insulating layer located on a major surface of a semiconductor substrate and having an opening which is located at a predetermined position and reaches the major surface of the semiconductor substrate; forming a first conductive layer located in the opening and being in contact with a surface of the first insulating layer; forming a second insulating layer on a predetermined region of the first conductive layer; forming a second conductive layer covering at least the second insulating layer; forming a side wall insulating film covering a surface of the second conductive layer formed on a side surface of the second insulating layer; removing the second conductive layer at least from an upper surface of the second insulating layer by an etching and thereby exposing the upper surface of the second insulating layer; etching the exposed second insulating layer for partially removing the second insulating layer by a predetermined thickness; sputter-etching the second conductive layer for substantially rounding a tip end of the second conductive layer; forming a capacitor insulating layer covering the second conductive layer after removing the residual second insulating layer; and forming a third conductive layer covering the capacitor insulating layer.

According to the method described above, after forming the second conductive layer covering the second insulating layer, the side wall insulating film is formed to cover the surface of the second conductive layer located on the side surface of the second insulating layer, and thereafter the second conductive layer located on the upper surface of the second insulating layer is etched to expose the upper surface of the second insulating layer. Therefore, during the etching of the second conductive layer, a portion of the second conductive layer forming the capacitor lower electrode is protected by the side wall insulating film and the second insulating layer, so that the side surface of the portion, which forms the capacitor lower electrode, of the second conductive layer does not have an uneven shape. Since the sputter etching is effected on the second conductive layer to substantially round the tip end of the second conductive layer, the electric field concentration at the tip end of the second conductive layer, which may be caused in the prior art, can be effectively prevented.

According to yet another aspect of the invention, a manufacturing method of a semiconductor device includes the steps of: forming a first insulating layer located on a major surface of a semiconductor substrate and having an opening which is located at a predetermined position and reaches the major surface of the semiconductor substrate; forming a first conductive layer located in the opening and being in contact with a surface of the first insulating layer; forming a second insulating layer on a predetermined region of the first conductive layer; forming a second conductive layer covering at least the second insulating layer; forming a side wall insulating film covering a surface of the second conductive layer formed on a side surface of the second insulating layer; forming a third conductive layer covering a whole surface; removing the third conductive layer at least from an upper surface of the second insulating layer by an etching and thereby exposing the upper surface of the second insulating layer; etching the exposed second insulating layer for partially removing the second insulating layer by a predetermined thickness; sputter-etching the second and third conductive layers for substantially rounding tip ends of the second and third conductive layers and flattening a side surface of the third conductive layer; forming a capacitor insulating layer covering the second and third conductive layers after removing the residual second insulating layer; and forming a fourth conductive layer covering the capacitor insulating layer.

According to the method described above, after forming the second conductive layer, which forms the capacitor lower electrode, the side wall insulating film is formed on the side surface of the second insulating layer, and thereby, during the etching of the second conductive layer, the side surface of the second conductive layer is protected by the side wall insulating film. Since the sputter etching is effected on the second and third conductive layers to substantially round the tip ends of the second and third conductive layers and flatten the side surface of the third conductive layer, the electric field concentration at the tip ends of the second and third conductive layers can be effectively prevented, and the irregularity of the electric field at the side surfaces of the second and third conductive layers is suppressed. Further, the second and third conductive layers increase a capacitor capacity as compared with the prior art.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Embodiments of the invention will be described below with reference to the drawings.

Figure 1:
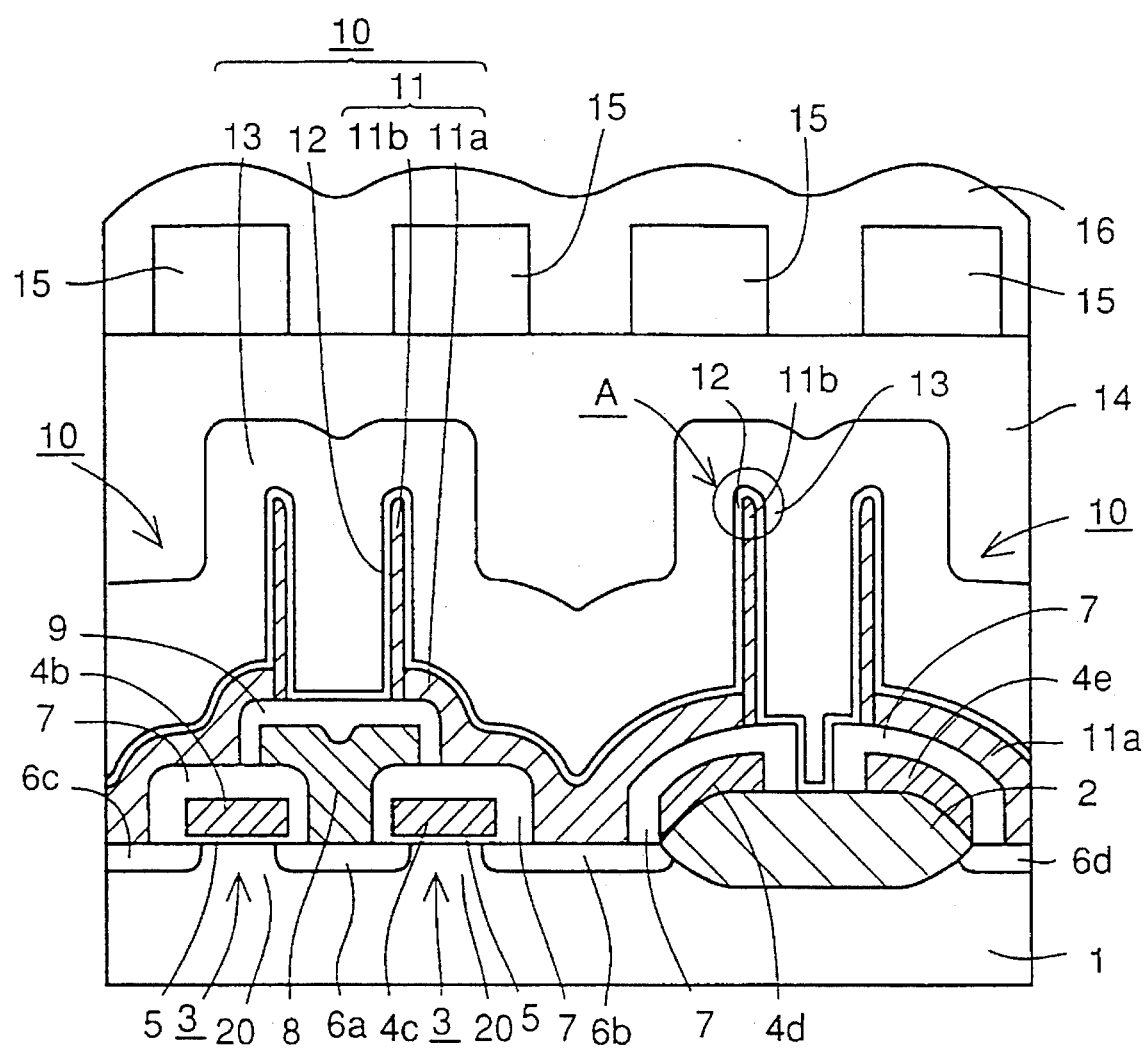
FIG. 1 is a cross section of a DRAM including a stacked type capacitor of a first embodiment of the invention.
Figure 2:
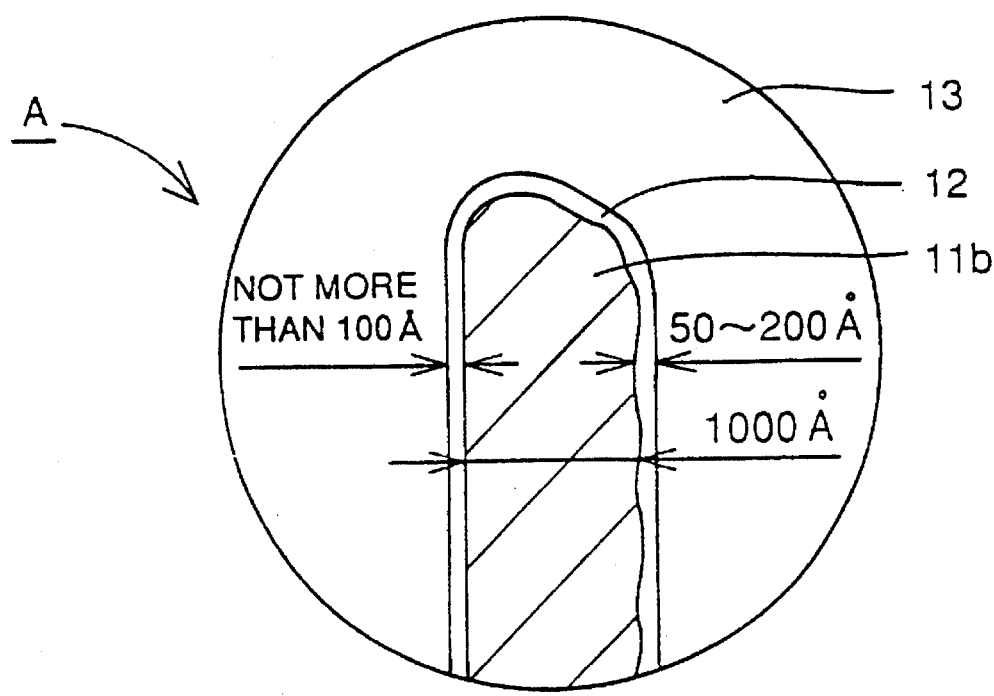
FIG. 2 is an enlarged cross section of a portion of a DRAM indicated by "A" in FIG. 1.

Referring to FIGS. 1 and 2, a DRAM of a first embodiment includes a silicon substrate 1, an element isolating oxide film 2 formed on a predetermined region of a major surface of the silicon substrate 1 for isolating elements, source/drain regions 6a, 6b, 6c and 6d formed in regions surrounded by the element isolating oxide film 2 with predetermined spaces therebetween and located at opposite sides of channel regions 20, gate electrodes (word lines) 4b and 4c formed on the channel regions 20 with a gate oxide film 5 therebetween, word lines (gate electrodes) 4d and 4e formed on the element isolating oxide film 2 with a predetermined space therebetween, and insulating films 7 covering the gate electrodes 4b, 4c, 4d and 4e. The DRAM further includes a buried bit line 8 electrically connected to the source/drain region 6a, an insulating film 9 covering the buried bit line 8, base portions 11a forming capacitor lower electrodes (storage nodes) which are electrically connected to the source/drain region 6b and extend over and along the insulating films 7 and 9, standing wall portions 11b formed along outer peripheries of the base portions 11a and extending substantially perpendicularly to the silicon substrate 1 at an an angle between 87 and 90 degrees, a capacitor insulating film 12 covering the base portions 11a and the standing wall portions 11b, a cell plate 13 covering the capacitor insulating film 12, an interlayer insulating film 14 covering the cell plate 13 and having a flattened surface, interconnection layers 15 formed on the interlayer insulating film 14 with predetermined spaces between each other and corresponding to the gate electrodes 4b, 4c, 4d and 4e, respectively, and a protection film 16 covering the interconnection layers 15.

The element isolating oxide film 2 is formed of a silicon oxide film of about 4000 Å in thickness. The gate electrodes 4b, 4c, 4d and 4e are formed of polysilicon layers into which a large amount of arsenic (As) are doped. The insulating films 7 and 9 are formed of silicon nitride films ($Si_3N_4$) or silicon oxide films ($SiO_2$) and each have a thickness between about 500 Å and about 1000 Å. The capacitor insulating film 12 is formed of a silicon nitride film, a silicon oxide film or a composite film thereof, or is formed of a tantalum pentoxide film ($Ta_2O_5$), a hafnium oxide film ($HaO_2$) or others. The interlayer insulating film 14 is a silicon oxide film formed by the CVD method, and has a thickness in a range from about 5000 Å to about 10000 Å. The protection film 16 is a silicon oxide film formed by the CVD method and is about 8000 Å in thickness. The source/drain regions 6a, 6b, 6c and 6d contain n-type impurity such as arsenic (As). The buried bit line 8 is a polysilicon layer containing a large amount of doped arsenic (As) or is a polycide layer formed by applying $WSi_2$ onto the same polysilicon layer by a sputter method. A whole thickness of the buried bit line 8 is in a range from about 1000 Å to about 4000 Å.

The base portion 11a forming the capacitor lower electrode (storage node) is formed of a polysilicon layer, which contains a large amount of doped arsenic and has a thickness between about 1500 Å and about 4000 Å. The standing wall portion 11b is formed of a polysilicon layer, which contains a large amount of doped arsenic or phosphorus at a rate of about $2 \times 10^{20}/cm^3$ and has a thickness between about 500 Å and 1000 Å.

In the first embodiment, the standing wall portion 11b forming the capacitor lower electrode has the round tip end and the side surface of which roughness is in a range from about 50 Å to about 200 Å. These configurations of the tip end and the side surface of the standing wall portion 11b are obtained by a sputter etching, which will be described later. Owing to the round shape of the tip end of the standing wall portion 11b forming the capacitor lower electrode and the roughness of the side surface of the standing wall portion 11b of 200 Å or less, which can be achieved by the sputter etching, it is possible to prevent the field concentration at the tip end of the standing wall portion 11b and suppress the irregular electric field at the side surface of the standing wall portion 11b, compared with the prior art. As a result, the lifetime of the capacitor insulating film 12 can be improved.

Referring to FIGS. 1–20, a manufacturing process of the DRAM of the first embodiment will be described below.

Figure 3:
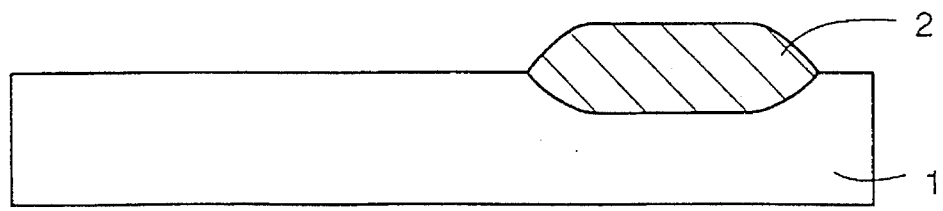
FIGS. 3–11 are cross sections showing 1st to 9th steps in a manufacturing process of a DRAM of a first embodiment shown in FIG. 1, respectively.

First, as shown in FIG. 3, the element isolating oxide film 2 made of silicon oxide film is formed to have the thickness of about 4000 Å on the predetermined region of the major surface of the silicon substrate 1 by the LOCOS method.

Figure 4:
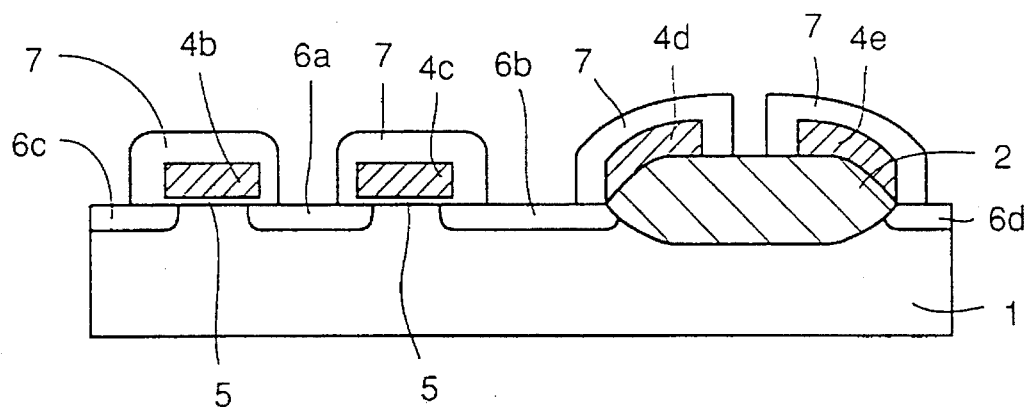

Then, as shown in FIG. 4, the gate oxide film 5 is formed, e.g., by the thermal oxidation method. The gate electrodes (word lines) 4b, 4c, 4d and 4e formed of polysilicon containing a large amount of doped arsenic are selectively formed on the gate oxide film 5. The gate electrodes 4b, 4c, 4d and 4e may be made of polycide, which is formed of the polysilicon layer containing a large amount of doped arsenic and $WSi_2$ or $TiSi_2$ formed on the polysilicon layer by a sputter method. The CVD method is used to execute two oxide film forming steps and two etching steps, whereby the insulating films 7 covering the gate electrodes 4b, 4c, 4d and 4e are formed. The insulating films 7 are formed of silicon nitride films ($Si_3N_4$) or silicon oxide films ($SiO_2$) and have the thickness of about 500 Å. The insulating films 7 are used as a mask, and the ion implantation of the arsenic (As) is carried out under the conditions of about 50 KeV and $4 \times 10^{15}/cm^2$. Thereby, the source/drain regions 6a, 6b, 6c and 6d are formed.

Figure 5:
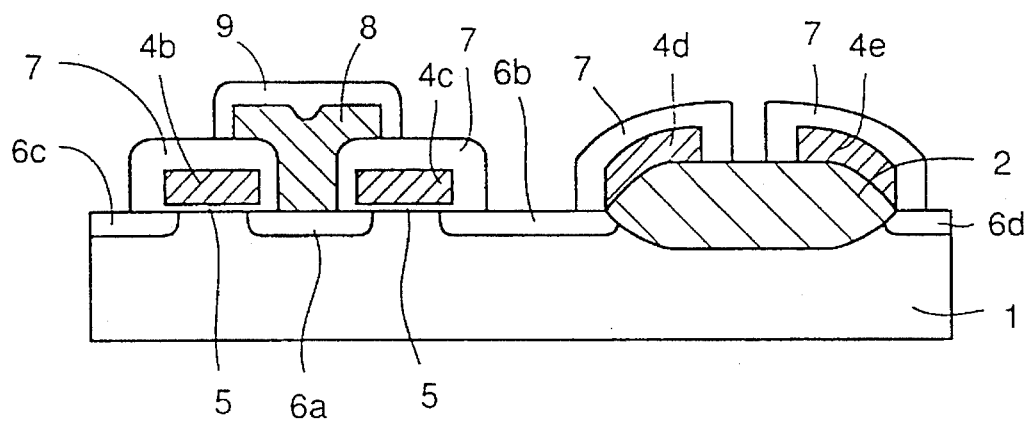

As shown in FIG. 5, after forming the polysilicon layer containing a large amount of doped arsenic on the whole surface, the patterning of the predetermined shape is carried out to form the buried bit line 8 which directly contacts the source/drain region 6a. The buried bit line 8 may be made of polycide, which is formed of the polysilicon layer containing a large amount of arsenic and $WSi_2$ formed on the same polysilicon layer by a sputter method. The thickness of the buried bit line 8 is determined to be between about 2000 Å and about 4000 Å. The insulating film 9 is formed to cover the buried bit line 8. The insulating film 9 is formed of the silicon nitride film or the silicon oxide film and has the thickness between about 500 Å and 1000 Å.

Figure 6:
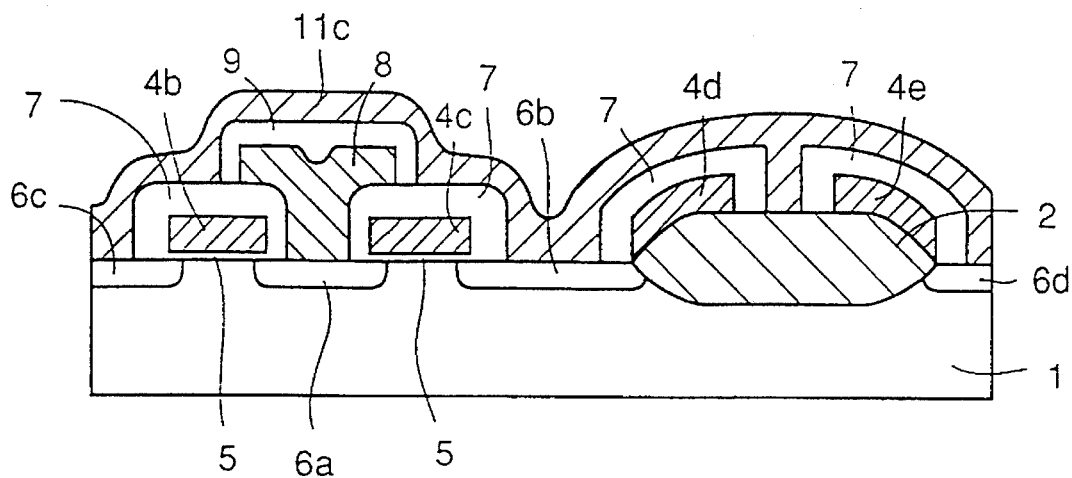
Figure 7:
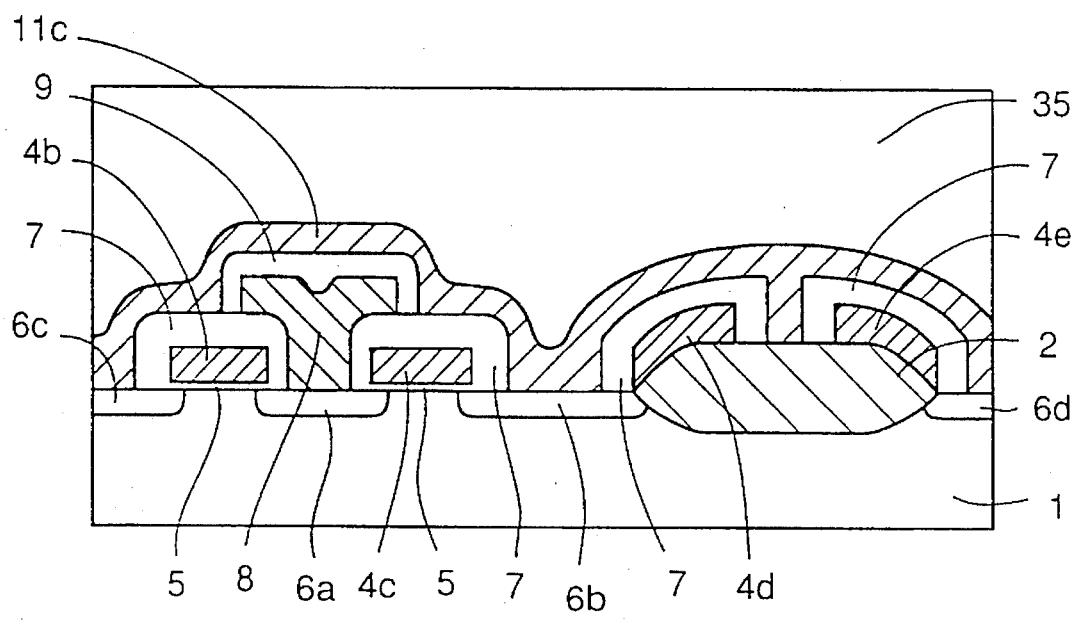

As shown in FIG. 6, a polysilicon layer 11c containing a large amount of doped arsenic (As) is formed to have the thickness between about 1500 Å and about 4000 Å on the whole surface of the silicon substrate 1 by the CVD method. As shown in FIG. 7, the CVD method is used to form an interlayer insulating layer 35 made of the silicon oxide film and having the thickness between about 5000 Å and about 10000 Å. The thickness of this insulating layer 35 determines the height of the standing wall portion 11b (see FIG. 1) of the capacitor lower electrode (storage node) 11.

Figure 8:
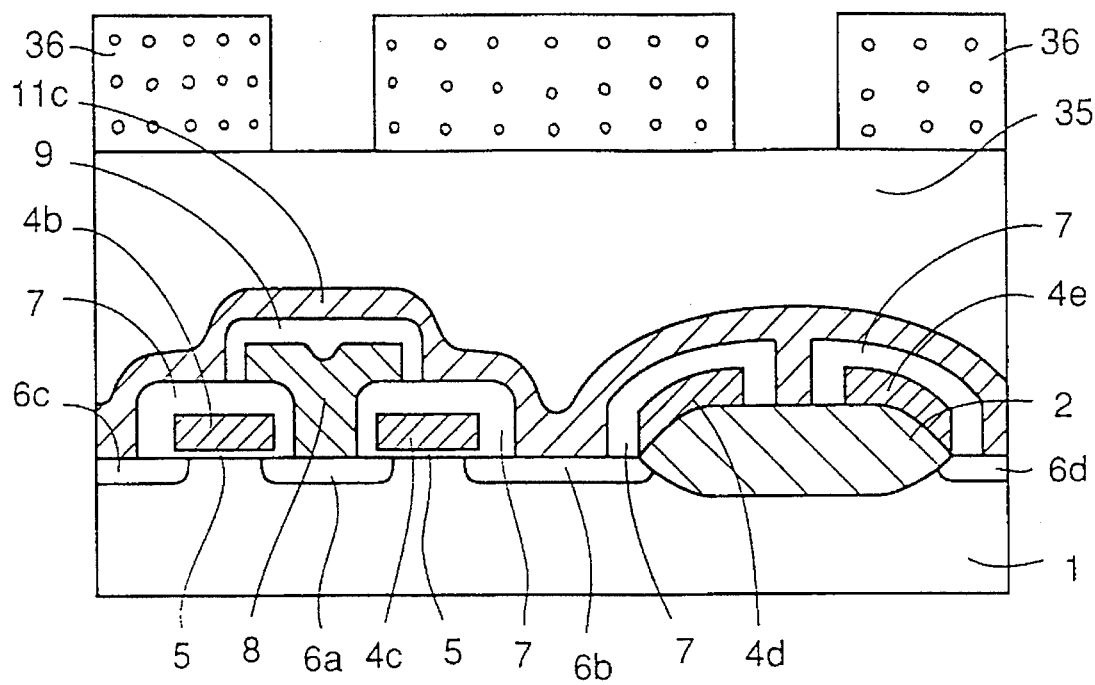
Figure 9:
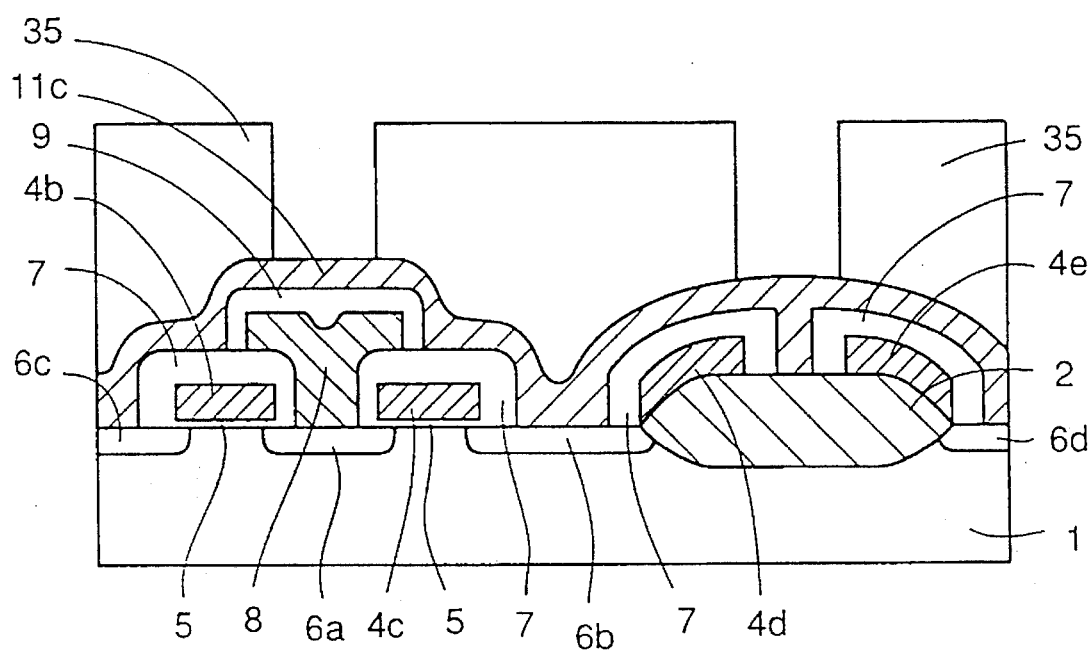

As shown in FIG. 8, resist (not shown) is applied to the surface of the insulating layer 35, and the patterning of the predetermined shape is executed, using the lithography or the like to form a resist pattern (capacitor separating layer) 36. The width of the resist pattern 36 determines a space by which the adjacent capacitors are separated from each other. As shown in FIG. 9, the insulating layer 35 is selectively removed, using the resist pattern 36 as a mask. The etching for this removal is executed, e.g., by an anisotropic etching. Thereafter, the resist pattern 36 is removed by an ashing method.

Figure 10:
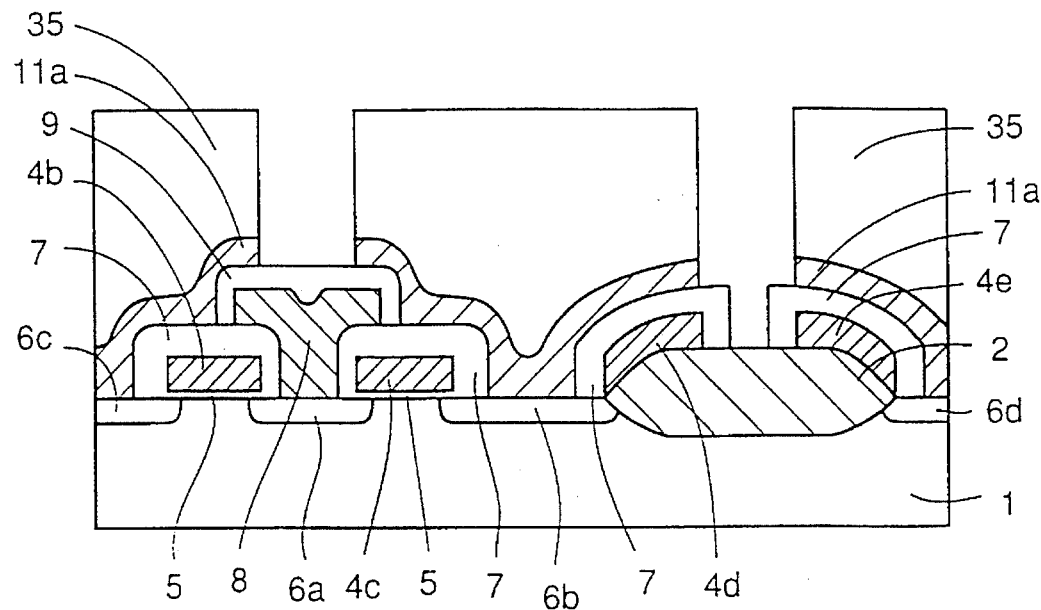

Then, as shown in FIG. 10, the patterned insulating layer 35 is used as a mask, and the base portions 11a of the capacitor lower electrodes (storage node) are formed, e.g., by an anisotropic etching. Instead of the anisotropic etching with the insulating layer 35, the anisotropic etching may be carried out with a mask formed of the resist pattern 36 as it is, immediately after the patterning of the insulating layer 35 with the resist pattern 36.

Figure 11:
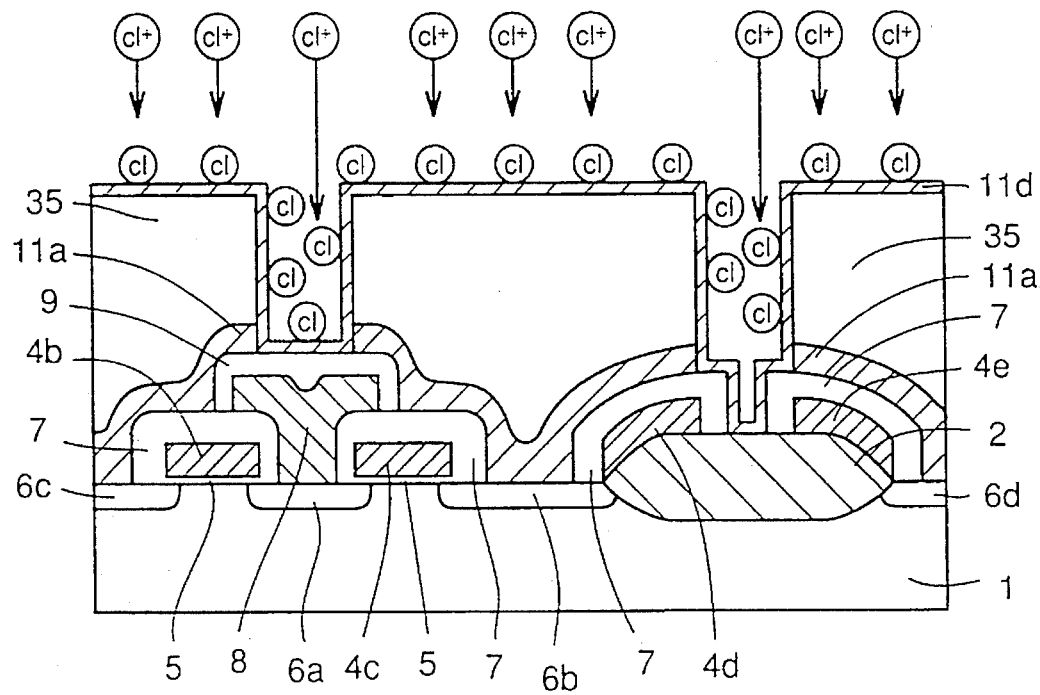
Figure 12A:
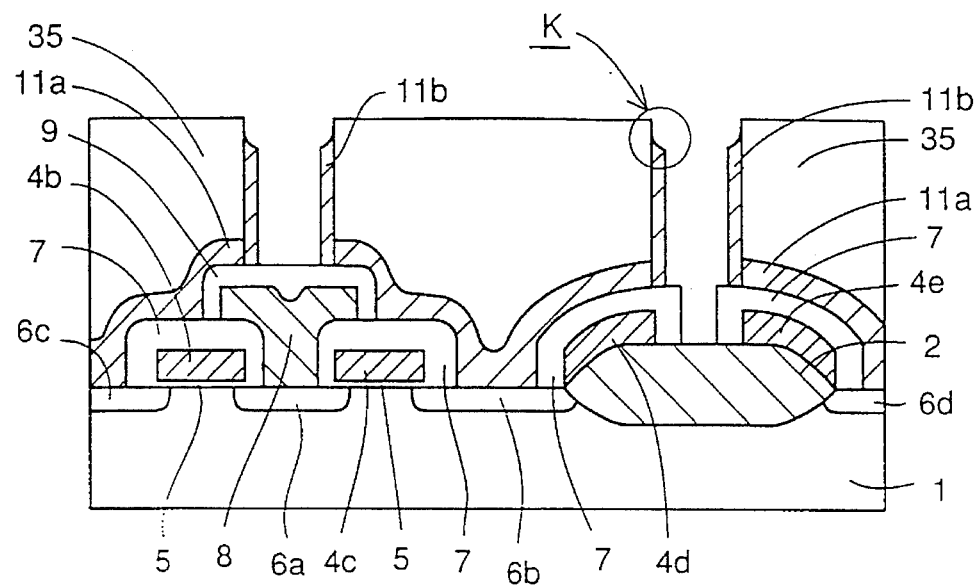
FIG. 12A is a cross section showing a 10th step in a manufacturing process of a DRAM of a first embodiment shown in FIG. 1.
Figure 12B:
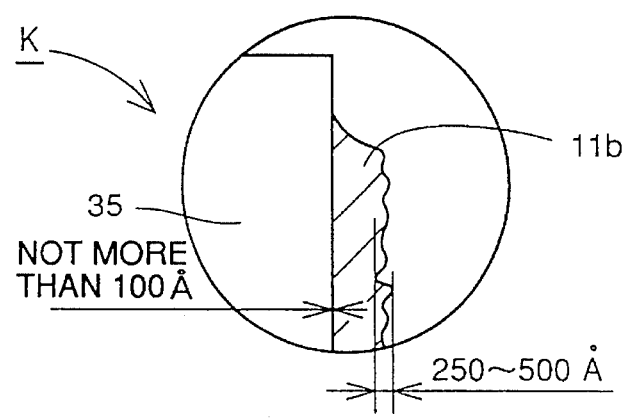
FIG. 12B is an enlarged cross section of a portion of a DRAM indicated by "K" in FIG. 12A.
Figure 76:
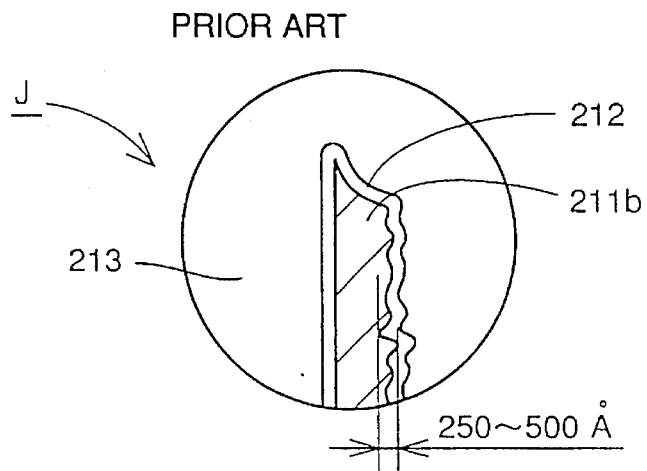
FIG. 76 is an enlarged cross section showing a portion of a conventional DRAM indicated by "J" in FIG. 75.
Figure 77:
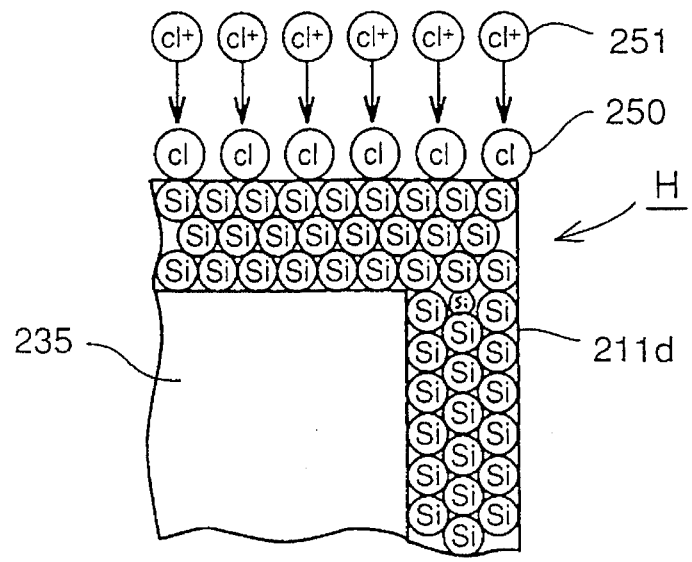
FIGS. 77–79 schematically show 1st to 3rd stages in a conventional RIE (reactive ion etching) process shown in FIGS. 70 and 71, respectively.
Figure 78:
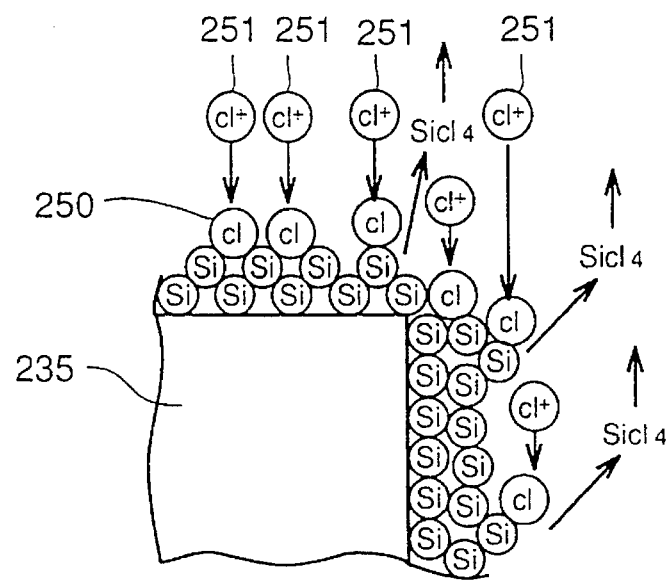
Figure 79:
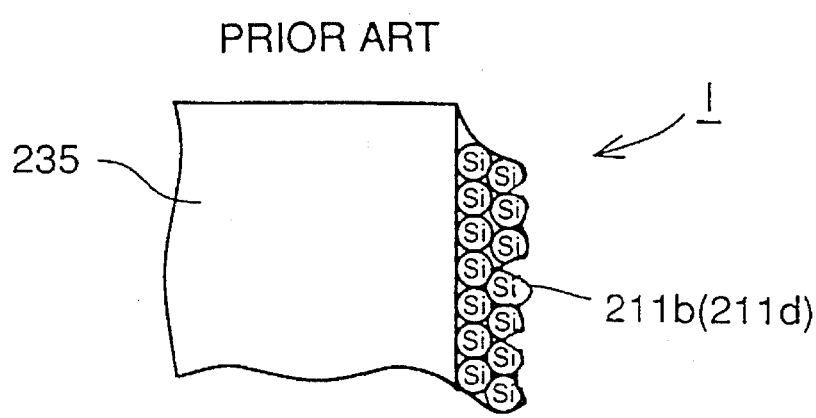

Then, as shown in FIG. 11, the CVD method is used to form a polysilicon layer 11d containing a large amount ($2 \times 10^{20}/cm^2$) of arsenic or phosphorus on the whole surface and having a thickness between about 500 Å and about 1000 Å. The polysilicon layer 11d is subjected to an anisotropic etching by the RIE (reactive ion etching). The RIE is carried out by an RIE apparatus of a parallel flat plate type under the conditions that an RF power is 0.3 KW/cm², a gas pressure is 150 mTorr, a $Cl_2$ gas flow rate is 50 sccm, a frequency is 13.56 MHz, and an etching time is between 30 seconds and 1 minute. The anisotropic etching of the polysilicon layer 11d by the RIE method forms the standing wall portion 11b having configurations shown in FIGS. 12A and 12B. In the state shown in these figures, the standing wall portion 11b has a sharp tip end and a roughness between about 250 Å and 500 Å at its side surface, which is similar to the conventional standing wall portion 211b shown in FIG. 76. Since a side surface of the standing wall portion 11b contacting the insulating layer 35 is not etched, it has a roughness of not more than 100 Å.

Figure 13:
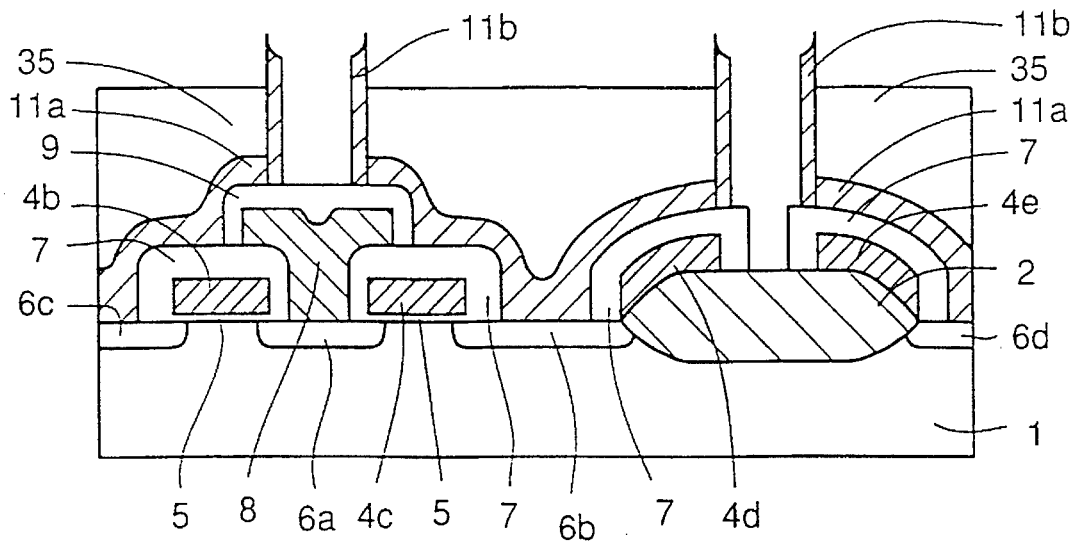
FIGS. 13 and 14 are cross sections showing 11th and 12th steps in a manufacturing process of a DRAM of a first embodiment shown in FIG. 1, respectively.

Then, as shown in FIG. 13, a wet etching with fluorine or an etchback is executed to etch a portion of the insulating layer 35 through a predetermined thickness to expose the tip end of the standing wall portion 11b.

Figure 14:
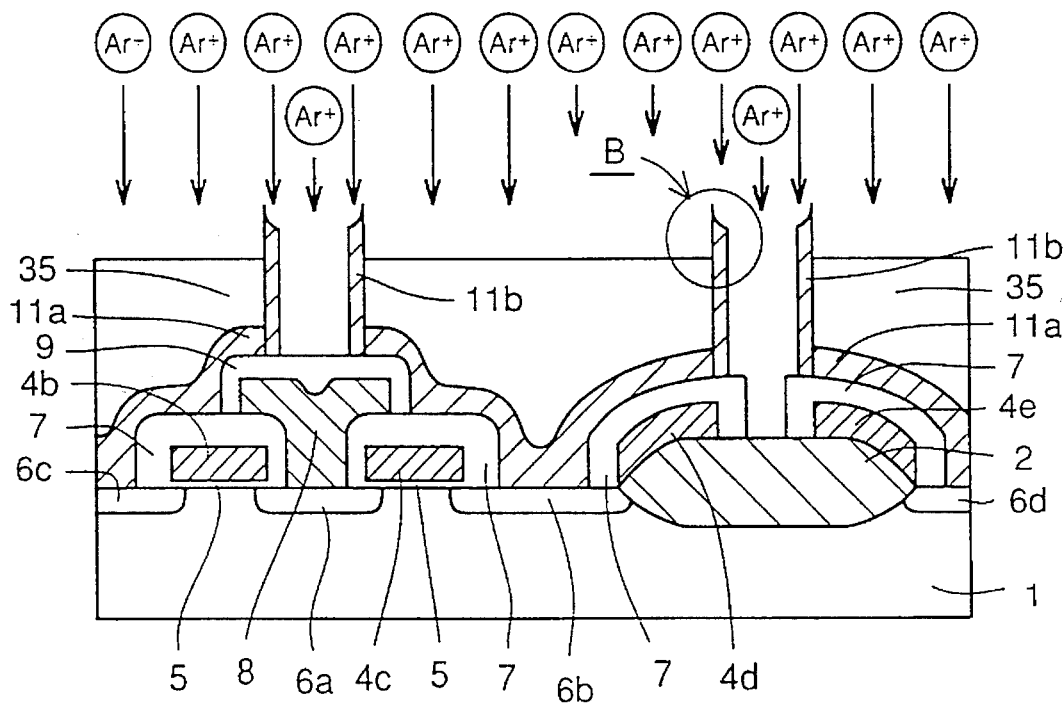
Figure 15:
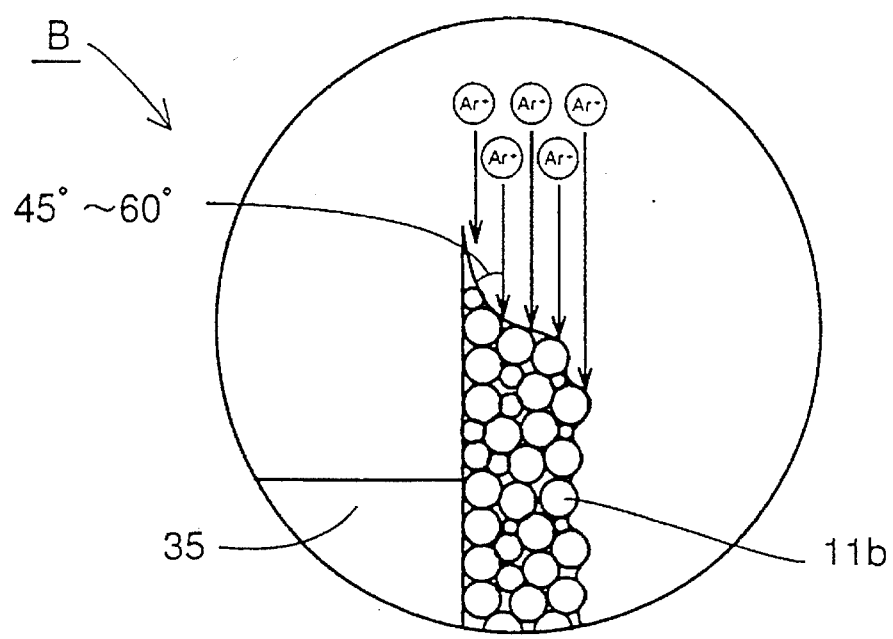
FIGS. 15–17 are cross sections showing 1st to 3rd stages in a sputter etching step shown in FIG. 14, respectively.
Figure 16:
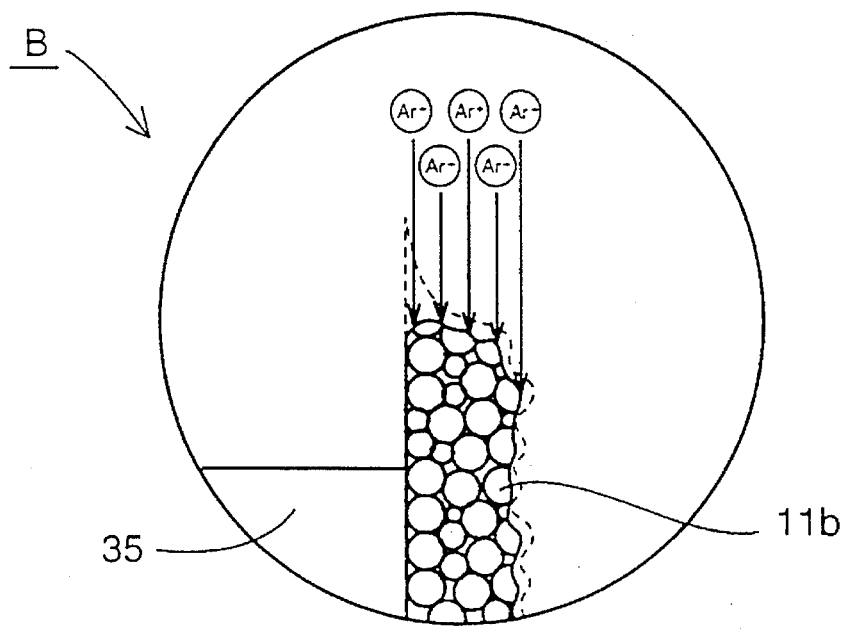
Figure 17:
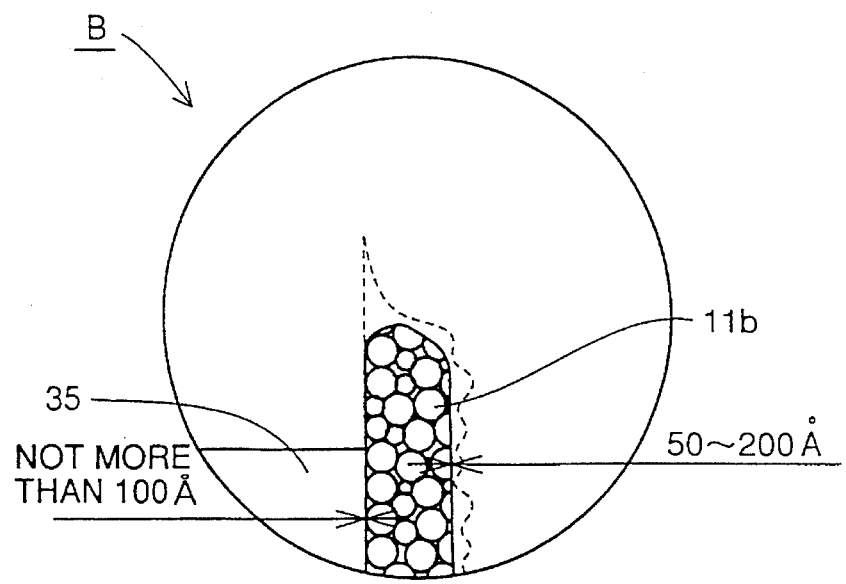

Then, as shown in FIG. 14, a sputter etching is applied to the tip end and the side surface of the standing wall portion 11b with inert gas such as argon (Ar). FIGS. 15-17 are enlarged schematic views of a portion indicated by "B" in FIG. 14 for specifically showing sputter etching stages. Referring to FIG. 15-17, the sputter etching is carried out under the following conditions. An RIE apparatus of the parallel flat plate type is used under the conditions that an RF power is between 0.2 and 1.0 KW/cm$^2$, a gas pressure is not more than 30 mTorr, an Ar gas flow rate is between 20 and 50 sccm, a frequency is not more than 13.56 MHz, and a sputter etching time is between 1 minute and 3 minutes. The spatter etching using the inert gas (argon gas) physically etches the standing wall portion 11b formed of the polysilicon layer, which is different from the RIE (reactive ion etching). Since the RIE is executed by the chemical reaction of silicon and reactive gas ($Cl_2$), the etching easily progresses along the grain boundary of silicon, so that the roughness of the side surface of the standing wall portion 11b increases. Meanwhile, by the sputter etching with the inert gas, the silicon crystal is physically etched, so that a projected portion is etched in preference to the others. In the sputter etching, the etching progresses to the highest extent if an incident angle of $Ar^+$ ion with respect to a surface to be etched is between 45 and 60 degrees, as shown in FIG. 15. This means that an inclined surface is etched to a higher extent, compared with an uninclined surface. Therefore, the projected portion of the tip end of the standing wall portion 11b is etched to a higher extent, compared with the other portions, and projected portions of the side surface are liable to be etched. The fact that the sputter etching rate is maximized at the incident angle between 45 and 60 degrees with respect to the surface to be etched is disclosed in *Glow Discharge Processes* of a Wiley-Interscience publication, 1980, pp 247-248.

Figure 18:
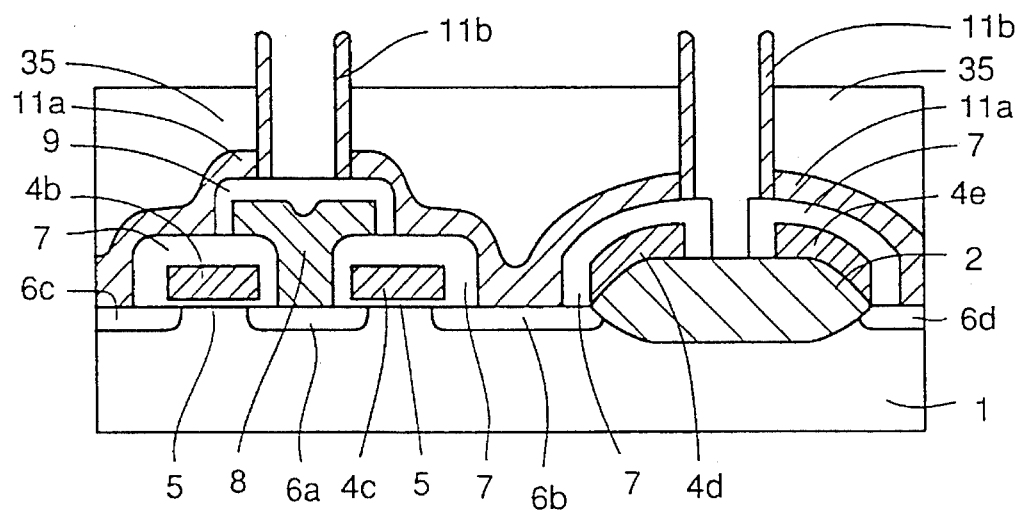
FIGS. 18–20 are cross sections showing 13th to 15th steps in a manufacturing process of a DRAM of a first embodiment shown in FIG. 1, respectively.
Figure 19:
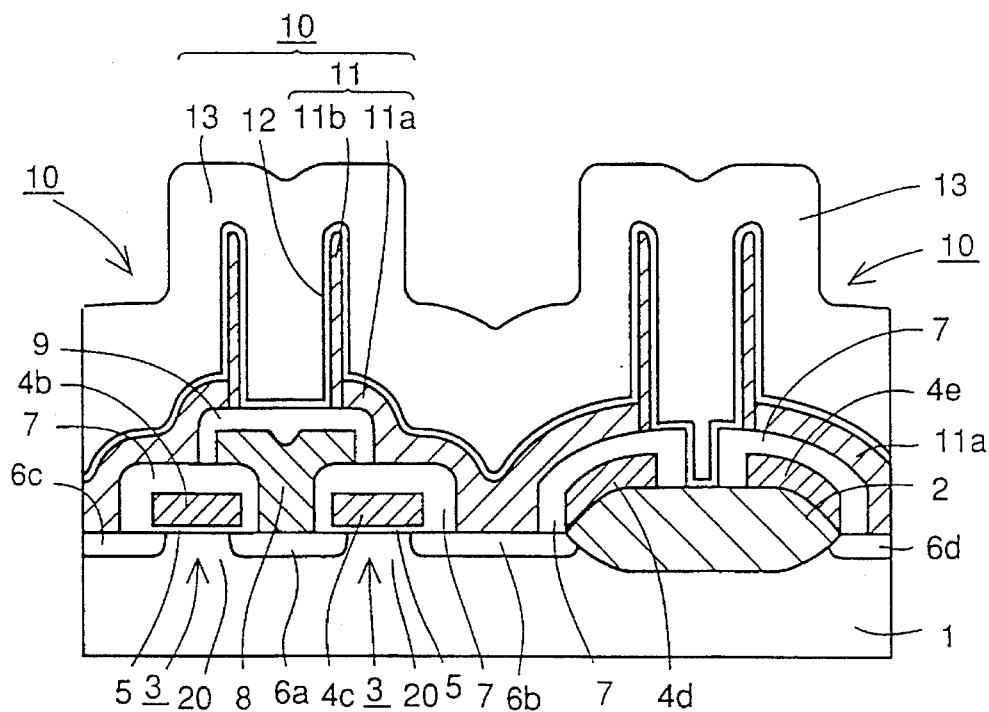

By etching the standing wall portion 11b in the state shown in FIG. 15 with the spatter etching method, the configuration shown in FIG. 17 is finally obtained through the state shown in FIG. 16. Thus, the tip end of the standing wall portion 11b has the round shape, and the roughness of the side surface is reduced to a value between 50 Å and 200 Å. It can be found that the surface roughness (50–200 Å) of the standing wall portion 11b in this embodiment is remarkably improved in comparison with the surface roughness (250–500 Å) of the standing wall portion 211b in the prior art shown in FIG. 76. As a result, the irregular electric field at the side surface of the standing wall portion 11b of the embodiment is suppressed, compared with the prior art, and the electric field concentration at the tip end can be effectively prevented. Thereby, the lifetime of the capacitor insulating film 12 (see FIG. 1) can be improved. FIG. 18 is a cross section showing the standing wall portion 11b after the spatter etching step. Thereafter, as shown in FIG. 19, the capacitor insulating film 12 is formed to cover the base portion 11a and standing wall portion 11b of the capacitor lower electrode. The capacitor insulating film 12 is formed of a silicon nitride film ($Si_3N_4$), a silicon oxide film ($SiO_2$) or a composite film thereof, or is formed of a tantalum pentoxide film ($Ta_2O_5$), a hafnium oxide film ($HaO_2$) or others. Thereafter, the cell plate 13 formed of a polysilicon layer containing a large amount of doped arsenic is formed on the whole surface.

Figure 20:
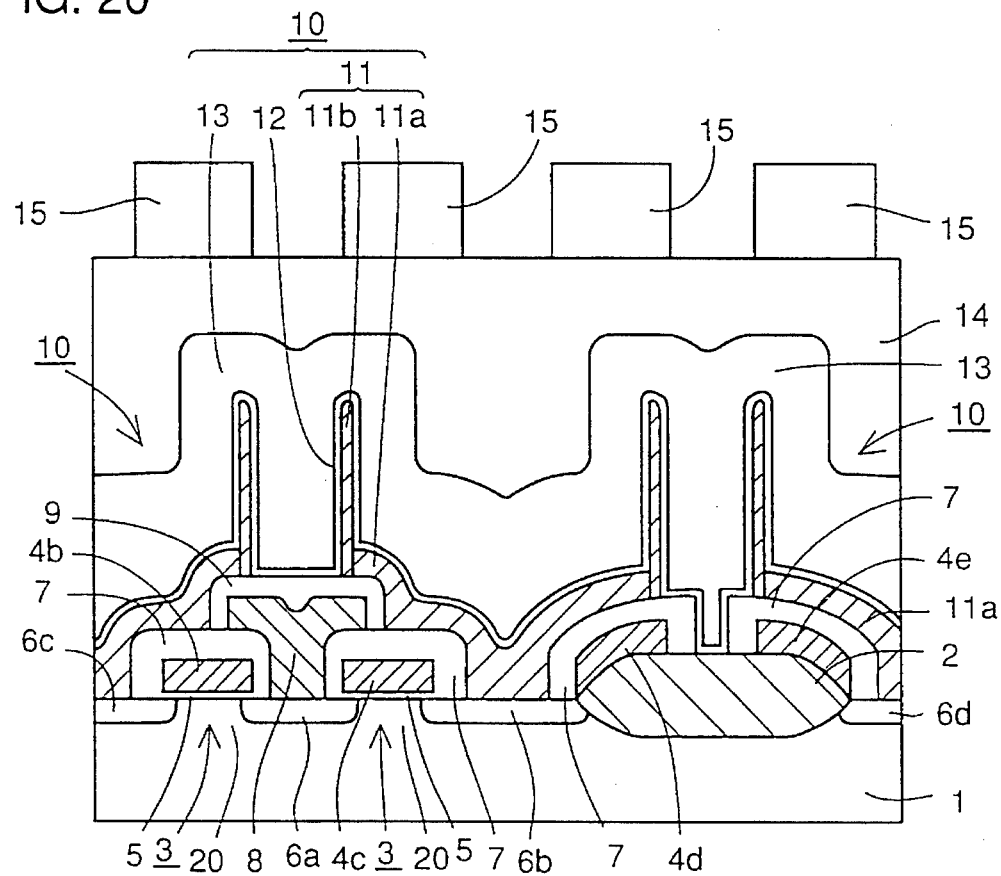

As shown in FIG. 20, the CVD method is used to form the interlayer insulating film 14 between about 5000 Å and about 10000 Å0 in thickness on the whole surface. The interconnection layers 15, which correspond to the word lines 4b, 4c, 4d and 4e, respectively, are formed, e.g., of aluminium with the predetermined spaces therebetween.

Finally, as shown in FIG. 1, the CVD method is used to form the protection film 16 which covers the interconnection layers 15 and is made of the silicon oxide film. The protection film 16 thus formed has a thickness of about 8000 Å. By these steps, the DRAM of the first embodiment is completed.

Figure 21:
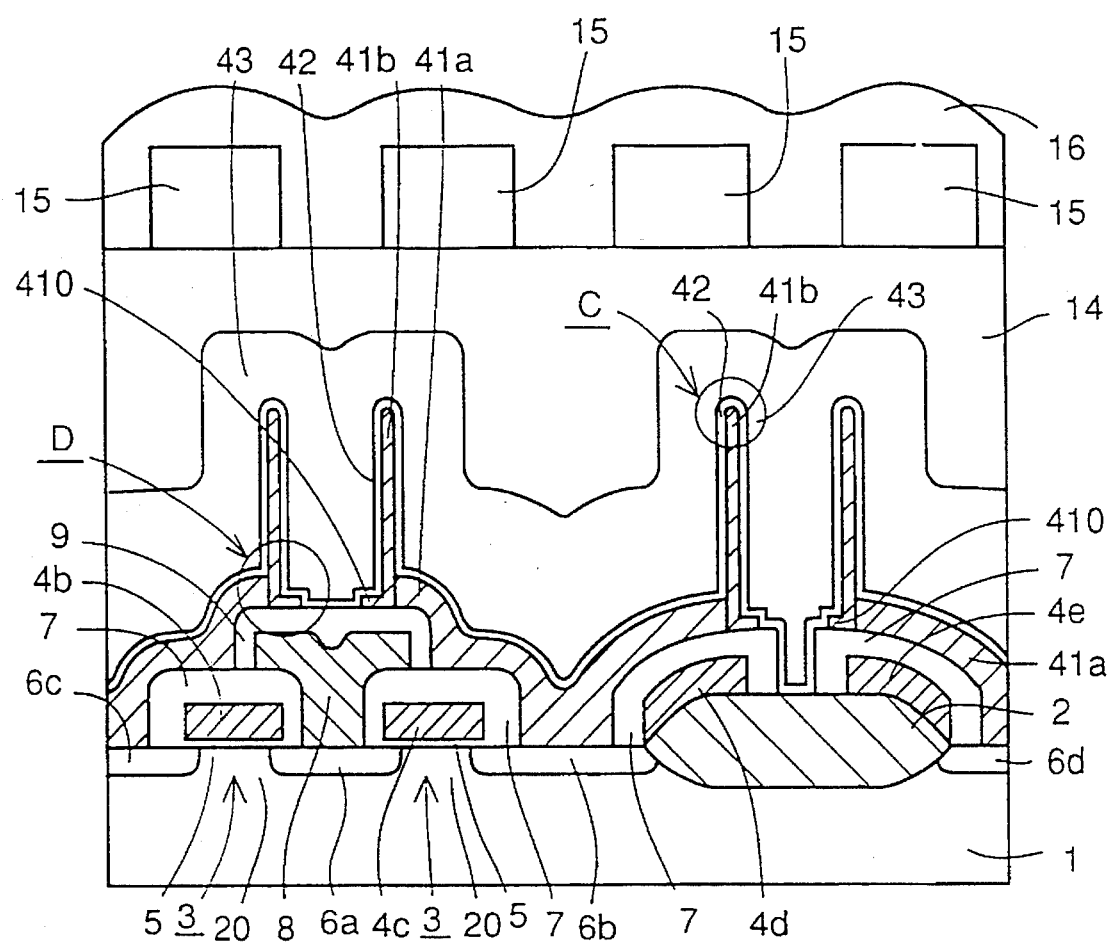
FIG. 21 is a cross section of a DRAM including a stacked type capacitor of a second embodiment of the invention.
Figure 22:
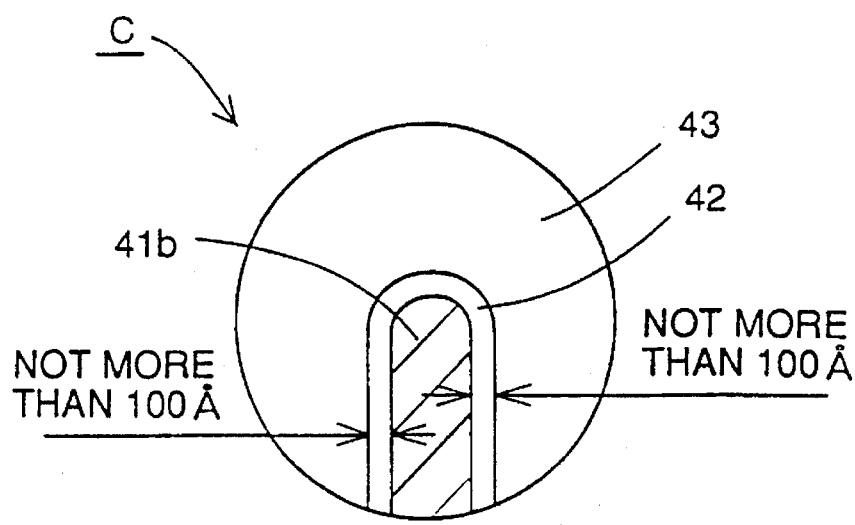
FIG. 22 is an enlarged cross section of a portion of a DRAM indicated by "C" in FIG. 21.
Figure 23:
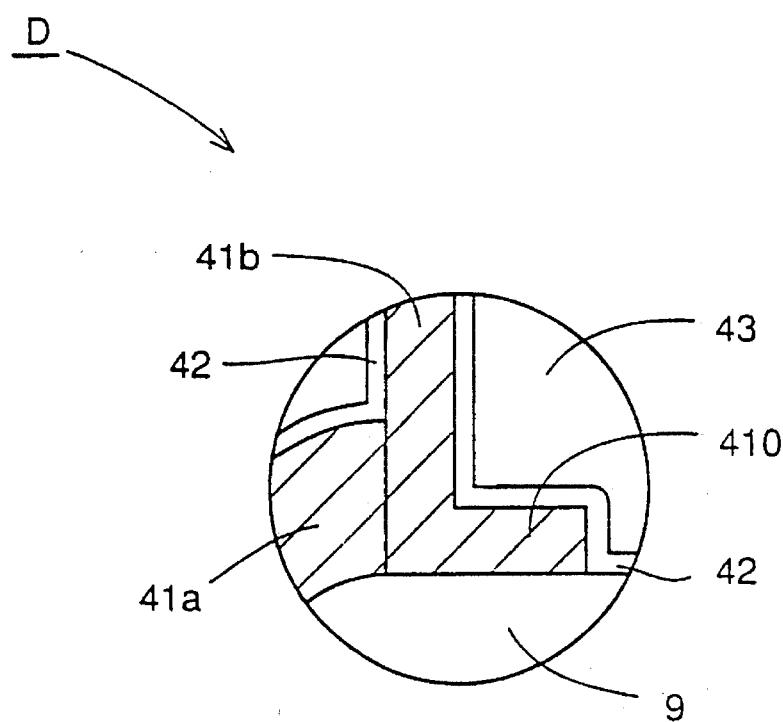
FIG. 23 is an enlarged cross section of a portion of a DRAM indicated by "D" in FIG. 21.

Referring to FIGS. 21–23, a DRAM of a second embodiment is different from the first embodiment shown in FIGS. 1 and 2 in that a roughness of opposite side surfaces of a standing wall portion 41b is reduced to a value of 100 Å or less. As a result, the second embodiment can further suppress the irregular electric field at the side surfaces of the standing wall portion 41b, compared with the first embodiment. In the DRAM of the second embodiment, the tip end of the standing wall portion 41b is rounded to a higher extent, compared with the first embodiment shown in FIG. 2. As a result, the second embodiment can suppress the electric field concentration at the tip end of the standing wall portion 41b to a higher extent, compared with the first embodiment. The standing wall portion 41b of the DRAM of the second embodiment has an L-shaped lower end 410, which is different from the first embodiment. Therefore, the second embodiment can increase the capacitor capacity, compared with the first embodiment. Structures of the second embodiment other than those described above are similar to those of the first embodiment.

The DRAM of the second embodiment includes the silicon substrate 1, the element isolating oxide film 2 formed on a predetermined region of the major surface of the silicon substrate 1 for isolating elements, source/drain regions 6a, 6b, 6c and 6d formed in regions surrounded by the element isolating oxide film 2 with predetermined spaces therebetween and located at opposite sides of the channel regions 20, the gate electrodes (word lines) 4b and 4c formed on the channel regions 20 with the gate oxide film 5 therebetween, the word lines (gate electrodes) 4d and 4e formed on the element isolating oxide film 2 with a predetermined space therebetween, and the insulating films 7 covering the gate electrodes 4b, 4c, 4d and 4e. The DRAM further includes the buried bit line 8 electrically connected to the source/drain region 6a, the insulating film 9 covering the buried bit line 8, base portions 41a forming the capacitor lower electrodes (storage nodes) which are electrically connected to the source/drain region 6b and extend over and along the insulating films 7 and 9, standing wall portions 41b formed along outer peripheries of the base portions 41a and extending substantially perpendicularly to the silicon substrate 1 at an angle between 87 and 90 degrees, a capacitor insulating film 42 covering the base portions 41a and the standing wall portions 41b, a cell plate 43 covering the capacitor insulating film 42, the interlayer insulating film 14 covering the cell plate 43 and having a flattened surface, the interconnection layers 15 formed on the interlayer insulating film 14 with predetermined spaces between each other and corresponding to the gate electrodes 4b, 4c, 4d and 4e, respectively, and the protection film 16 covering the interconnection layers 15.

The base portion 41a forming the capacitor lower electrode (storage node) of the second embodiment is formed of a polysilicon layer, which contains a large amount of doped arsenic and has a thickness between about 1500 Å and 4000 Å. The standing wall portion 41b is formed of a polysilicon layer, which contains a large amount (about $2\times10^{20}/cm^3$) of doped arsenic or phosphorus and has a thickness between about 500 Å and 1000 Å.

Referring to FIGS. 22–40, a manufacturing process of the DRAM of the second embodiment will be described below.

Figure 24:
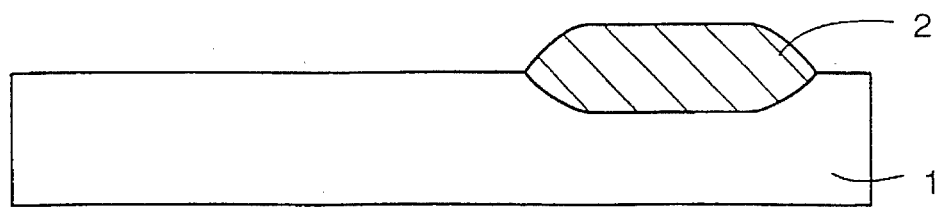
FIGS. 24–32 are cross sections showing 1st to 9th steps in a manufacturing process of a DRAM of a second embodiment shown in FIG. 21, respectively.
Figure 25:
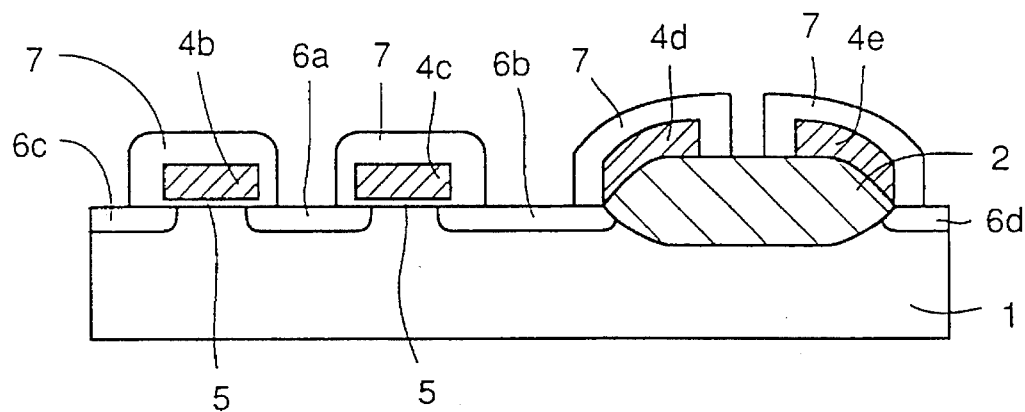

First, as shown in FIG. 24, the element isolating oxide film 2 made of silicon oxide film is formed to have a thickness of about 4000 Å on the predetermined region of the major surface of the silicon substrate 1 by the LOCOS method. Then, after forming the gate oxide film 5 by the thermal oxidation method, as shown in FIG. 25, the gate electrodes (word lines) 4b, 4c, 4d and 4e formed of the polysilicon layer containing a large amount of doped arsenic are selectively formed on the gate oxide film 5. The gate electrodes 4b, 4c, 4d and 4e may be made of polycide, which is formed of the polysilicon layer containing a large amount of doped arsenic and $WSi_2$ or $TiSi_2$ formed on the polysilicon layer by the spatter method. The CVD method is used to execute two oxide film forming steps and two etching steps, whereby the insulating films 7 covering the gate electrodes 4b, 4c, 4d and 4e are formed. The insulating films 7 are formed of the silicon nitride films ($Si_3N_4$) or the silicon oxide films ($SiO_2$), or are formed of composite films of them. The insulating films 7 are used as a mask, and the ion implantation of the arsenic (As) is carried out under the conditions of about 50 KeV and $4\times10^{15}/cm^2$ Thereby, the source/drain regions 6a, 6b, 6c and 6d are formed.

Figure 26:
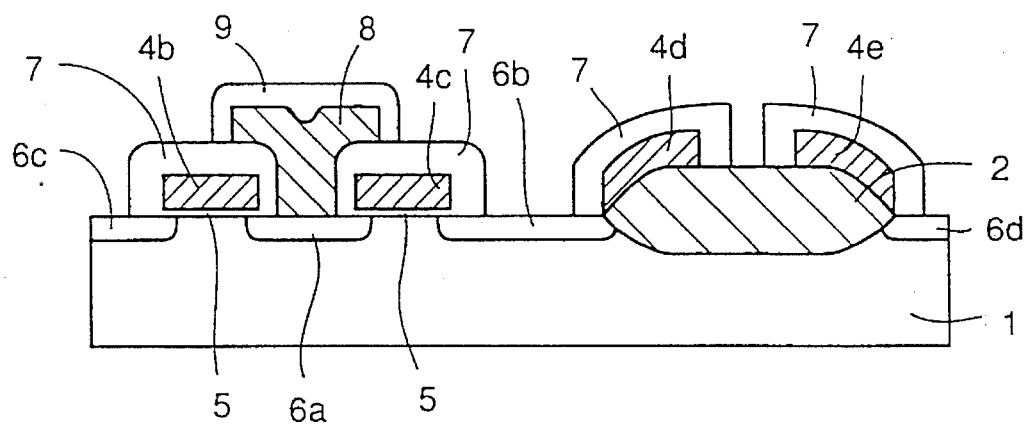

As shown in FIG. 26, the polysilicon layer containing a large amount of doped arsenic is patterned to form the buried bit line 8 which directly contacts the source/drain region 6a. The buried bit line 8 may be made of polycide, which is formed of the polysilicon layer containing a large amount of arsenic and a $WSi_2$ film or a $TiSi_2$ film formed on the same polysilicon layer by the spatter method. The insulating film 9 is formed to cover the buried bit line 8. The insulating film 9 is formed of the silicon nitride film ($Si_3N_4$) or the silicon oxide film ($SiO_2$) and has the thickness between about 500 Å and about 1000 Å.

Figure 27:
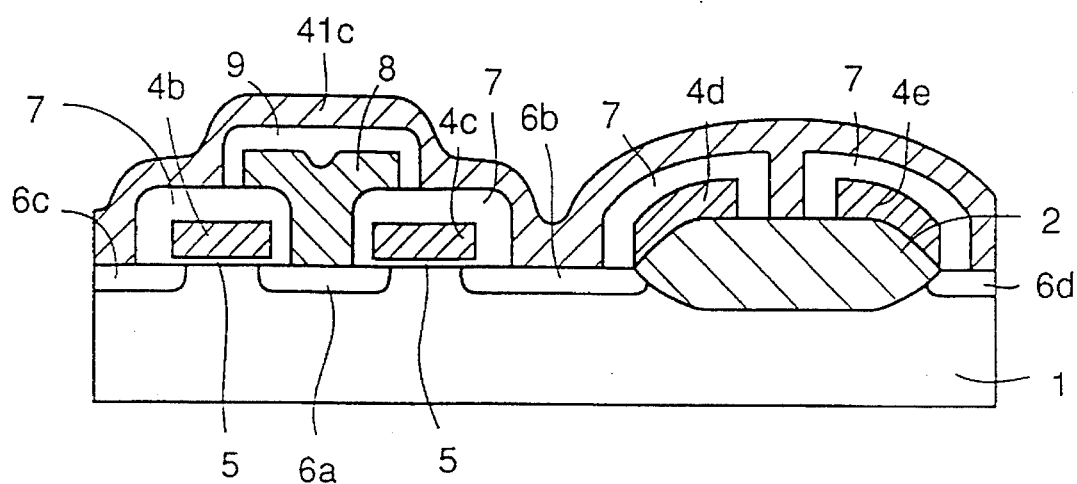
Figure 28:
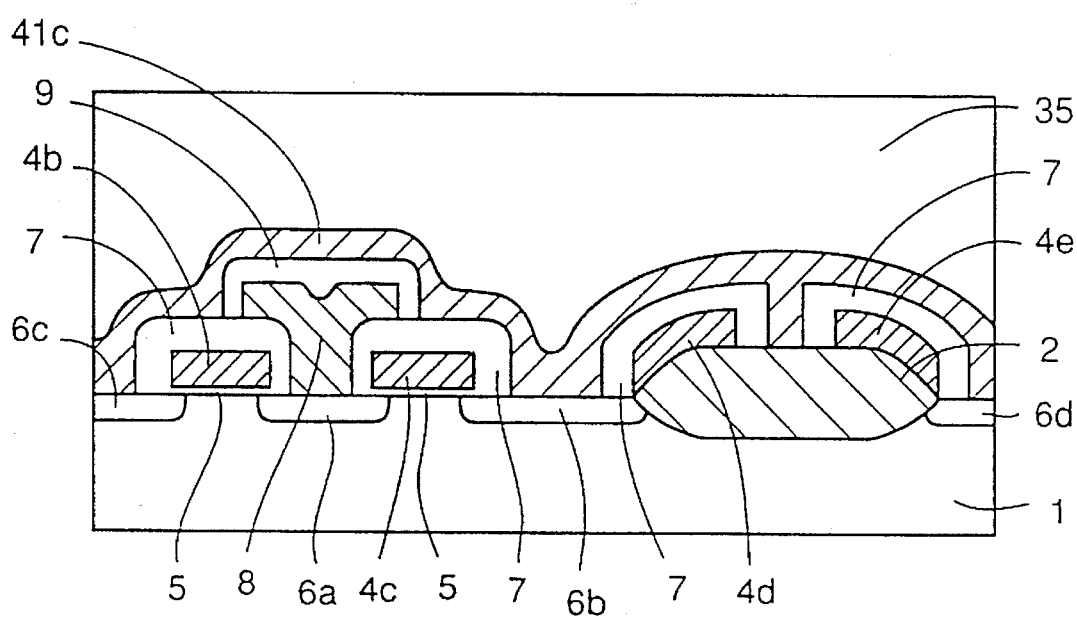

As shown in FIG. 27, a polysilicon layer 41c containing a large amount of doped arsenic (As) is formed to have the thickness between about 1500 Å and about 4000 Å on the whole surface of the silicon substrate 1 by the CVD method. Then, as shown in FIG. 28, the polysilicon layer 41c is covered with the interlayer insulating layer 35 having the thickness between about 5000 Å and about 10000 Å. The thickness of this insulating layer 35 determines the height of the standing wall portion 41b of the capacitor lower electrode (storage node).

Figure 29:
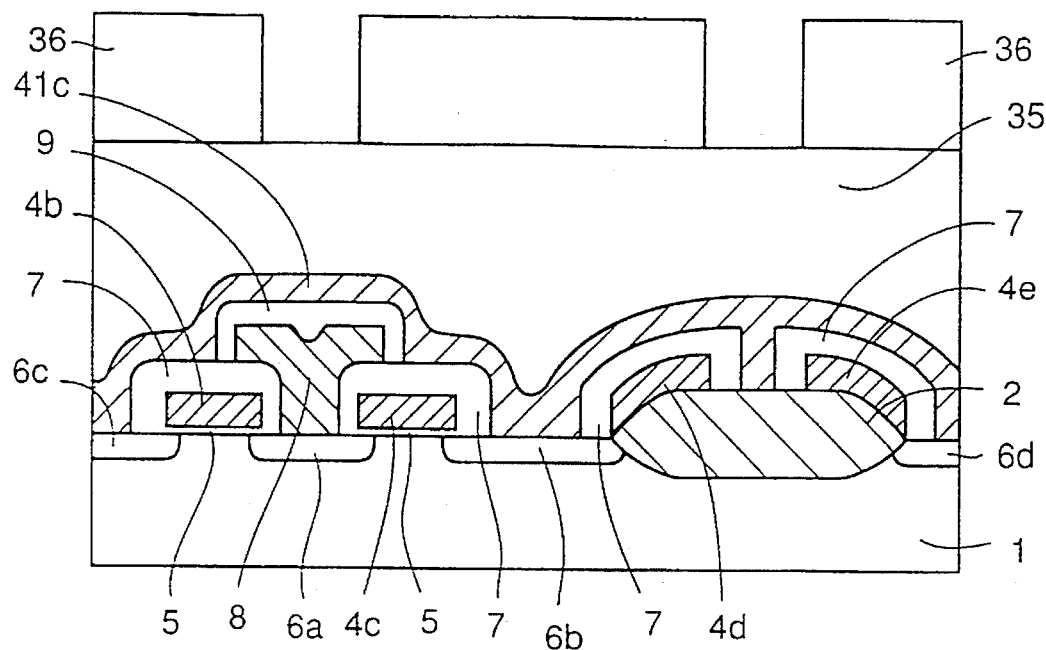
Figure 30:
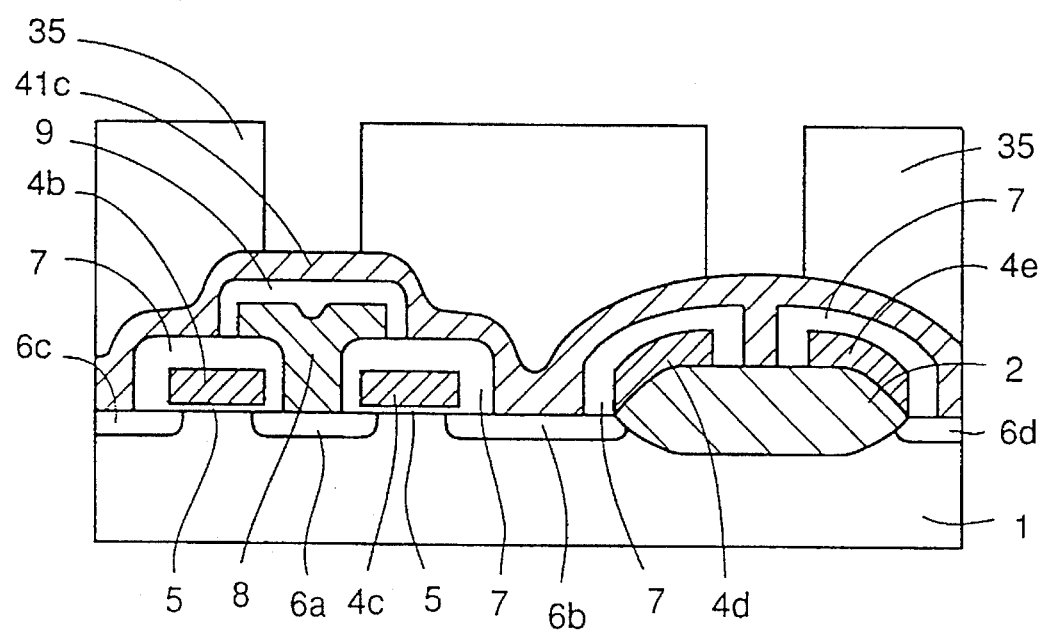

As shown in FIG. 29, the resist pattern (capacitor separating layer) 36, which is patterned into a predetermined shape, e.g., by the lithography or the like is formed on the surface of the insulating layer 35. The width of the resist pattern 36 determines a space by which the adjacent capacitors are separated from each other. The insulating layer 35 is selectively removed, e.g., by an anisotropic etching, using the resist pattern 36 as a mask. Thereafter, the resist pattern 36 is removed, whereby the configurations shown in FIG. 30 is obtained.

Figure 31:
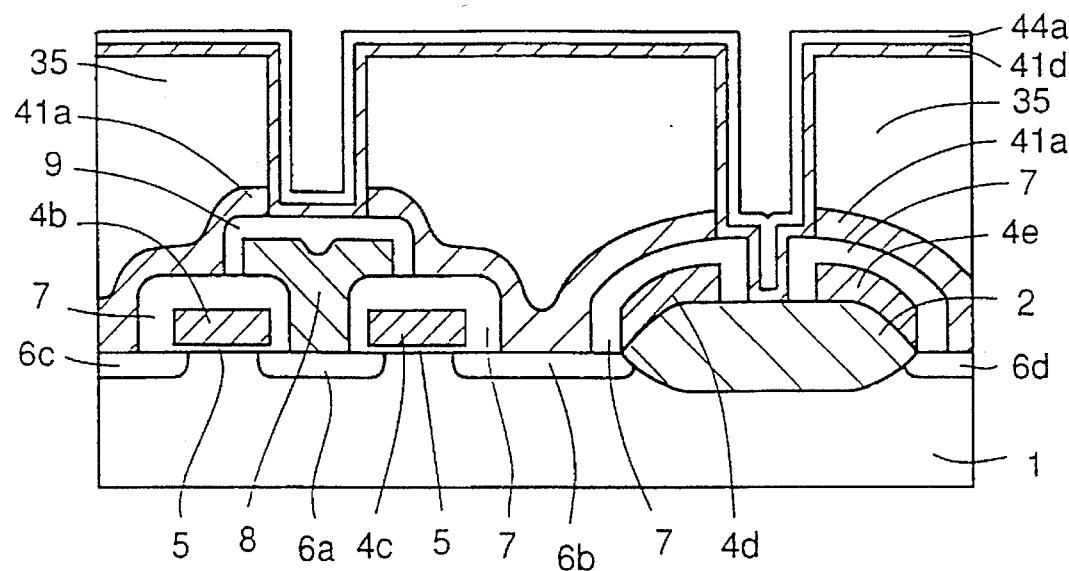

Then, as shown in FIG. 31, the patterned insulating layer 35 is used as a mask, and the base portions 41a of the capacitor lower electrodes are formed, e.g., by an anisotropic etching. Instead of the etching of the capacitor lower electrode with the patterned insulating layer 35, the polysilicon layer 41c may be etched with the resist pattern 36, immediately after the patterning of the insulating layer 35 with the resist pattern 36. Then, the CVD method is used to form a polysilicon layer 41d containing a large amount ($2\times10^{20}/cm^2$) of phosphorus or arsenic on the whole surface at a thickness between about 500 Å and about 1000 Å. An oxide film 44a is formed at a thickness between about 500 Å and about 1000 Å on the polysilicon layer 41d.

Figure 32:
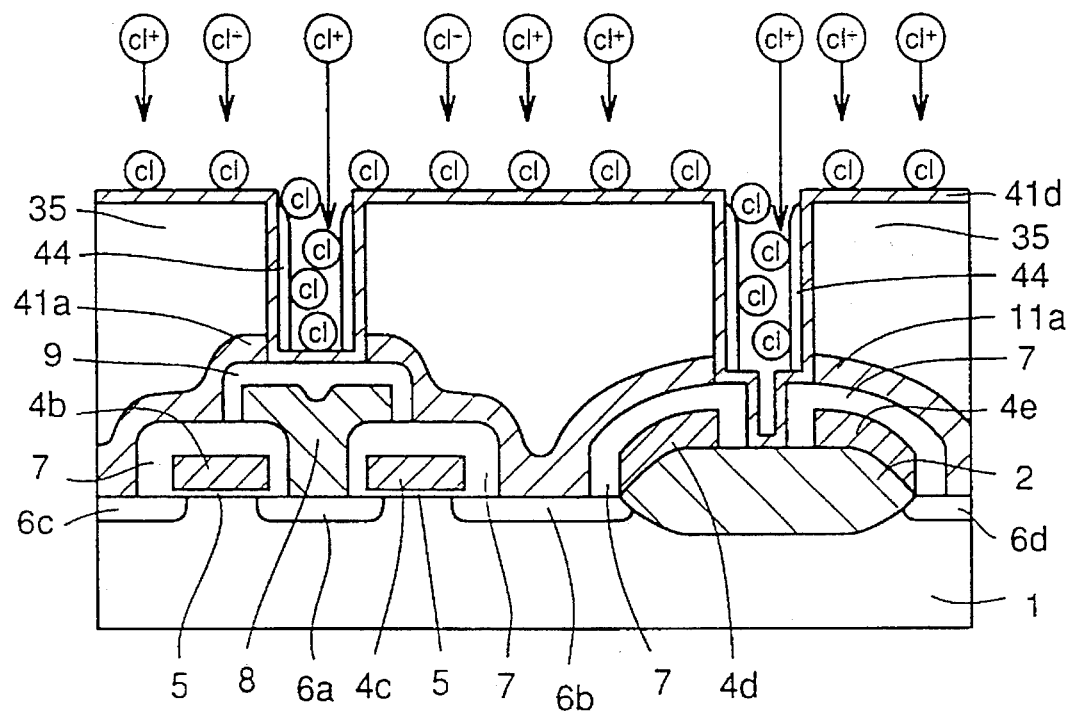
Figure 33A:
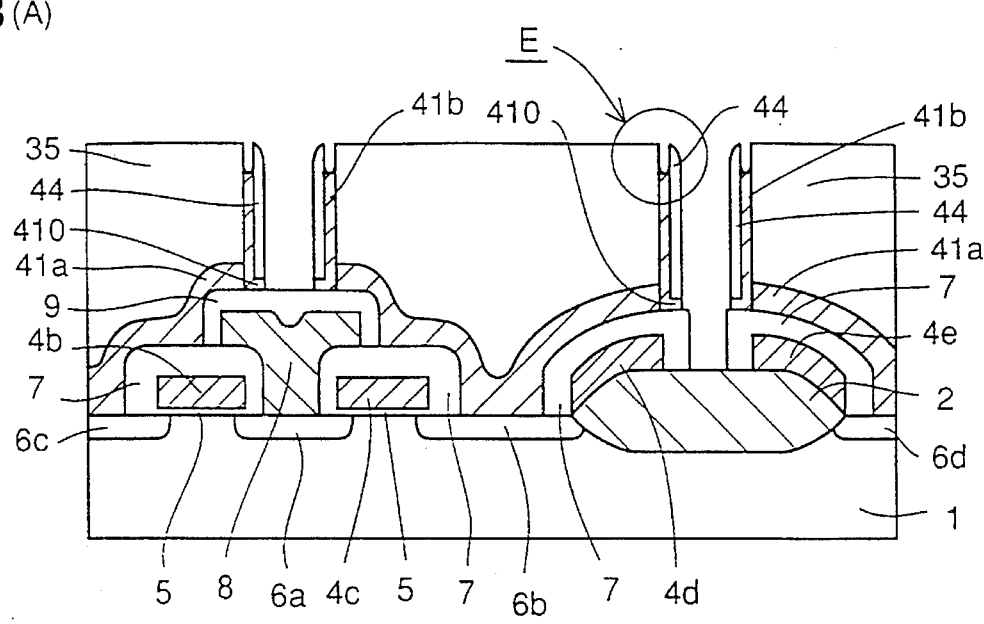
FIG. 33A is a cross section showing a 10th step in a manufacturing process of a DRAM of a second embodiment shown in FIG. 21.
Figure 33B:
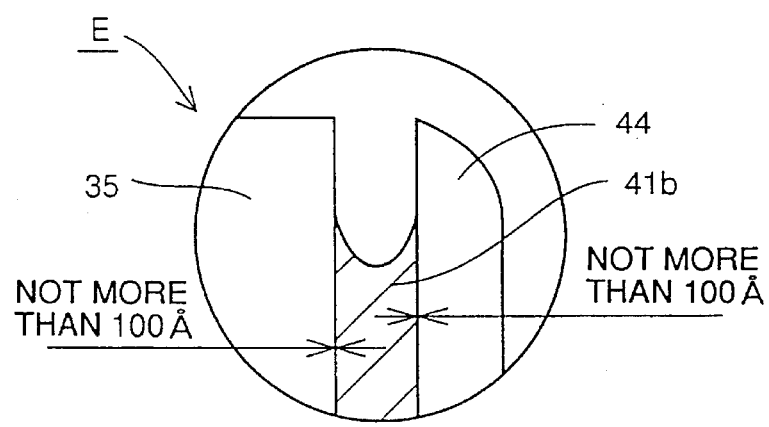
FIG. 33B is an enlarged cross section of a portion of a DRAM indicated by "E" in FIG. 33A.
Figure 34:
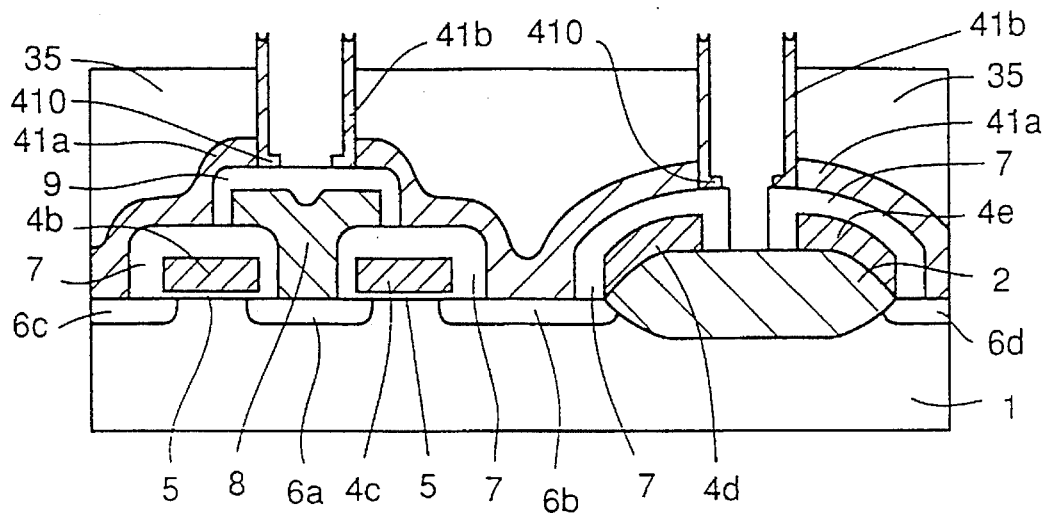
FIGS. 34 and 35 are cross sections showing 11th and 12th steps in a manufacturing process of a DRAM of a second embodiment shown in FIG. 21, respectively.

Then, as shown in FIG. 32, an anisotropic etching is applied to the oxide film 44a to form side wall oxide films 44. Then, as shown in FIG. 33A, an anisotropic etching is applied to the polysilicon layer 41d (see FIG. 32) to form the standing wall portions 41b. During the anisotropic etching for forming the standing wall portions 41b, the opposite side surfaces of each standing wall portion 41b is protected by the insulating layer 35 and the side wall oxide film 44, so that the reactive etching does not roughen the surfaces. As a result, the roughness of each side surfaces of the standing wall portion 41b is not more than 100 Å, as shown in FIG. 33B. Opposite edges of the tip end of the side wall portion 41b become sharp. Owing to the etching with the side wall oxide film 44, the standing wall portion 41b has the L-shaped lower end 410. In this state, an anisotropic etching, e.g., utilizing fluorine, is effected on the insulating layer 35 to partially remove the insulating layer 35 through a predetermined thickness. Thereby, the tip end of each standing wall portion 11b is exposed, and the side wall oxide film 44 is removed. The removal of the insulating layer 35 by the predetermined thickness may be executed by the etchback, in which case the side wall oxide film 44 is also removed by a predetermined thickness.

Figure 35:
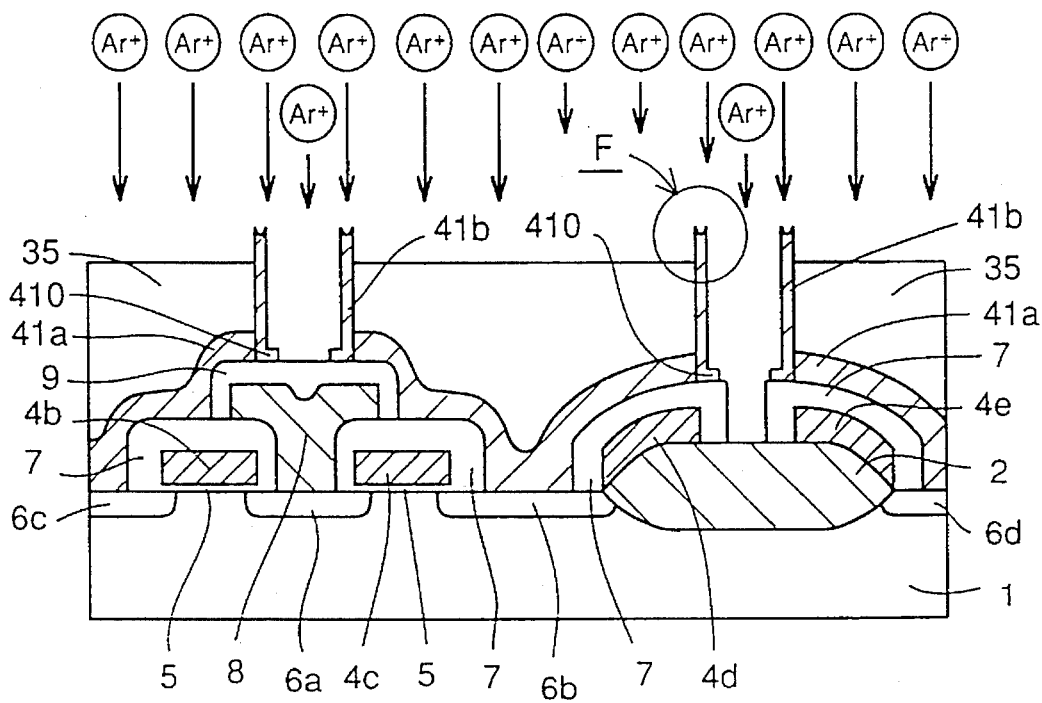
Figure 36:
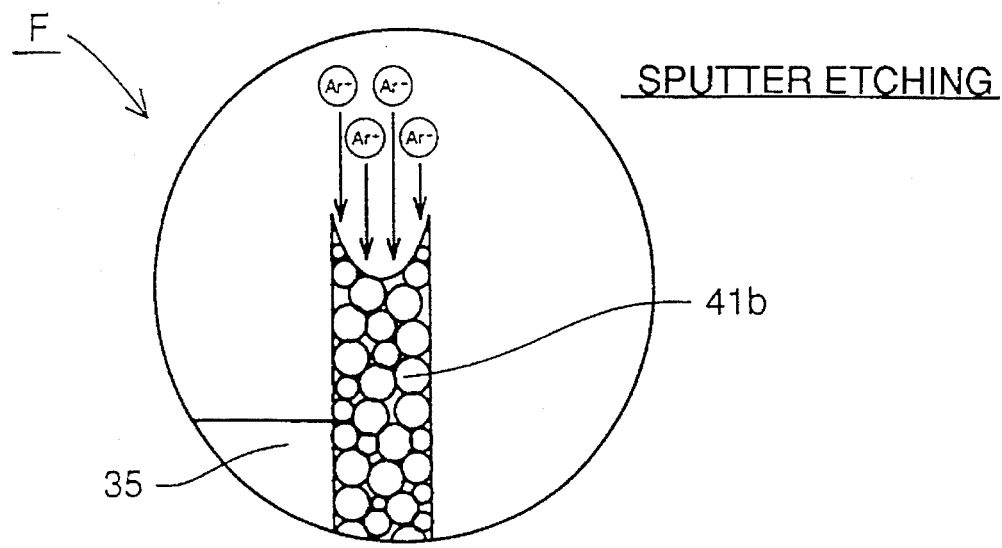
FIGS. 36–38 are cross sections showing 1st to 3rd stages in a sputter etching step shown in FIG. 35, respectively.
Figure 37:
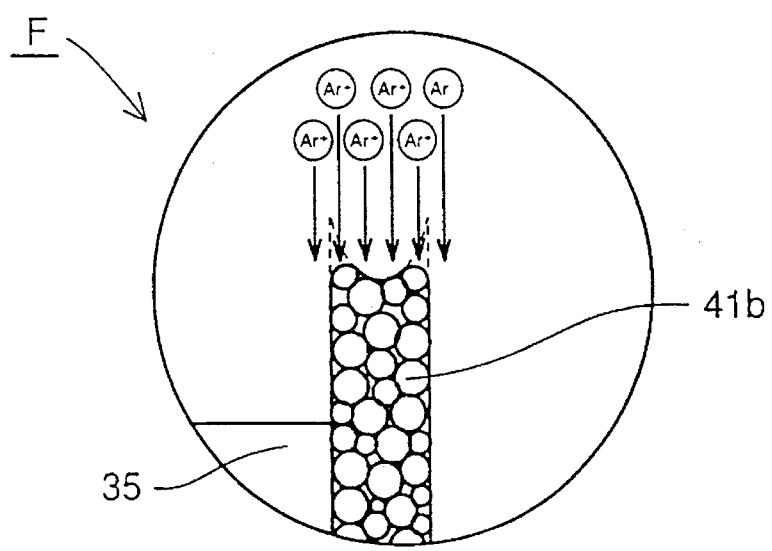
Figure 38:
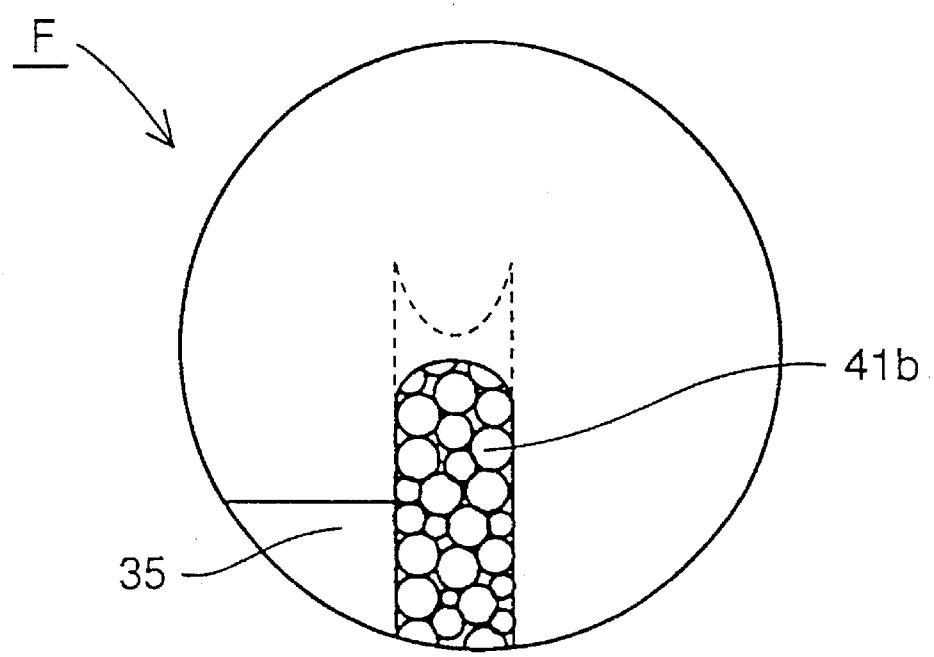
Figure 39:
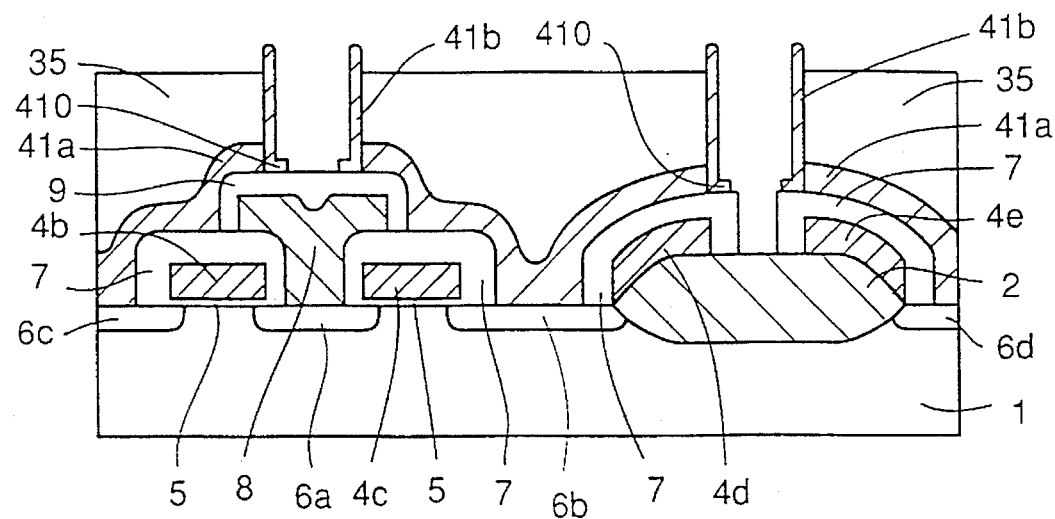
FIGS. 39 and 40 are cross sections showing 13th and 14th steps in a manufacturing process of a DRAM of a second embodiment shown in FIG. 21, respectively.

Then, as shown in FIG. 35, a sputter etching is applied to the standing wall portion 41b, e.g., with $Ar^+$ ion generated by high-frequency discharging of argon gas (Ar). FIGS. 36–38 are enlarged schematic views showing a portion indicated by "F" in FIG. 35 for illustrating sputter etching stages of the standing wall portion 41b. Referring to FIG. 36, the opposite edges of the tip end of the standing wall portion 41b have the sharp shapes. The sputter etching applied to the end having such shapes progresses from the opposite edges of the tip end of the standing wall portion 41b, as shown in FIG. 37. Thus, the spatter etching is liable to shave an inclined surface, compared with an uninclined surface, so that the opposite edges of the tip end is etched prior to the other portions. Finally, the tip end has a round shape, as shown in FIG. 38. The round shape of the tip end of the standing wall portion 41b shown in FIG. 38 is nearer to a circle, compared with the round shape of the tip end of the standing wall portion 11b of the first embodiment shown in FIG. 2. Therefore, the second embodiment can suppress the field concentration at the tip end of the standing wall portion 41b to an extent higher than that achieved by the first embodiment. The shape of the tip end of the standing wall portion 41b of the second embodiment shown in FIG. 36 can be easily changed into the circular shape, compared with the shape of the tip end of the standing wall portion 11b of the first embodiment shown in FIG. 15, so that the etching time can be shorter than the sputter etching time of the first embodiment. The sputter etching shown in FIGS. 36–38 is carried out under the conditions that the RF power is between 0.2 and 1.0 KW/cm², the gas pressure is not more than 30 mToor, the Ar gas flow rate is between 20 and 50 sccm, the frequency is 13.56 MHz and the sputter etching time is between 30 seconds and 1 minute. The sputter etching of the standing wall portions 41b forms the configurations shown in FIG. 39. Thereafter, the insulating layer 35 is removed.

Figure 40:
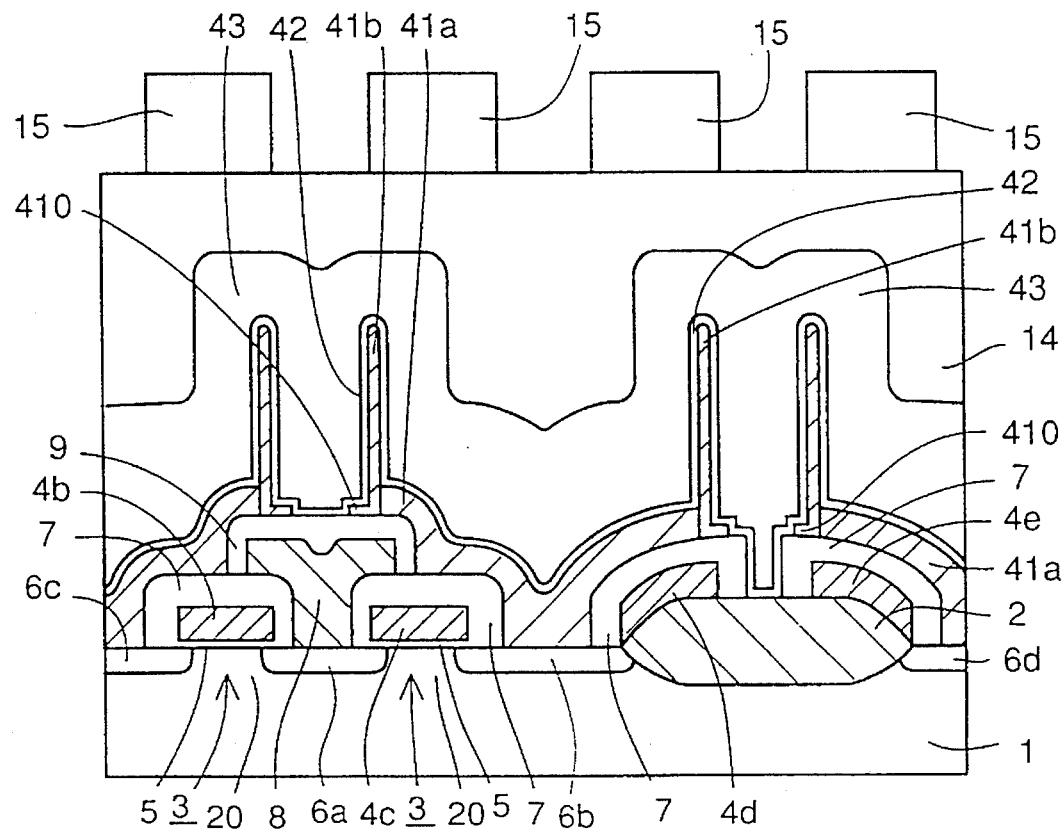

As shown in FIG. 40, the capacitor insulating film 42 is formed to cover the base portions 41a and standing wall portions 41b of the capacitor lower electrodes. The cell plate 43, which is the polysilicon layer containing a large amount of doped arsenic, is formed to cover the capacitor insulating film 42. The CVD method is used to form the interlayer insulating film 14, and thereafter, the interconnection layers 15, which correspond to the word lines 4b, 4c, 4d and 4e, respectively, are formed, e.g., of aluminium with the predetermined spaces therebetween.

Finally, as shown in FIG. 21, the protection film 16, which is the silicon oxide film and covers the interconnection layers 15, is formed. By these steps, the DRAM of the second embodiment is completed.

Figure 41:
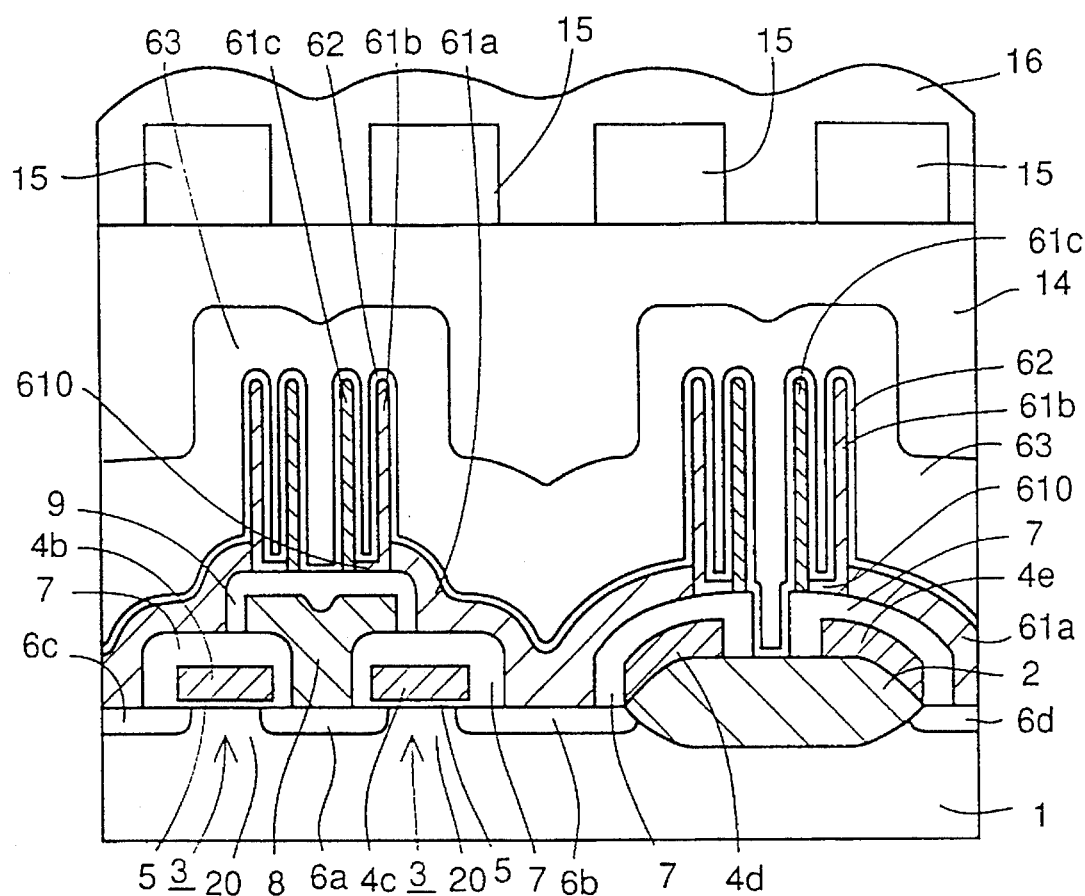
FIG. 41 is a cross section of a DRAM including a stacked type capacitor of a third embodiment of the invention.

In a third embodiment shown in FIG. 41, the standing wall portion forming the capacitor lower electrode is formed of a first standing wall portion 61b and a second standing wall portion 61c. The first and second standing wall portions 61b and 61c have round tip ends similarly to the first and second embodiments, and have side surfaces of which roughness is not more than 200 Å. These structures can further increase the capacitor capacity. The field concentration at the tip ends of the first and second standing wall portions 61b and 61c can be suppressed, and the irregular electric field at the side surfaces of the first and second standing wall portions 61b and 61c can be suppressed. As a result, the lifetime of a capacitor insulating film 62 can be improved. Except for the structures of the first and second standing wall portions 61b and 61c, the DRAM of the third embodiment is similar to those of the first and second embodiments.

More specifically, the DRAM of the third embodiment includes the silicon substrate 1, the element isolating oxide film 2 formed on a predetermined region of a major surface of the silicon substrate 1 for isolating elements, source/drain regions 6a, 6b, 6c and 6d formed in regions surrounded by the element isolating oxide film 2 with predetermined spaces therebetween and located at opposite sides of the channel regions 20, the gate electrodes (word lines) 4b and 4c formed on the channel regions 20 with the gate oxide film 5 therebetween, the word lines (gate electrodes) 4d and 4e formed on the element isolating oxide film 2 with a predetermined space therebetween, and the insulating films 7 covering the gate electrodes 4b, 4c, 4d and 4e. The DRAM further includes the buried bit line 8 electrically connected to the source/drain region 6a, the insulating film 9 covering the buried bit line 8, base portions 61a forming the capacitor lower electrodes (storage nodes) which are electrically connected to the source/drain region 6b and extend over and along the insulating films 7 and 9, the standing wall portions 61b, which are formed along outer peripheries of the base portions 61a, extend substantially perpendicularly to the silicon substrate 1 at an angle between 87 and 90 degrees and have L-shaped lower ends 610, the second standing wall portions 61c, which are electrically connected to the lower ends 610 of the first standing wall portions 61b and extend substantially parallel to the first standing wall portions 61b with predetermined spaces therebetween, respectively, a capacitor insulating film 62 covering the base portions 61a as well as the first and second standing wall portions 61b and 61c, a cell plate 63 covering the capacitor insulating film 62, the interlayer insulating film 14 covering the cell plate 63 and having a flattened surface, the interconnection layers 15 formed on the interlayer insulating film 14 with predetermined spaces between each other and corresponding to the gate electrodes 4b, 4c, 4d and 4e, respectively, and the protection film 16 covering the interconnection layers 15.

Referring to FIGS. 42–57, a manufacturing process of the third embodiment will be described below.

Figure 42:
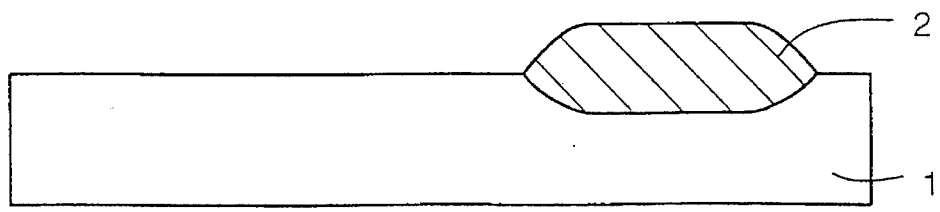
FIGS. 42–50 are cross sections showing 1st to 9th steps in a manufacturing process of a DRAM of a third embodiment shown in FIG. 41, respectively.
Figure 43:
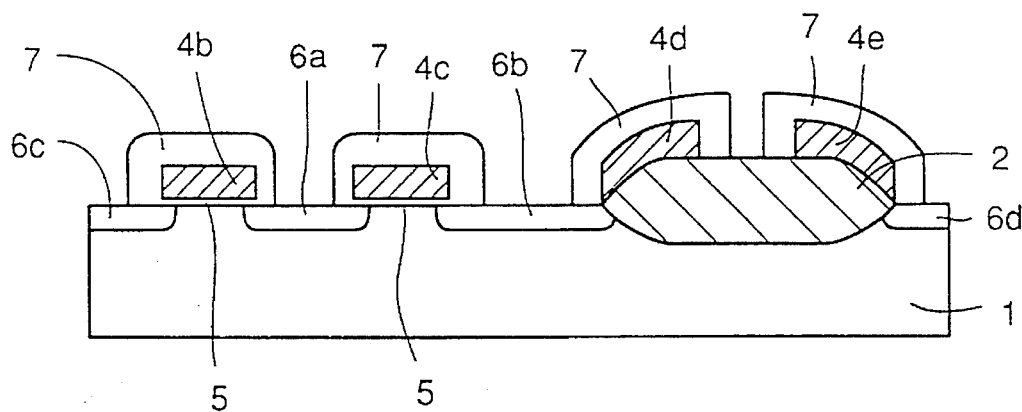
Figure 44:
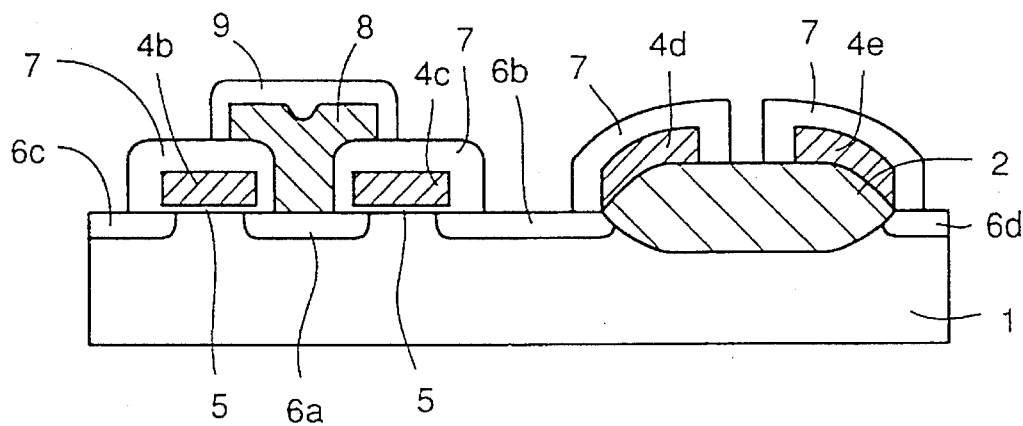
Figure 45:
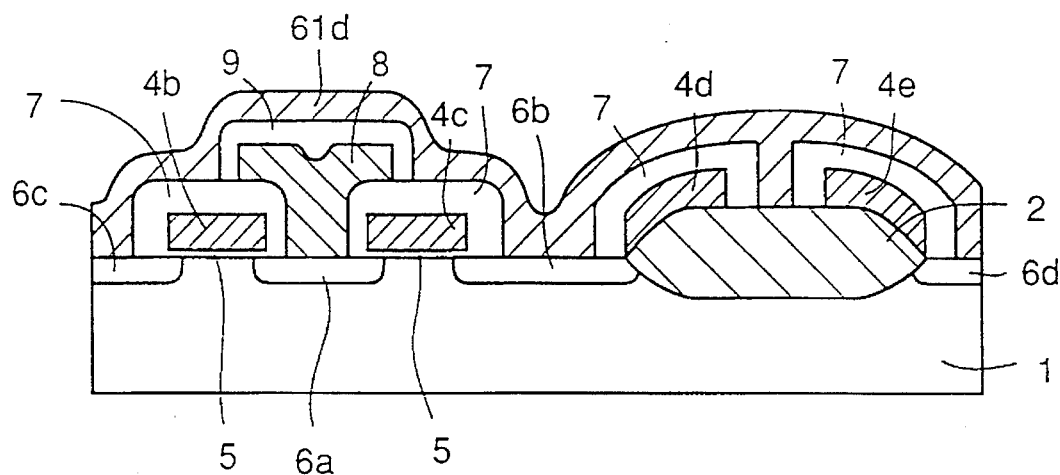
Figure 46:
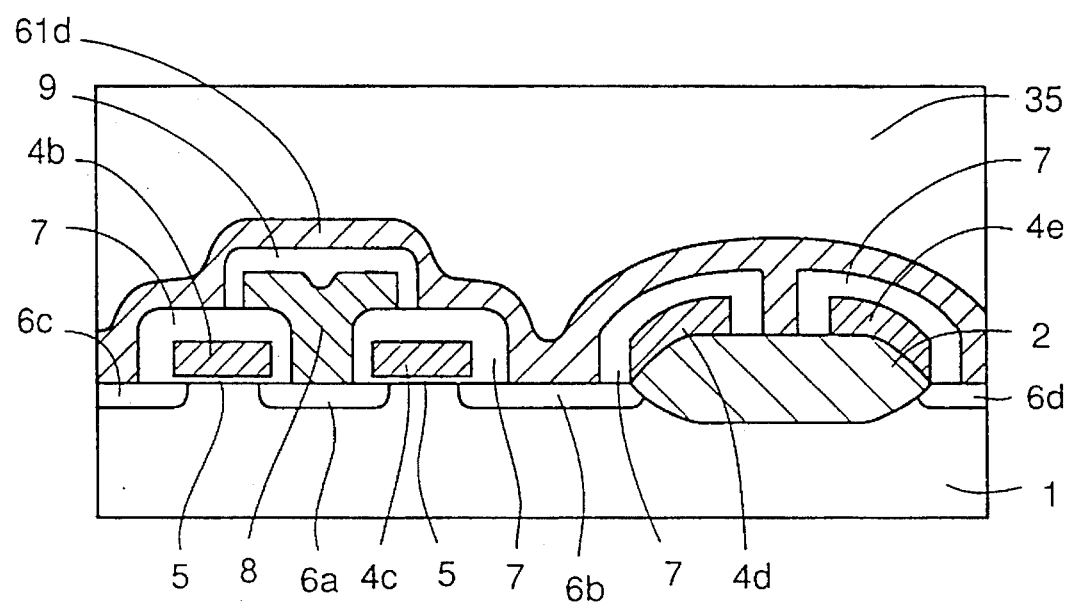
Figure 47:
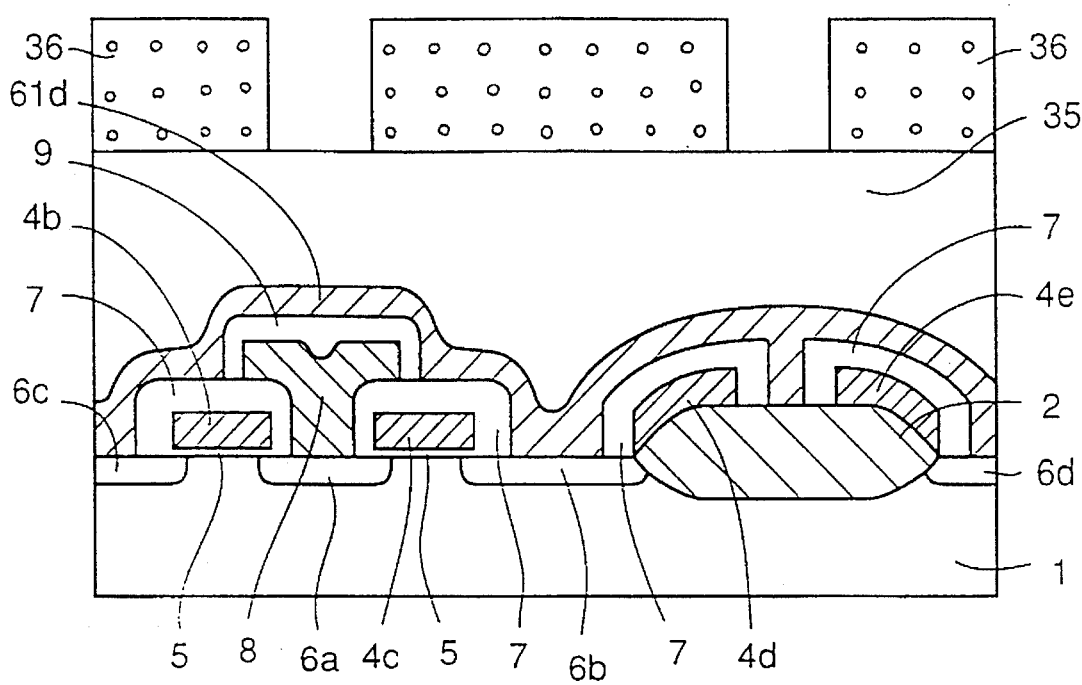
Figure 48:
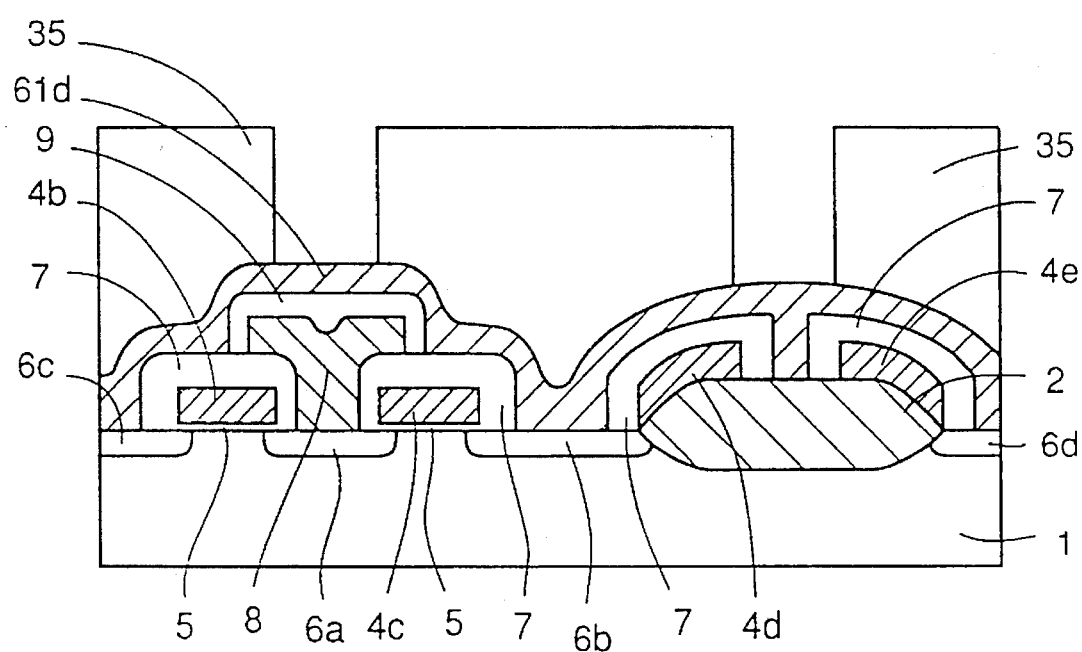
Figure 49:
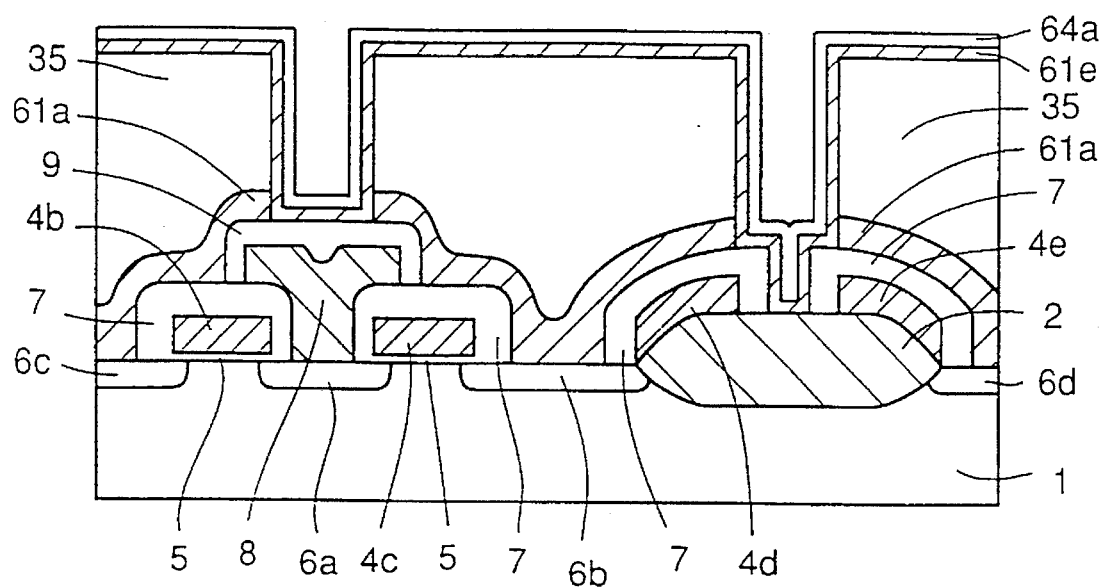
Figure 50:
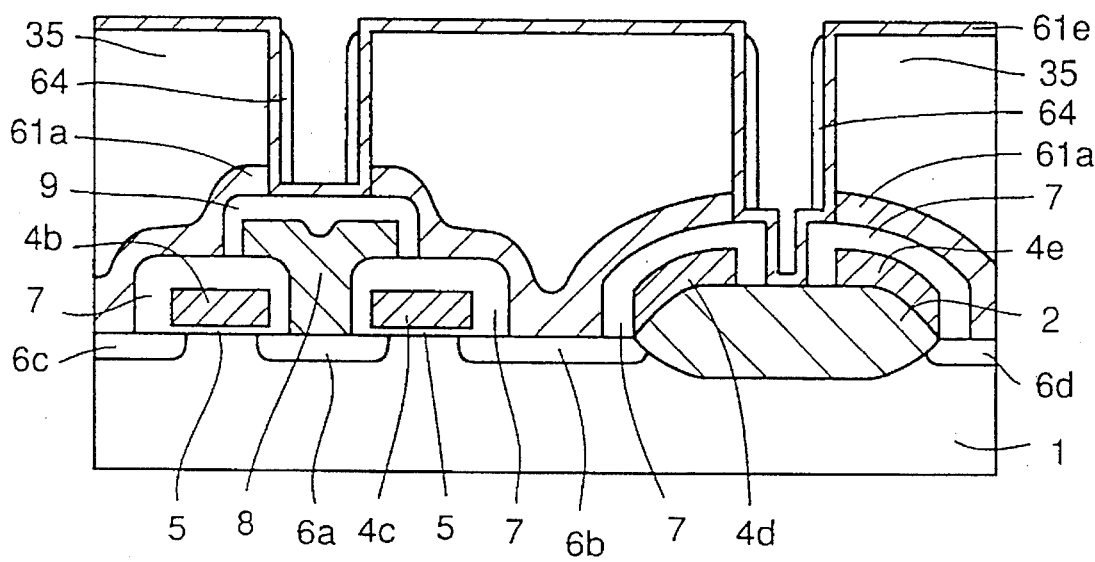
Figure 51A:
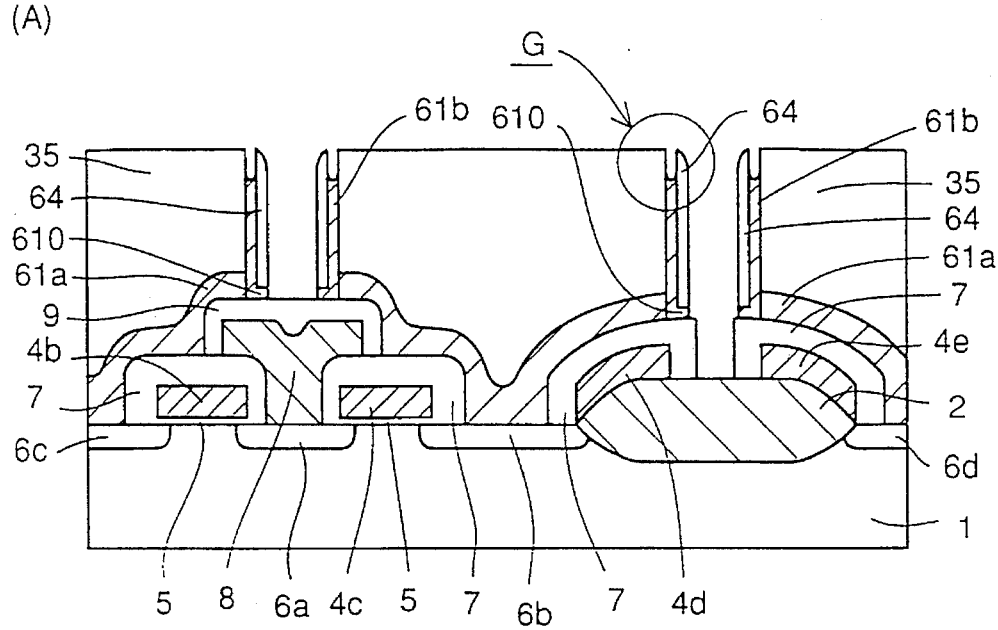
FIG. 51A is a cross section showing a 10th step in a manufacturing process of a DRAM of a third embodiment shown in FIG. 41.
Figure 51B:
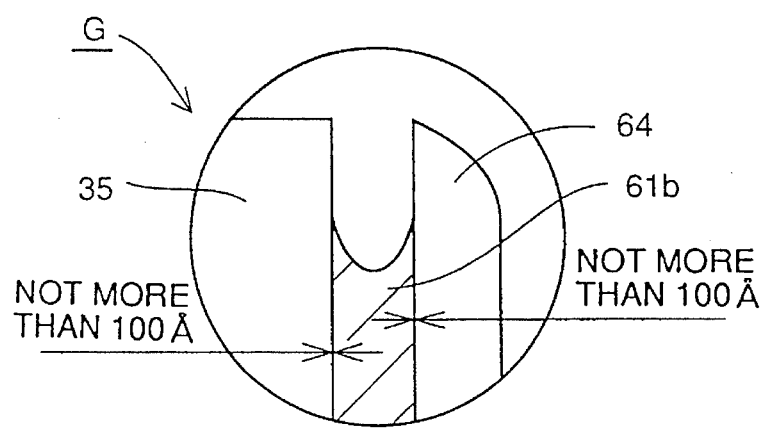
FIG. 51B is an enlarged cross section of a portion of a DRAM indicated by "G" in FIG. 51A.

As shown in FIG. 42, the element isolating oxide film 2 is formed at a thickness of about 4000 Å on a predetermined region of the major surface of the silicon substrate 1 by the LOCOS method. A process shown in FIGS. 43–51B is carried out similarly to the manufacturing process of the second embodiment already described with reference to FIGS. 25–33B. Specifically, as shown in FIGS. 42–44, after forming the gate electrodes (word lines) 4b, 4c, 4d and 4e and the buried bit line 8, the buried bit line 8 is covered with the insulating film 9 which is formed of a silicon nitride film or a silicon oxide film and has a thickness between about 500 Å and about 1000 Å. As shown in FIGS. 45 and 46, the polysilicon layer 61d, which contains a large amount of doped arsenic, and the insulating layer 35, which is formed of a silicon oxide film and has a thickness between about 5000 Å and about 10000 Å, are formed on the whole surface of the silicon substrate 1. Thereafter, as shown in FIGS. 47–49, the insulating layer 35 is patterned, using the resist film 36, which is formed by lithography, as a mask. The base portion 61a forming the capacitor lower electrode is formed, using the patterned insulating layer 35. The polysilicon layer 61c, in which a large amount of arsenic or phosphorus is doped by the CVD method, is formed, and then is covered with a silicon oxide film 64a having a thickness between about 500 Å and about 1000 Å. As shown in FIG. 50, an anisotropic etching is carried out on the silicon oxide film 64a to form side wall oxide films 64. An anisotropic etching is carried out on a polysilicon layer 61e (FIG. 50), using the side wall oxide films 64 which serves as a mask and a side wall protection film. Thereby, the first standing wall portions 61b, each of which has the L-shaped lower end 610 and the roughness of the opposite side surfaces of 100 Å or less, are formed, as shown in FIGS. 51A and 51B.

Figure 52:
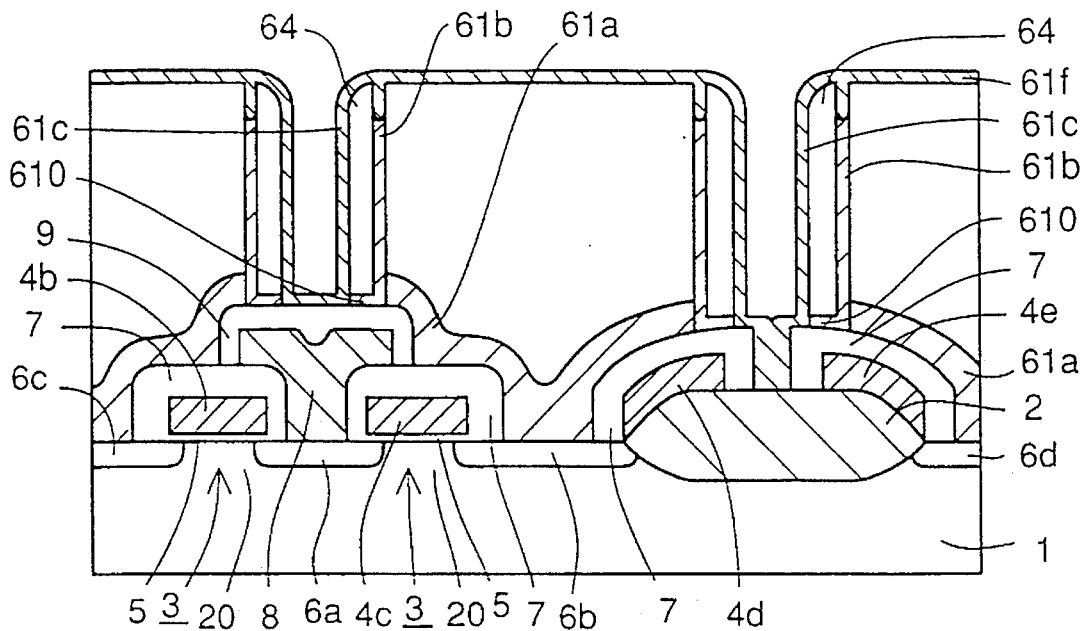
FIGS. 52–54 are cross sections showing 11th to 13th steps in a manufacturing process of a DRAM of a third embodiment shown in FIG. 41, respectively.
Figure 53:
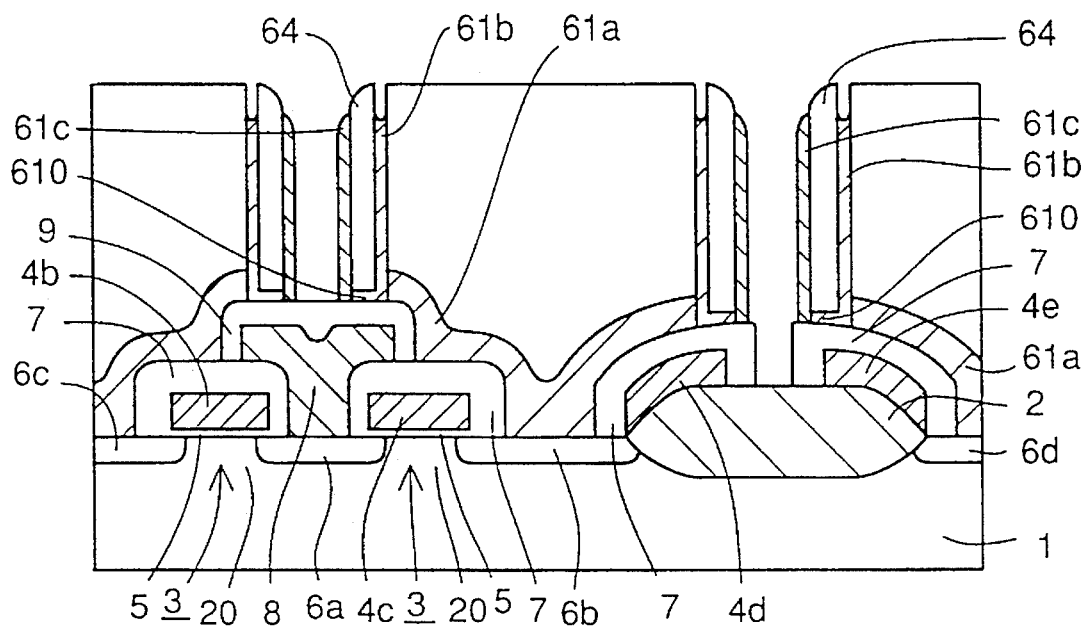
Figure 54:
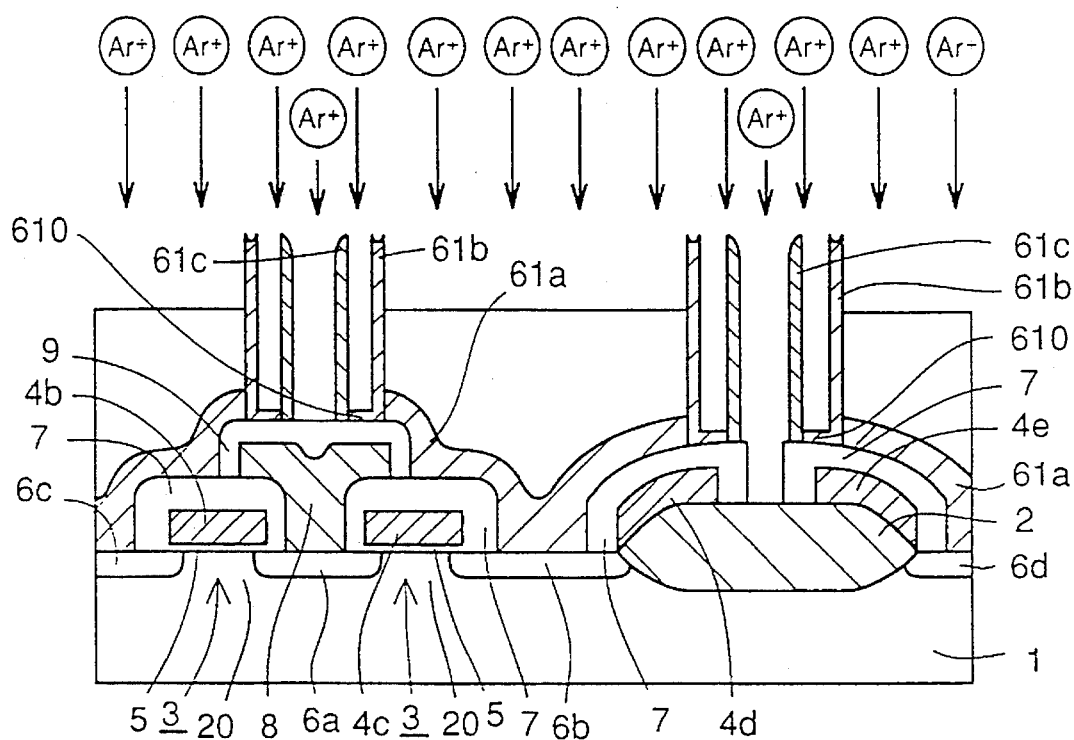
Figure 55A:
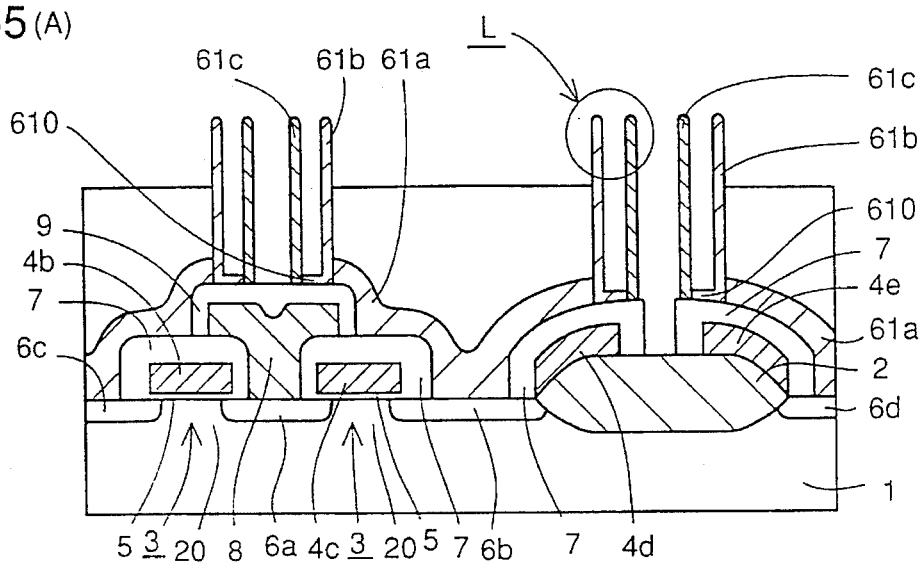
FIG. 55A is a cross section showing a 14th step in a manufacturing process of a DRAM of a third embodiment shown in FIG. 41.
Figure 55B:
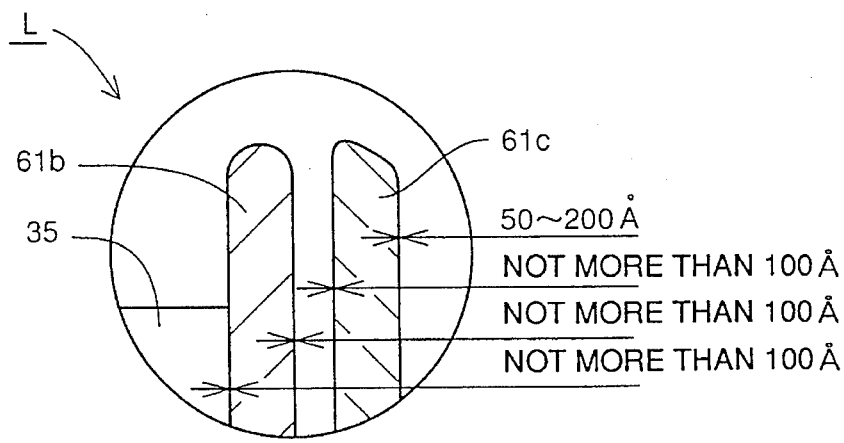
FIG. 55B is an enlarged cross section of a portion of a DRAM indicated by "L" in FIG. 55A.

Then, as shown in FIG. 52, the CVD method is used to form a polysilicon layer 61f, which contains a large amount of doped arsenic or phosphorus and has a thickness of about 1000 Å, on the whole surface. The RIE (reactive ion etching) method is used for effecting an anisotropic etching on the polysilicon layer 61f, whereby the second standing wall portions 61c are formed, as shown in FIG. 53. In this stage, each second standing wall portion 61c has a sharp tip end due to the RIE, and has a rough side surface between 250 Å and 500 Å in roughness. The insulating layer 35 in this state is etched by a predetermined thickness, e.g., by an anisotropic etching using fluorine, as shown in FIG. 54. This anisotropic etching completely removes the side wall oxide film 64. The etching of the insulating layer 35 may be carried out by the etchback, in which case the side wall oxide film 64 is shaved only by a predetermined thickness. Then, a sputter etching is effected on the first and second standing wall portions 61b and 61c with argon gas (Ar) by the RIE apparatus of the parallel flat plate type under such conditions that the RF power is between 0.2 and 1.0 KW/cm$^2$, gas pressure is not more than 30 mTorr, argon gas flow rate is between 20 and 50 sccm, frequency is not more than 13.56 MHz, and etching time is between 1 minute and 3 minutes. By the sputter etching under the above conditions, the first and second standing wall portions 61b and 61c having the shapes and surface roughness shown in FIGS. 55A and 55B are obtained. Specifically, the first standing wall portion 61b has a tip end which is further rounded to have a nearly circular shape and the opposite side surfaces of which roughness is 200 Å or less. The second standing wall portion 61c has the round tip end and the side surface of which roughness is 200 Å or less. Also in the third embodiment, as described above, the first standing wall portion 61b and the second standing wall portion 61c, which form the capacitor lower electrode, have the round tip ends, and have the side surfaces of which roughness is not more than 200 Å. Thereby, the electric field concentration at the tip ends of the first and second standing wall portions 61b and 61c can be effectively prevented, and the irregular electric field at the side surfaces of the first and second standing wall portions 61b and 61c can be suppressed. As a result, the lifetime of the capacitor insulating film 62 (see FIG. 41) can be improved. Owing to the double structures of the first and second standing wall portions 61b and 61c, the capacity capacitor can be further increased.

Figure 56:
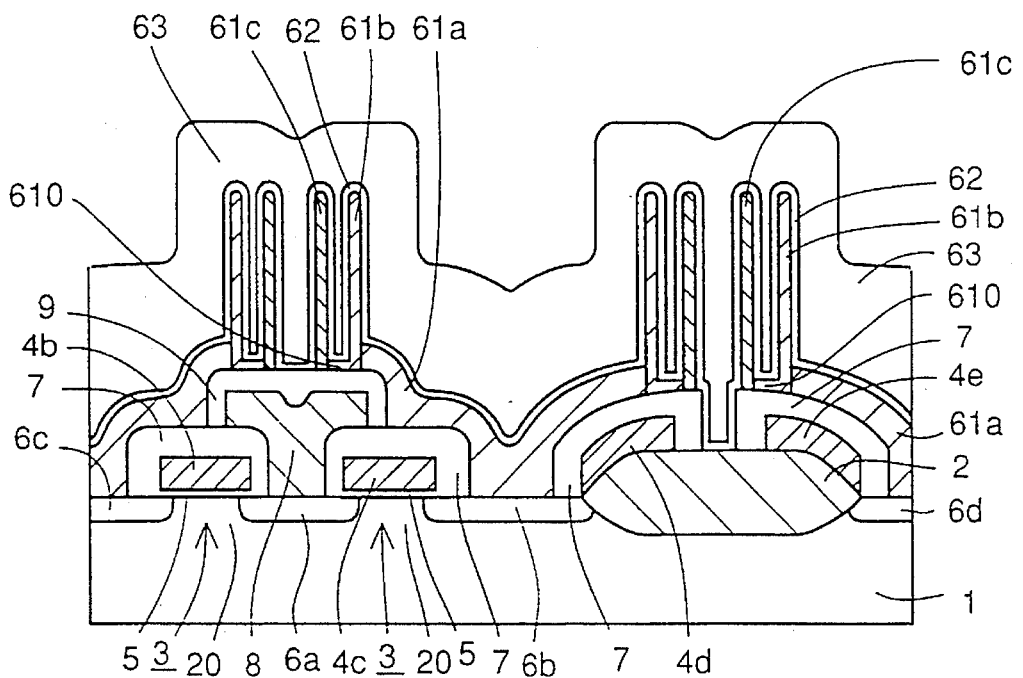
FIGS. 56 and 57 are cross sections showing 15th and 16th steps in a manufacturing process of a DRAM of a third embodiment shown in FIG. 41, respectively.

Then, as shown in FIG. 56, the capacitor insulating film 62 is formed to cover the base portions 61a, first standing wall portions 61b and second standing wall portions 61c. The capacitor insulating film 62 is covered with the cell plate 63 formed of the polysilicon layer containing a large amount of doped arsenic.

Figure 57:
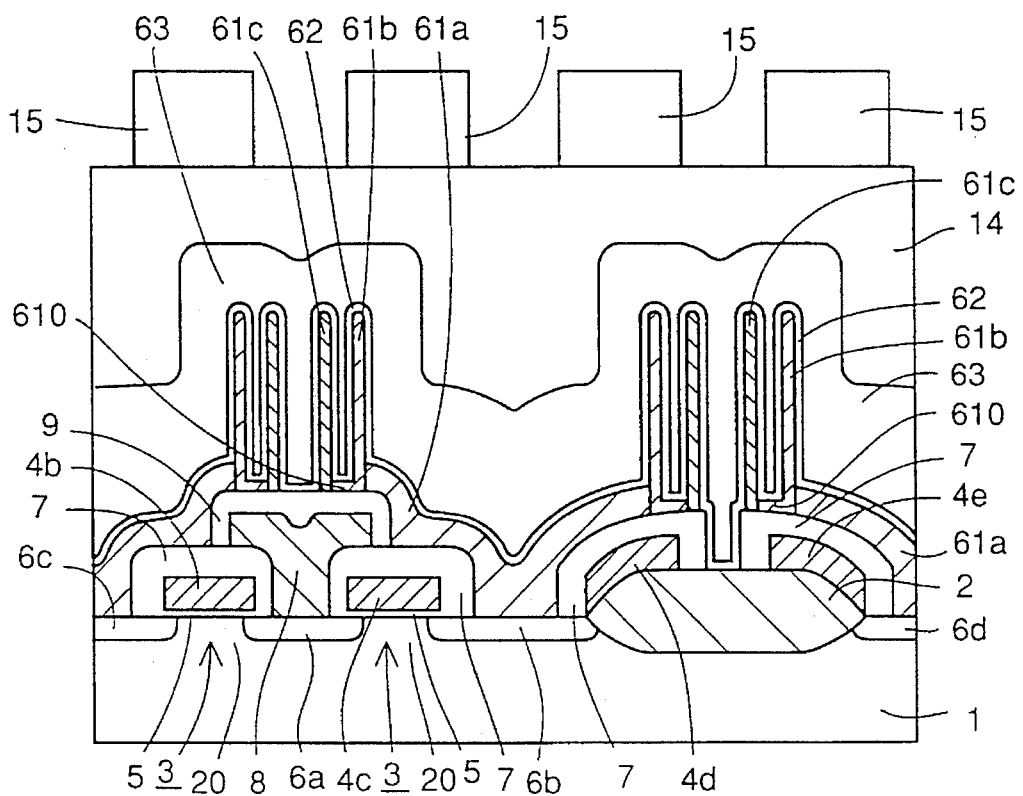
Figure 58:
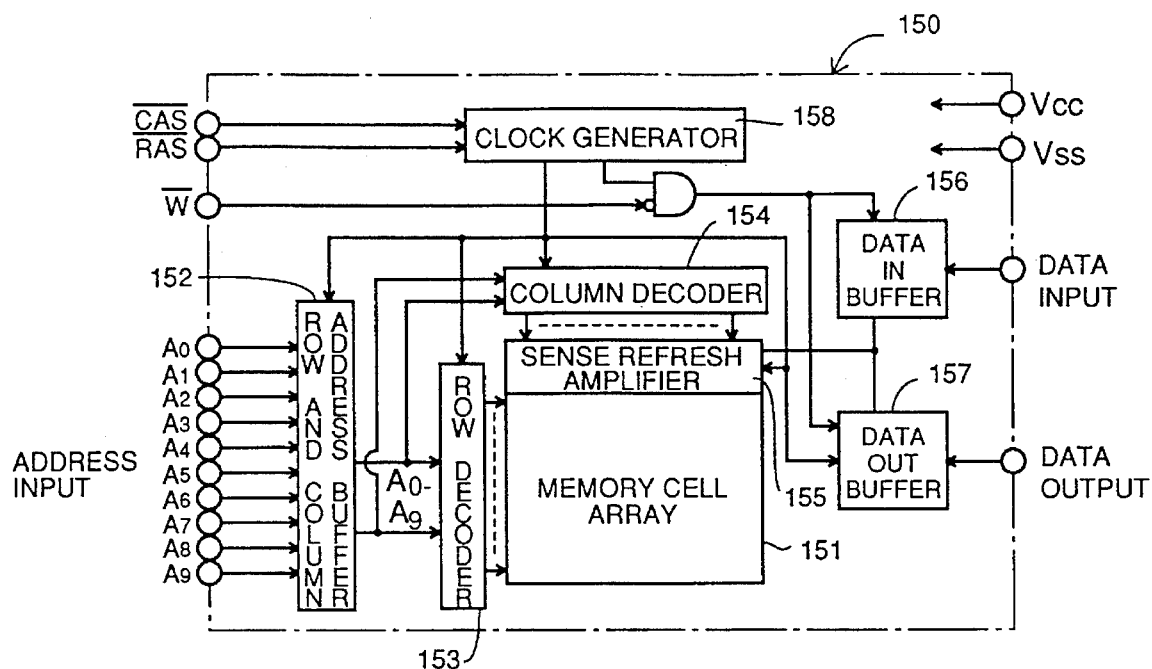
FIG. 58 is a block diagram showing a general DRAM in the prior art.
Figure 59:
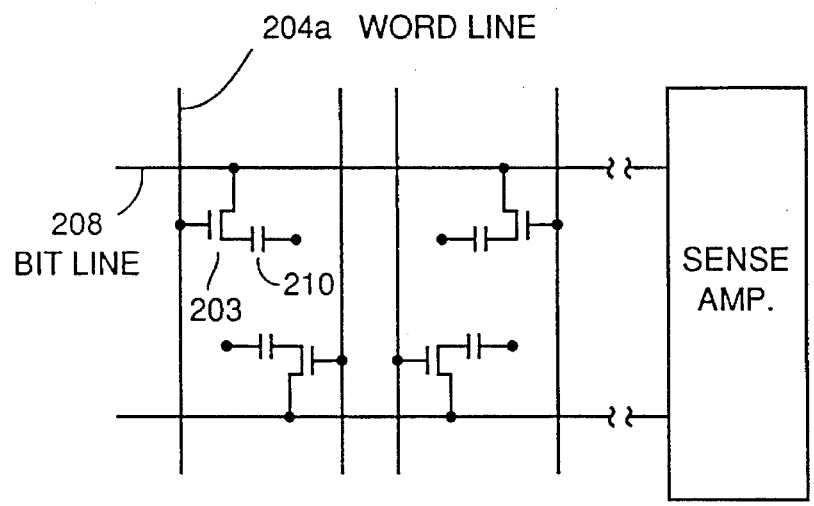
FIG. 59 is an equivalent circuit diagram showing a memory cell of a DRAM in the prior art.
Figure 60:
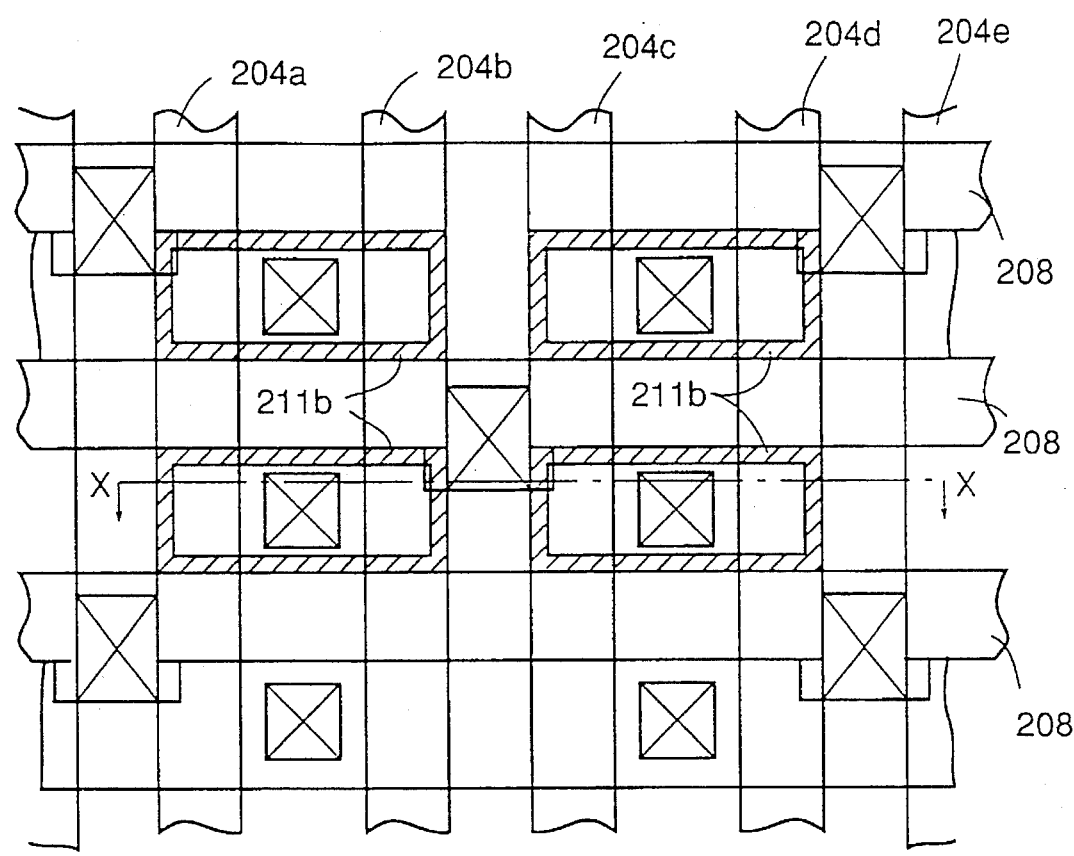
FIG. 60 is a plan of a DRAM having a stacked type capacitor proposed in the prior art.
Figure 61:
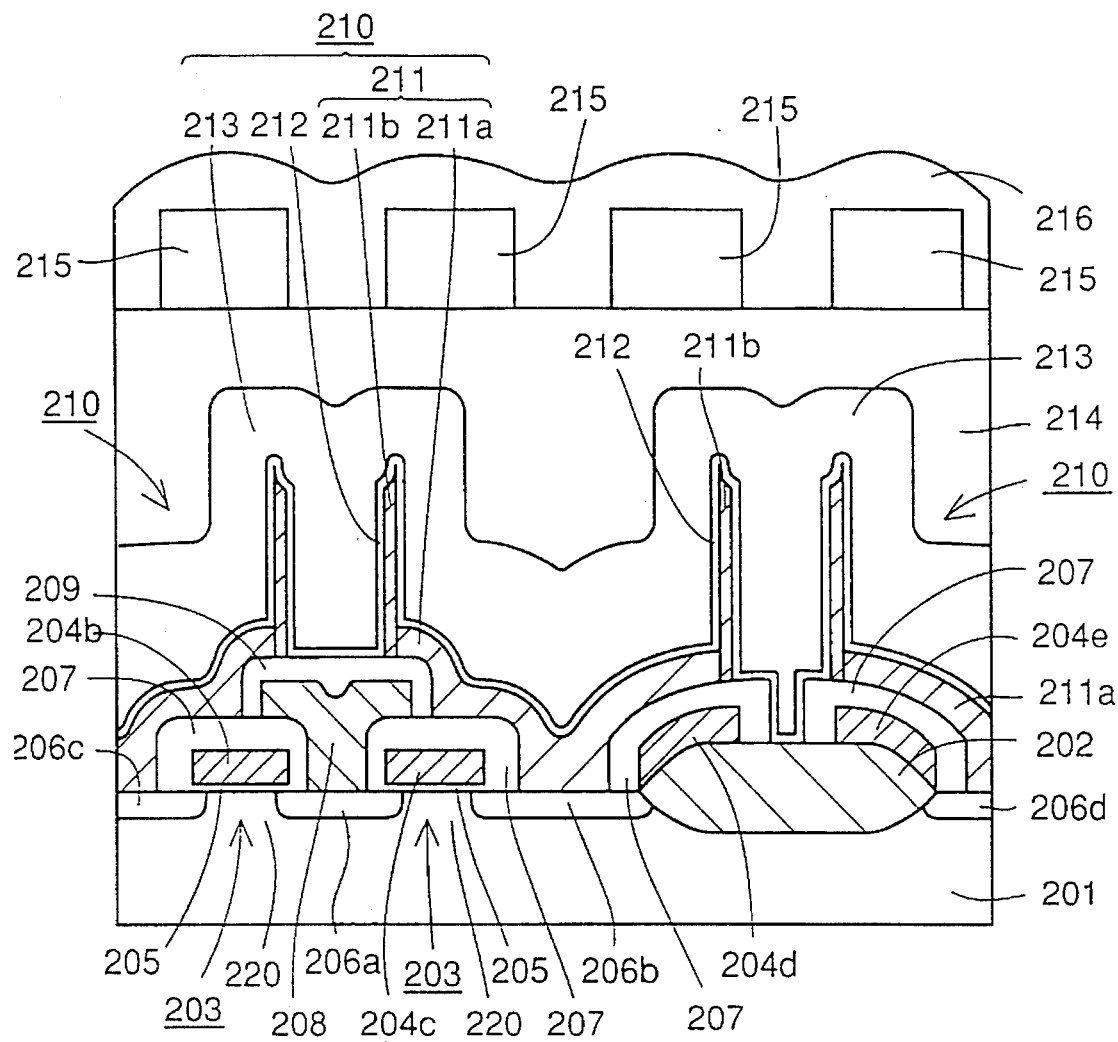
FIG. 61 is a cross section of a DRAM taken along line X—X in FIG. 60.
Figure 62:
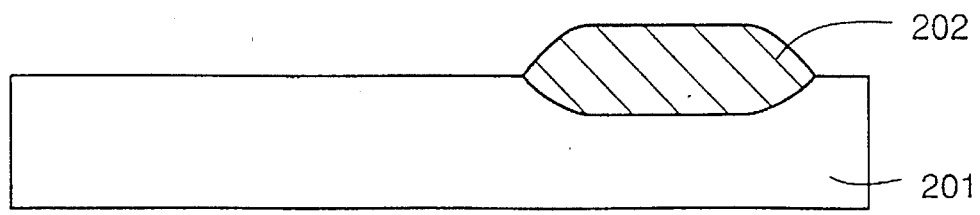
FIGS. 62–75 are cross sections showing 1st to 14th steps in a manufacturing process of a DRAM in the prior art shown in FIG. 63, respectively.
Figure 63:
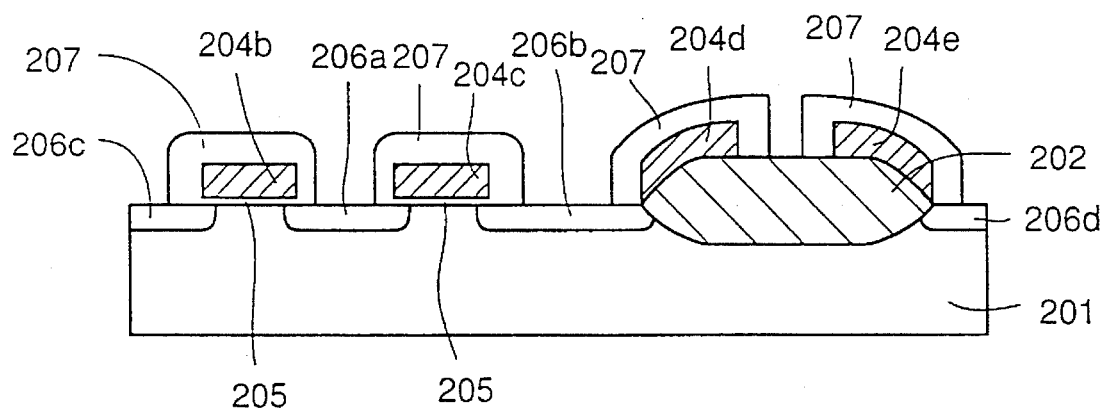
Figure 64:
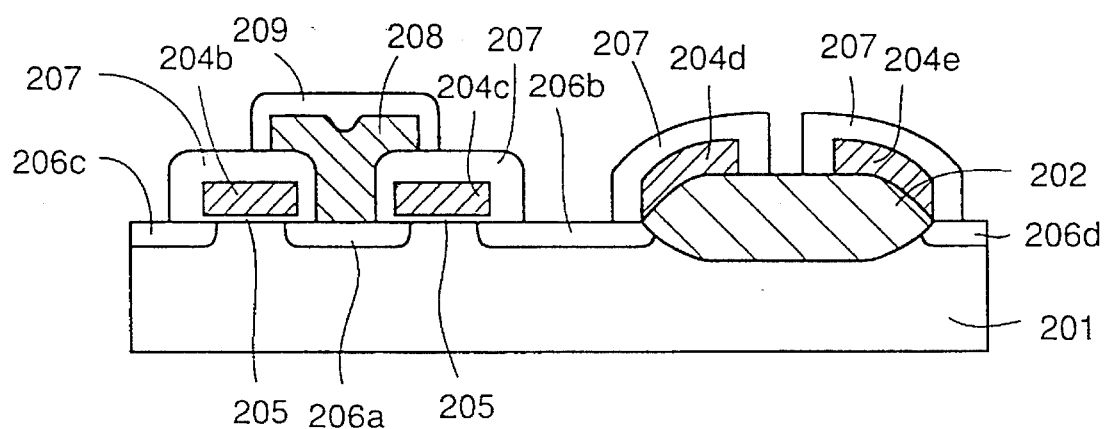
Figure 65:
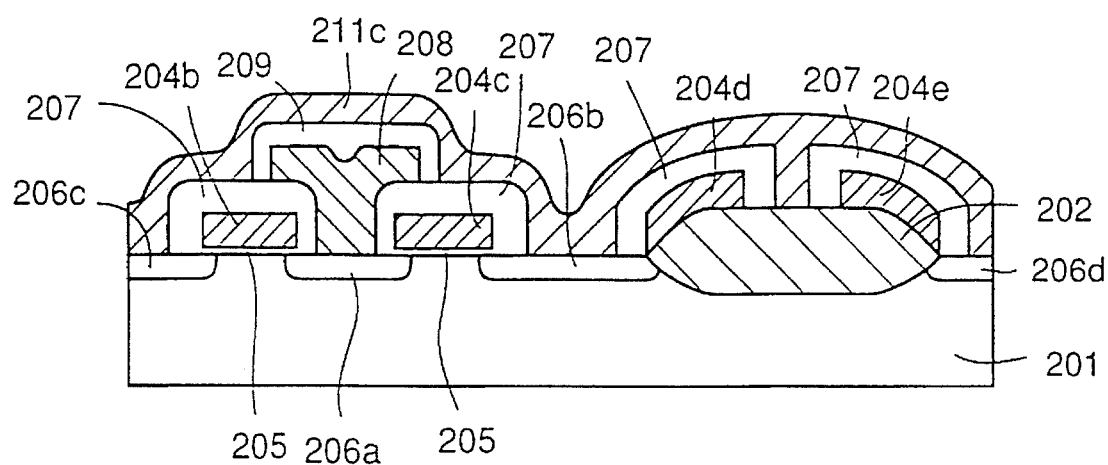
Figure 66:
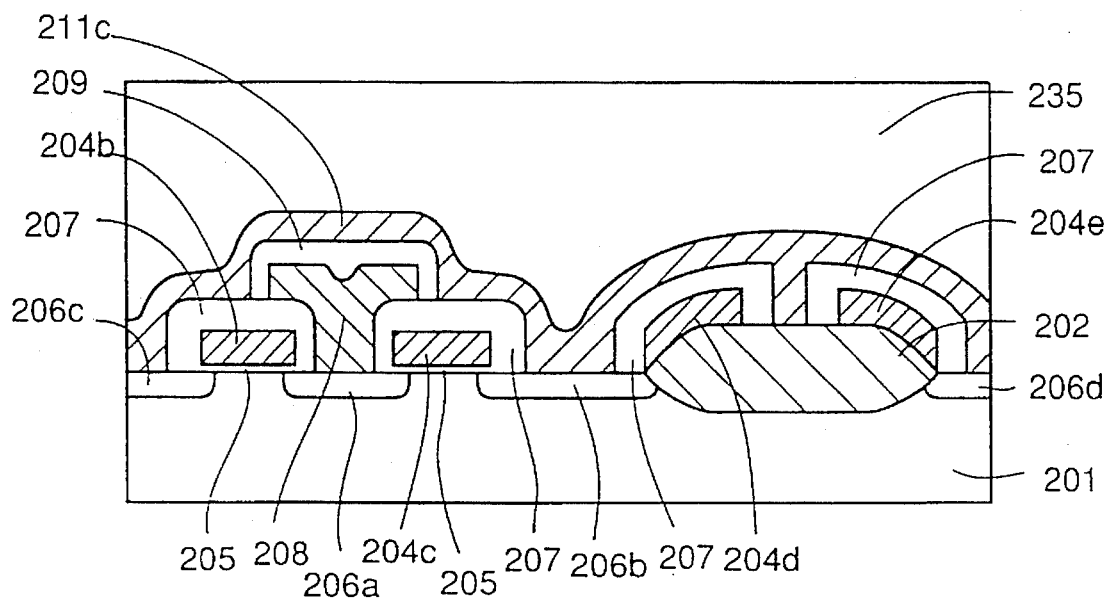
Figure 67:
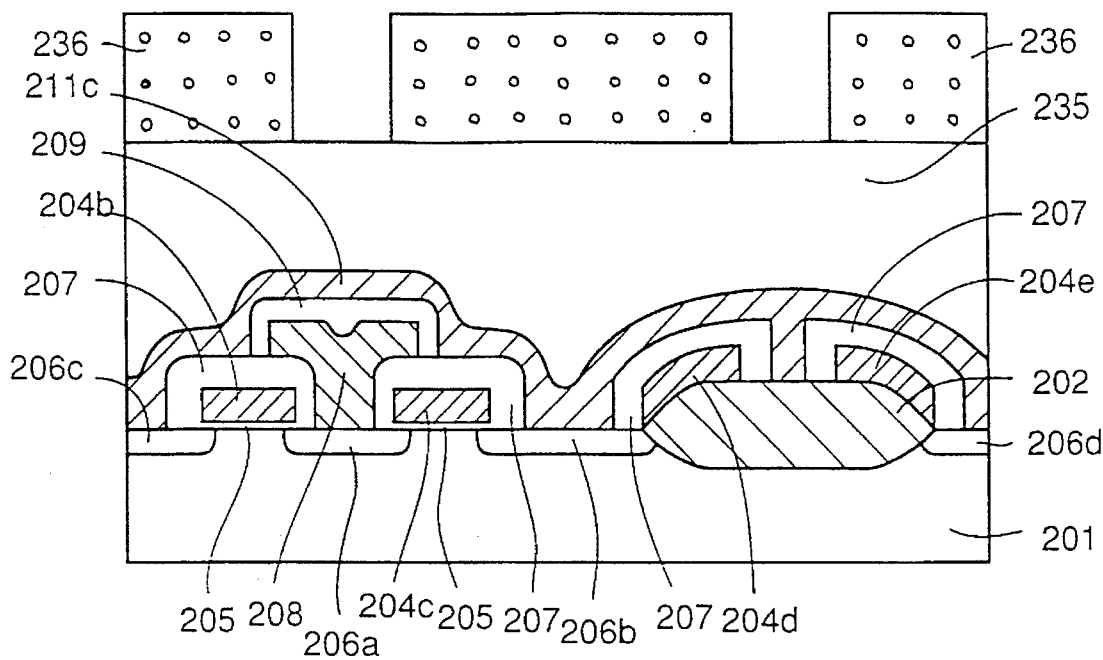
Figure 68:
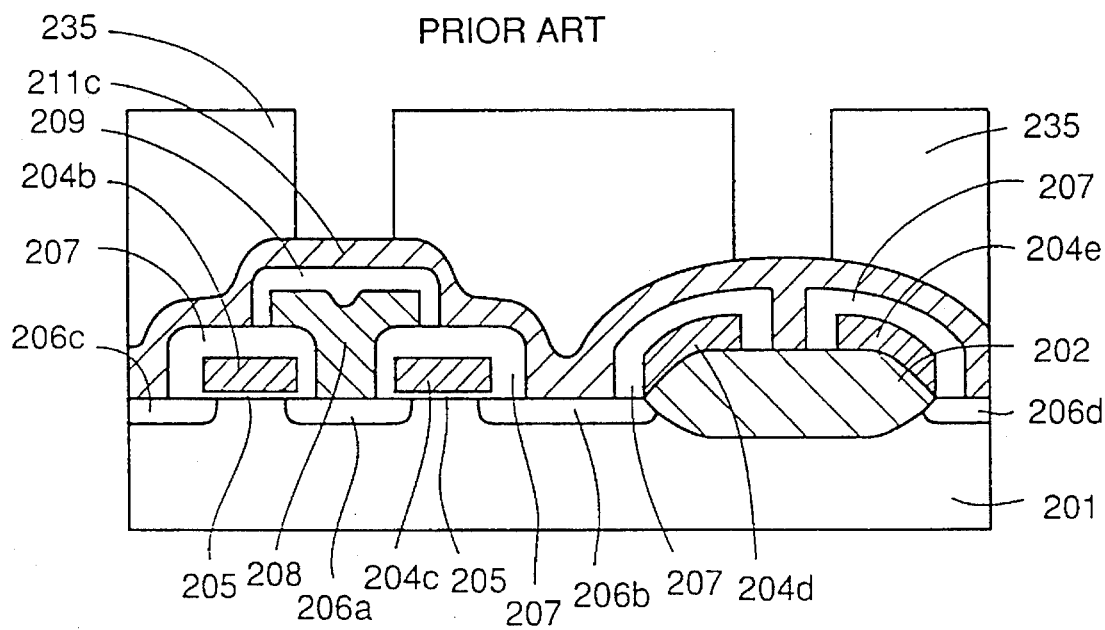
Figure 69:
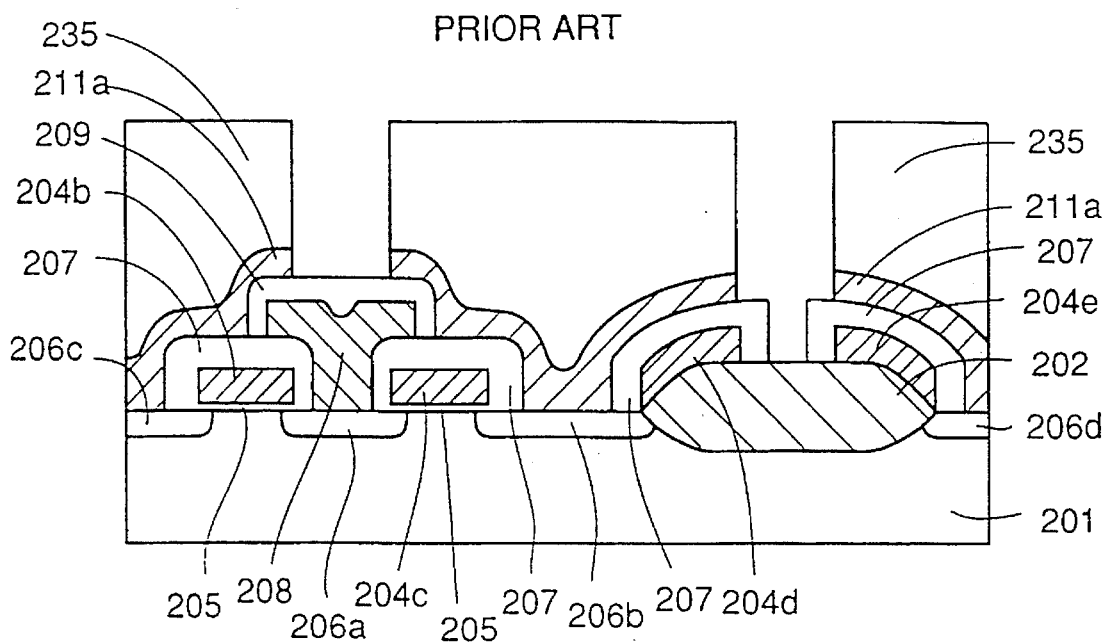
Figure 70:
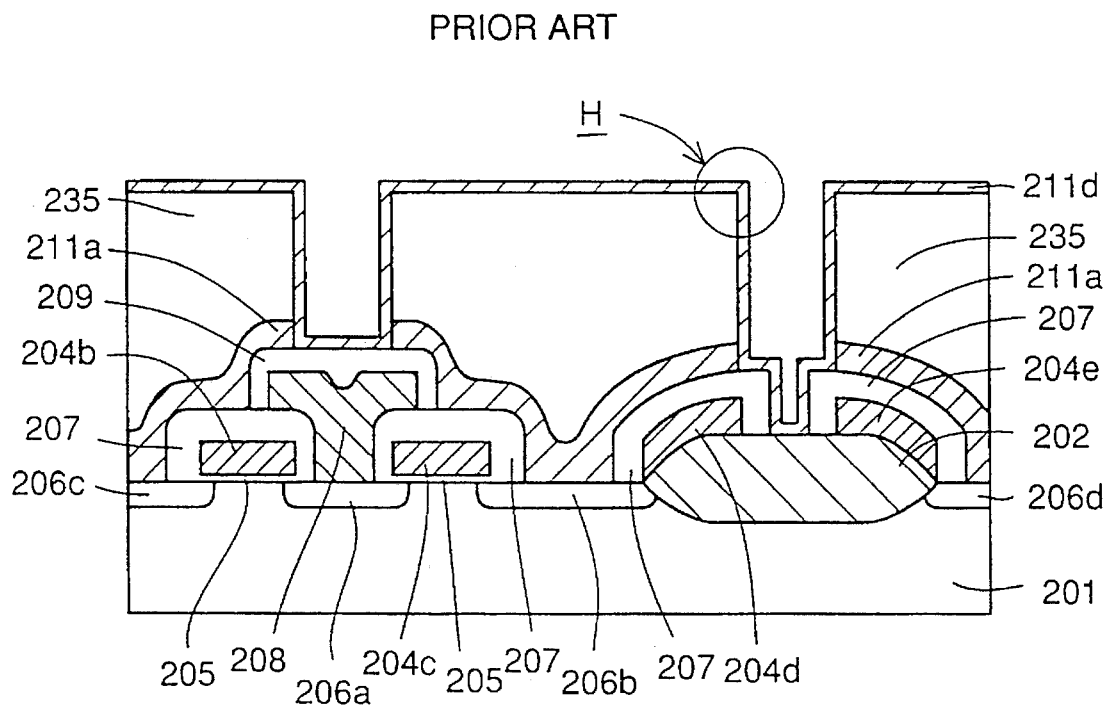
Figure 71:
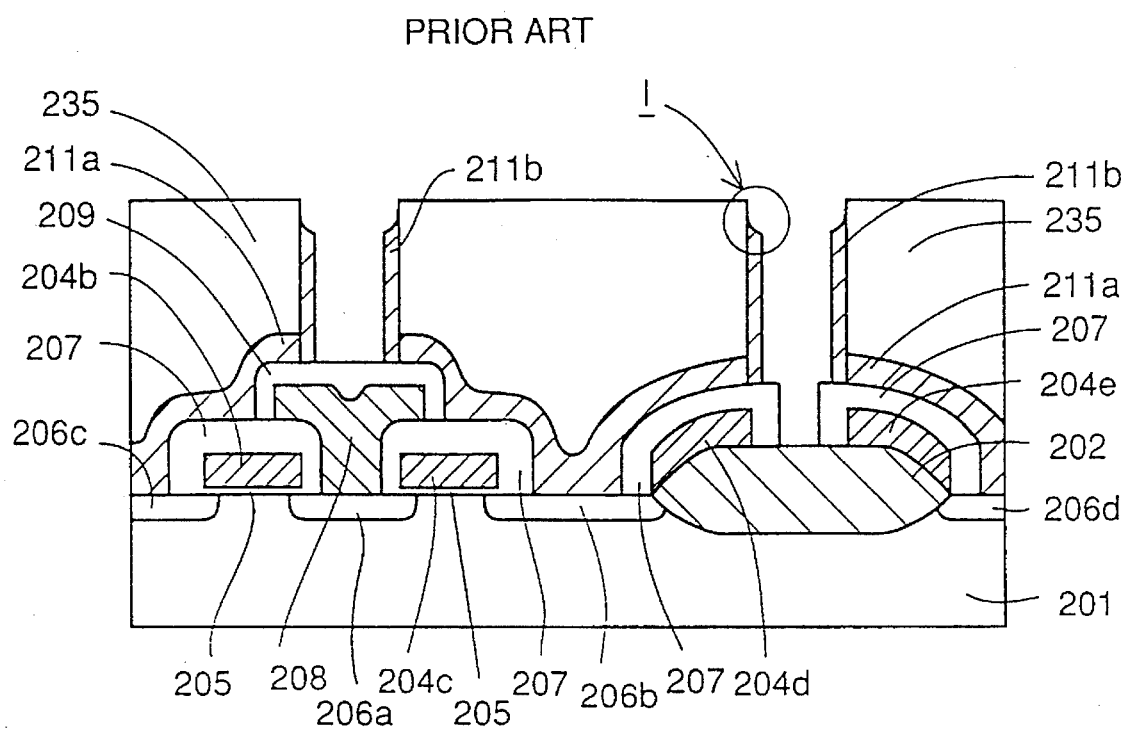
Figure 72:
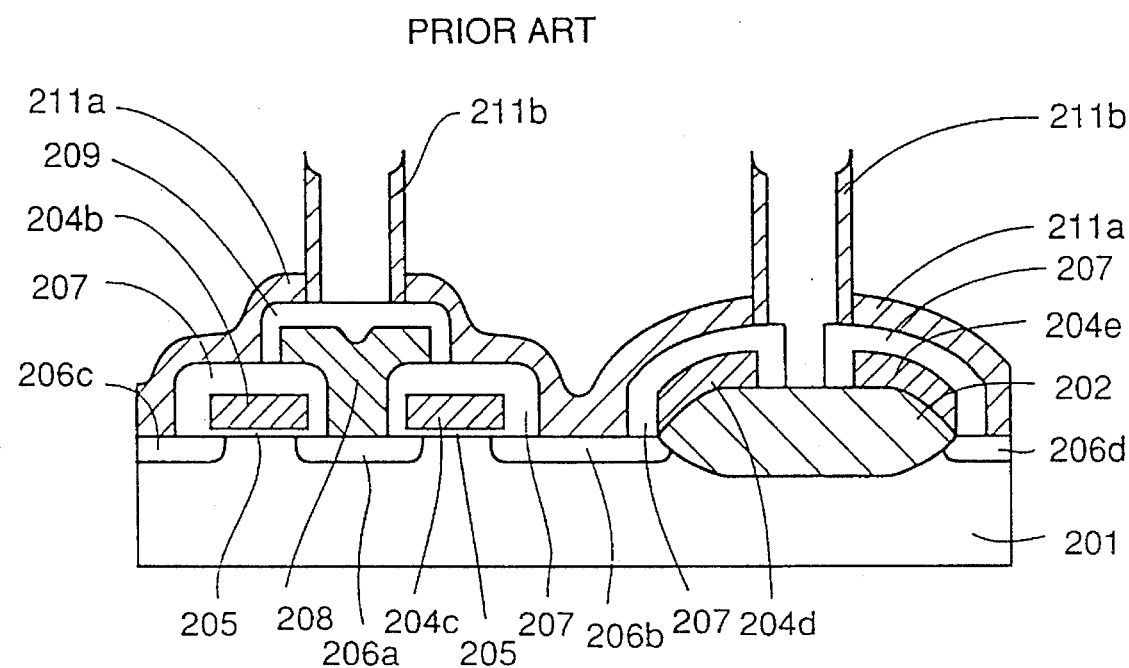
Figure 73:
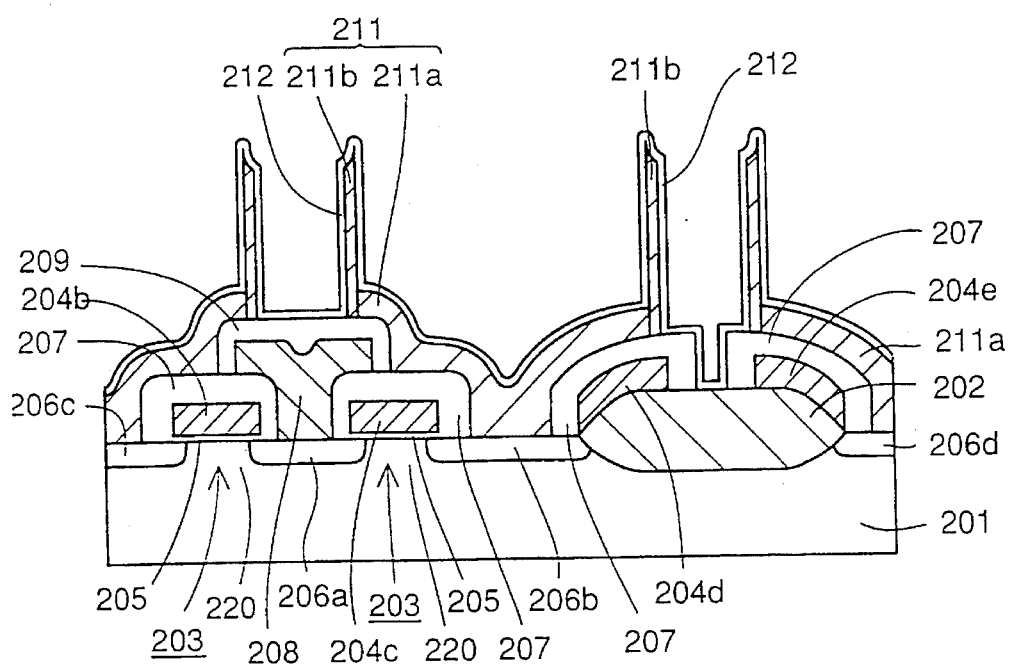
Figure 74:
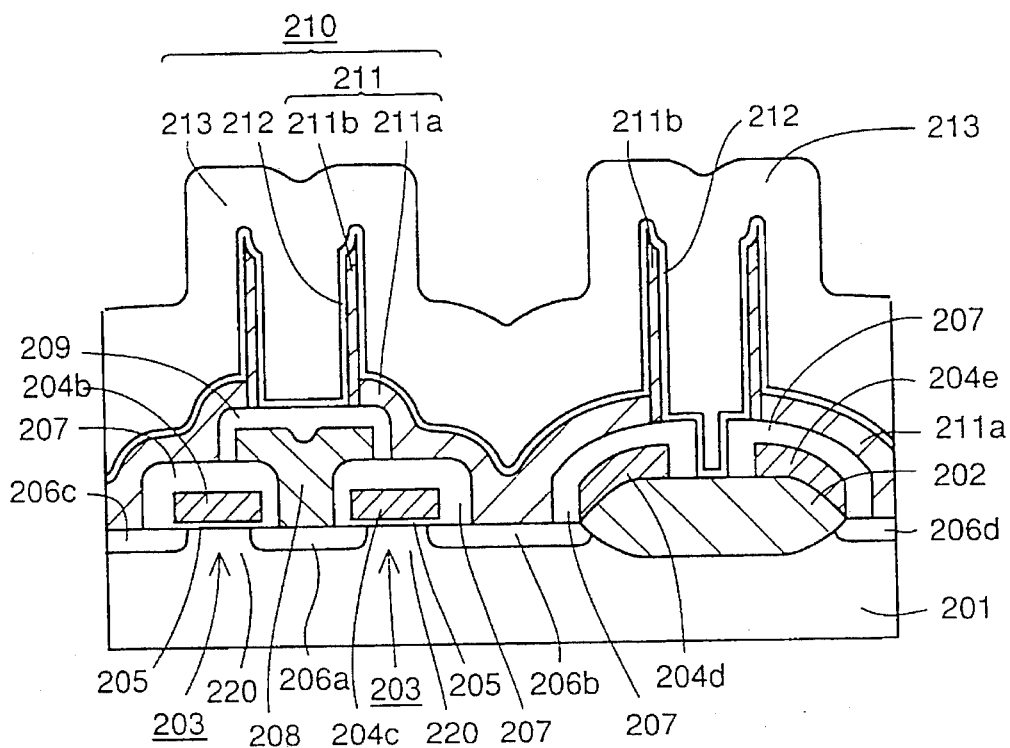
Figure 75:
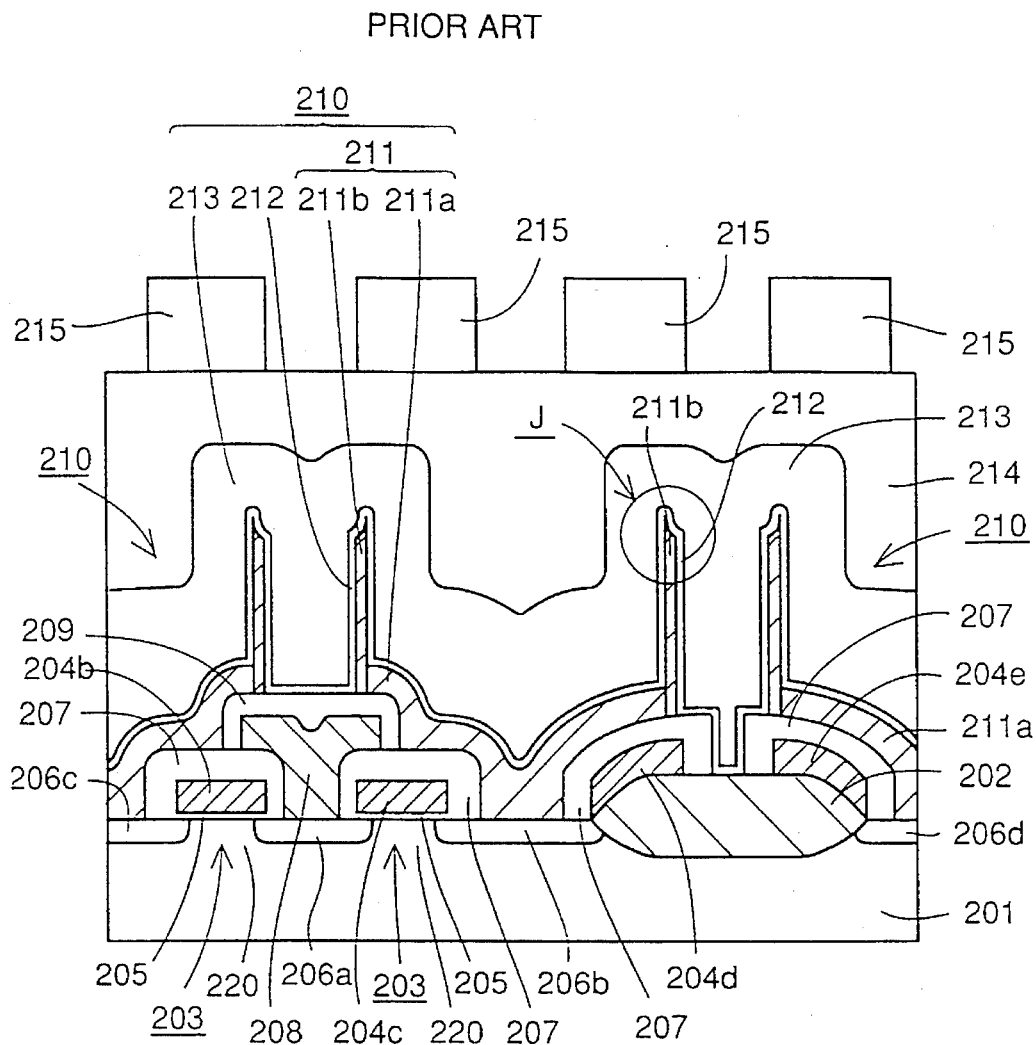

As shown in FIG. 57, the interlayer insulating film 14 having the flattened surface is formed over the cell plate 63 by the CVD method. The interconnection layers 15 corresponding to the word lines 4b, 4c, 4d and 4e are formed on the interlayer insulating film 14 with predetermined spaces between each other.

Finally, as shown in FIG. 41, the whole surface is covered with the protection film 16, i.e., silicon oxide film. Thereby, the DRAM of the third embodiment is completed.

In the first to third embodiments described above, the patterning is carried out to form the standing wall portions of the capacitor lower electrodes after forming the polysilicon layer on the whole surface. However, the invention is not restricted to this. For example, the standing wall portions may be formed by forming and patterning an amorphous silicon layer, and then the amorphous silicon layer may be changed into a polysilicon structure.

According to the semiconductor device of one aspect of the invention, as described hereinabove, the second portion forming the capacitor lower electrode has the substantially round tip end and the side surface of which roughness is not more than 200 Å, so that the electric field concentration at the tip end of the second portion can be effectively prevented, and the irregular electric field at the side surface can be effectively suppressed. Consequently, the lifetime of the capacitor insulating film can be improved.

According to the manufacturing method of the semiconductor device of one aspect of the invention, after forming the second conductive layer covering at least the second insulating layer, the second conductive layer is removed at least from the upper surface of the second insulating layer to expose the upper surface of the second insulating layer, and the exposed second insulating layer is etched to remove the second insulating layer through a predetermined thickness. Thereafter, the sputter etching is applied to the second conductive layer, whereby the tip end of the second conductive layer is rounded, and the side surface of the second conductive layer is flattened, so that the field concentration at the tip end of the second conductive layer is effectively suppressed, and the irregular field at the side surface of the second conductive layer can be effectively suppressed. Consequently, the lifetime of the capacitor insulating film can be improved.

According to the manufacturing method of the semiconductor device of another aspect of the invention, the second insulating layer is formed on the predetermined region of the first conductive layer, the second conductive layer is formed to cover at least the second insulating layer, the side wall insulating film is formed to cover at least the surface of the second conductive layer formed on the side surface of the second insulating layer, and at least the second conductive layer located on the upper surface of the second insulating layer is removed by the etching to expose the upper surface of the second insulating layer. Thereby, during the etching of the second conductive layer, the opposite side surfaces of the second conductive layer are protected by the second insulating layer and the side wall insulating layer, so that the opposite side surfaces of the second conductive layer are not roughened to a large extent. Consequently, the irregular electric field at the side surfaces of the second conductive layer can be effectively suppressed, and thus the lifetime of the capacitor insulating layer can be improved. After etching the exposed second insulating layer for removing the second insulating layer by a predetermined thickness, the sputter etching is carried out on the second conductive layer to substantially round the tip end of the second conductive layer, so that the electric field concentration at the tip end of the second conductive layer can be suppressed, and thus the lifetime of the capacitor insulating layer can be improved, compared with the prior art.

According to the manufacturing method of the semiconductor device of still another aspect of the invention, the second insulating layer is formed on the predetermined region of the first conductive layer, the second conductive layer is formed to cover at least the second insulating layer, and the side wall insulating film is formed to cover the surface of the second conductive layer formed on the side surface of the second insulating layer, whereby the side surface of the second conductive layer is protected by the side wall insulating film during the etching of the second conductive layer. The third conductive layer is formed to cover the whole surface, and the third conductive layer located at least on the upper surface of the second insulating layer is removed by the etching, whereby the upper surface of the second insulating layer is exposed, and the exposed second insulating layer is etched to remove the second insulating layer by a predetermined thickness. Then, the sputter etching is carried out on the second and third conductive layers to round the tip ends of the second and third conductive layers and to flatten the side surface of the third conductive layer. Thereby, the field concentration at the tip ends of the second and third conductive layers are effectively suppressed, and the irregular electric field at the side surfaces of the second and third conductive layers are suppressed, so that the lifetime of the capacitor insulating layer is effectively improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate of a second conductivity type having a major surface and an impurity region of a first conductivity type located in said major surface;

an insulating layer formed on said major surface of said semiconductor substrate and having an opening reaching said impurity region;

a capacitor lower electrode having a first portion, which is in contact with a surface of said impurity region and a surface of said insulating layer, and a second portion, which is located along an outer periphery of said first portion and extends substantially perpendicularly to said major surface of said semiconductor substrate, said second portion of said capacitor lower electrode having a substantially round tip end and having a side surface of which roughness is not more than 200 Å;

a capacitor insulating layer covering said surface of said capacitor lower electrode; and a capacitor upper electrode covering the surface of said capacitor insulating layer;

wherein said second portion of said capacitor lower electrode has a thickness in a direction parallel to said major surface of said semiconductor substrate which is smaller than a thickness of said first portion of said capacitor lower electrode in a direction perpendicular to said major surface of said semiconductor substrate.

2. The semiconductor device according to claim 1, wherein said second portion of said capacitor lower electrode is formed of a polysilicon layer.

3. A semiconductor device according to claim 2, wherein: said first portion of said capacitor lower electrode is formed of a second polysilicon layer; and said polysilicon layers include a high concentration of doped arsenic.

4. A semiconductor device according to claim 2, wherein: said polysilicon layer includes a high concentration of phosphorus.

5. A semiconductor device according to claim 1, wherein: said second portion of said capacitor lower electrode further comprises a second side surface of which the roughness is not more than 100 Å.

6. A semiconductor device according to claim 1, wherein: the second portion of said capacitor lower electrode extends at an angle of 87 to 90 degrees to the major surface of the semiconductor substrate.

7. A semiconductor device according to claim 1, wherein: said side surface the second portion of said capacitor lower electrode has a roughness which is more than 50 Å.

8. A semiconductor device, comprising:

a semiconductor substrate of a second conductivity type having a major surface and an impurity region of a first conductivity type located in said major surface;

an insulating layer formed on said major surface of said semiconductor substrate and having an opening reaching said impurity region;

a capacitor lower electrode having a first potion, which is in contact with a surface of said impurity region and a surface of said insulating layer, and a second portion, which is located along an outer periphery of said first portion and extends substantially perpendicularly to said major surface of said semiconductor substrate, said second portion of said capacitor lower electrode having a substantially round tip end and having a side surface of which roughness is not more than 200 Å;

a capacitor insulating layer covering said surface of said capacitor lower electrode; and a capacitor upper electrode covering the surface of said capacitor insulating layer;

wherein:

said second portion of said capacitor lower electrode has a thickness in a direction parallel to said major surface of said semiconductor substrate which is smaller than a thickness of said first portion of said capacitor lower electrode in a direction perpendicular to said major surface of said semiconductor substrate, said second portion of said capacitor lower electrode has a first section and a second section which are connected such that said capacitor lower electrode has an L-shape, said first section extends substantially perpendicular to said major surface of said semiconductor substrate and has a first side surface in contact with said outer periphery of said first portion, and said second section has a side surface in contact with a second side surface of said first section which is opposite said first side surface of said first section, and extends substantially parallel to said major surface of said semiconductor substrate and away from said first portion of said capacitor lower electrode.

9. A semiconductor device, comprising:

a semiconductor substrate of a second conductivity type having a major surface and an impurity region of a first conductivity type located in said major surface;

an insulating layer formed on said major surface of said semiconductor substrate and having opening reaching said impurity region;

a capacitor lower electrode having a first portion, which is in contact with a surface of said impurity region and a surface of said insulating layer, and a second portion, which is located along an outer periphery of said first portion and extends substantially perpendicularly to said major surface of said semiconductor substrate, said second portion of said capacitor lower electrode having a substantially round tip end and having a side surface of which roughness is not more than 200 Å;

a capacitor insulating layer covering said surface of said capacitor lower electrode; and a capacitor upper electrode covering the surface of said capacitor insulating layer;

wherein:

said second portion of said capacitor lower electrode has a thickness in a direction parallel to said major surface of said semiconductor substrate which is smaller than a thickness of said first portion of said capacitor lower electrode in a direction perpendicular to said major surface of said semiconductor substrate, and said second portion of said capacitor lower electrode includes, a third portion extending along the outer periphery of said first portion in a direction substantially perpendicular to said major surface of said semiconductor substrate, and having L-shaped lower end, and a fourth portion electrically connected to said lower end of said third portion, and extending substantially parallel to said third portion with a predetermined space therebetween.

10. A semiconductor device according to claim 9, wherein: a side surface of the third portion of said capacitor lower electrode and a side surface of the fourth portion of said capacitor lower electrode each have a roughness which is more than 50 Å but less than 200 Å.

11. A semiconductor device according to claim 9, wherein: said third and fourth portions of said capacitor lower electrode each have a thickness between 500 Å and 1000 Å.

12. A semiconductor device according to claim 9, wherein: said third and fourth portions of said capacitor lower electrode are formed of a polysilicon layer.

13. A semiconductor device according to claim 11, wherein: said polysilicon layer includes a high concentration of doped arsenic.

14. A semiconductor device according to claim 11, wherein: said polysilicon layer includes a high concentration of phosphorus.

15. A semiconductor device, comprising:

a semiconductor substrate of a second conductivity type having a major surface and an impurity region of a first conductivity type located in said major surface;

an insulating layer formed on said major surface of said semiconductor substrate and having an opening reaching said impurity region;

a capacitor lower electrode having a first portion, which is in contact with a surface of said impurity region and a surface of said insulating layer, and a second portion which is located along an outer periphery of said first portion and extends substantially perpendicularly to said major surface of said semiconductor substrate, said second portion of said capacitor lower electrode having a substantially round tip end and having a side surface of which roughness is not more than 200 Å;

a capacitor insulating layer covering said surface of said capacitor lower electrode; and a capacitor upper electrode covering the surface of said capacitor insulating layer;

wherein:

said second portion of said capacitor lower electrode has a thickness in a direction parallel to said major surface of said semiconductor substrate which is smaller than a thickness of said first portion of said capacitor lower electrode in a direction perpendicular to said major surface of said semiconductor substrate, and said thickness of said first portion of said capacitor lower electrode is between 1500 Å and 4000 Å and said thickness of said second portion of said capacitor lower electrode is between 500 Å and 1000 Å.

* * * * *